(12) United States Patent
Nikitin

(10) Patent No.: US 10,263,635 B2
(45) Date of Patent: Apr. 16, 2019

(54) METHOD AND APPARATUS FOR MITIGATION OF OUTLIER NOISE

(71) Applicant: Alexei V. Nikitin, Wamego, KS (US)

(72) Inventor: Alexei V. Nikitin, Wamego, KS (US)

( * ) Notice: Subject to any disclaimer, the term of this patent is extended or adjusted under 35 U.S.C. 154(b) by 0 days.

(21) Appl. No.: 15/865,569

(22) Filed: Jan. 9, 2018

(65) Prior Publication Data
US 2018/0316363 A1  Nov. 1, 2018

Related U.S. Application Data

(60) Provisional application No. 62/444,828, filed on Jan. 11, 2017, provisional application No. 62/569,807, filed on Oct. 9, 2017.

(51) Int. Cl.
*H03M 1/06* (2006.01)
*H03M 3/00* (2006.01)

(52) U.S. Cl.
CPC .......... *H03M 3/368* (2013.01); *H03M 3/422* (2013.01); *H03M 3/43* (2013.01); *H03M 3/438* (2013.01); *H03M 3/456* (2013.01); *H03M 3/458* (2013.01)

(58) Field of Classification Search
CPC ...... H03M 3/368; H03M 3/422; H03M 3/458; H03M 3/456

USPC ................. 341/118, 144, 156, 145
See application file for complete search history.

(56) References Cited

U.S. PATENT DOCUMENTS

| | | | | |
|---|---|---|---|---|
| 7,142,140 B2* | 11/2006 | Storvik | ................ | H02M 3/157 |
| | | | | 341/141 |
| 7,426,123 B2* | 9/2008 | Leung | ............... | H02M 3/33515 |
| | | | | 323/283 |
| 2005/0140531 A1* | 6/2005 | Takehana | ............ | H01J 37/3023 |
| | | | | 341/133 |

* cited by examiner

*Primary Examiner* — Jean B Jeanglaude
(74) *Attorney, Agent, or Firm* — Dale J. Ream

(57) ABSTRACT

Method and apparatus for nonlinear signal processing include mitigation of outlier noise in the process of analog-to-digital conversion and adaptive real-time signal conditioning, processing, analysis, quantification, comparison, and control. Methods, processes and apparatus for real-time measuring and analysis of variables include statistical analysis and generic measurement systems and processes which are not specially adapted for any specific variables, or to one particular environment. Methods and corresponding apparatus for mitigation of electromagnetic interference, for improving properties of electronic devices, and for improving and/or enabling coexistence of a plurality of electronic devices include post-processing analysis of measured variables and post-processing statistical analysis.

22 Claims, 43 Drawing Sheets

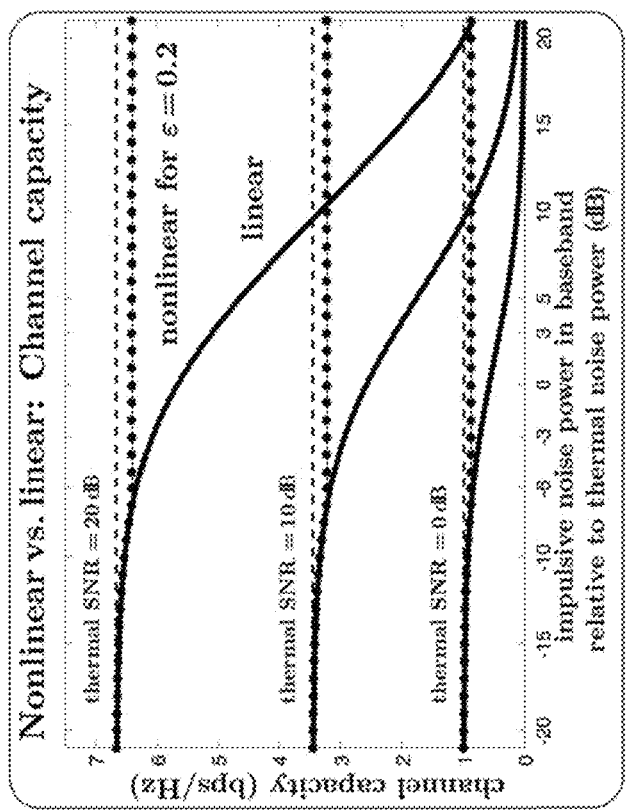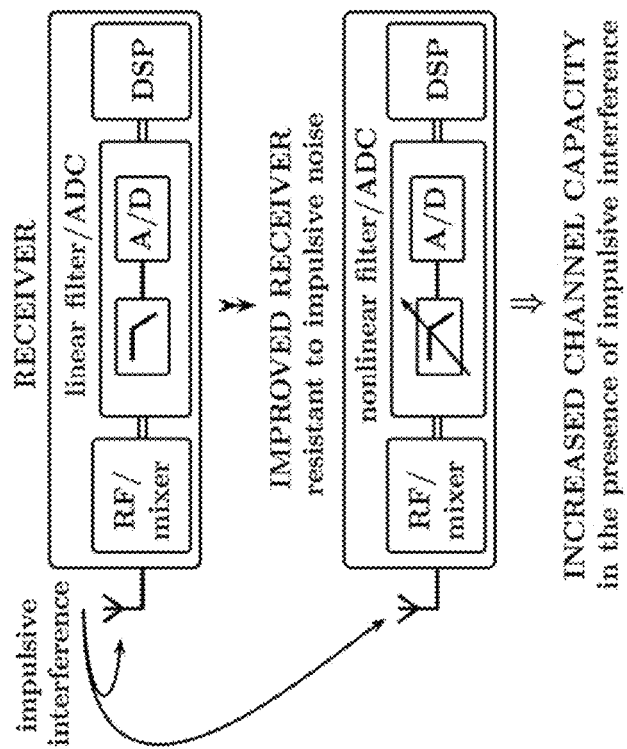
Fig. 2

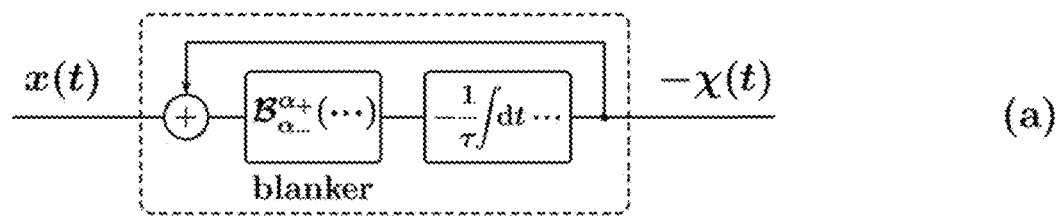
(a)
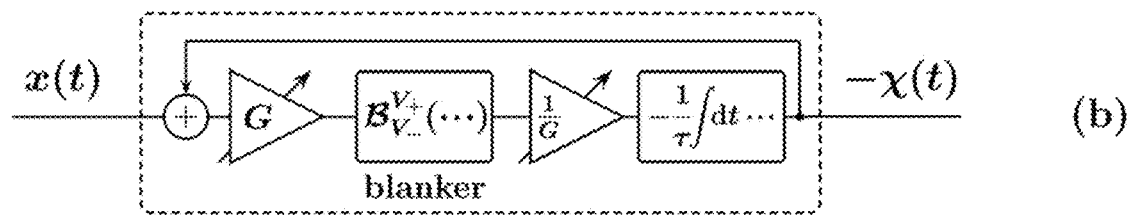
(b)
Fig. 5

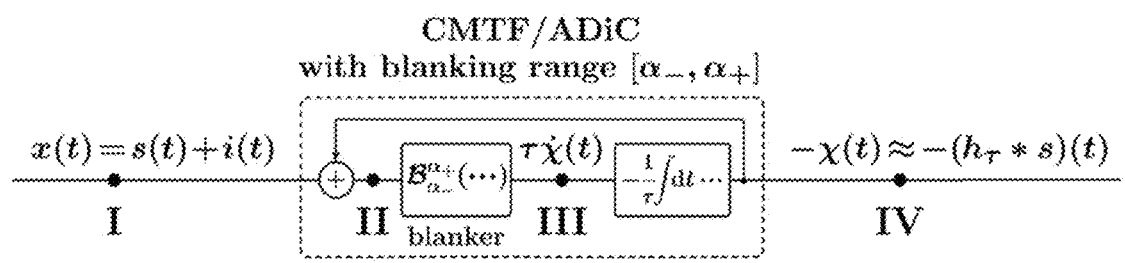

(1) $s(t) \approx \tau\dot{\chi}(t) + \chi(t)$: "Prime" ADiC output
- extracted non-impulsive ("background") component
(signal at point III minus signal at point IV)

(2) $i(t) \approx [x(t) - \chi(t)] - \tau\dot{\chi}(t)$: "Auxiliary" ADiC output
- extracted impulsive component
(signal at point II minus signal at point III)

(3) $-\chi(t) \approx -(h_\tau * s)(t)$: CMTF output
- extracted non-impulsive ("background") component
filtered with 1st order lowpass filter $h_\tau(t)$ (4) $(h_\tau * i)(t) \approx (h_\tau * x)(t) - \chi(t)$
- extracted impulsive component
filtered with 1st order lowpass filter $h_\tau(t)$

Fig. 10

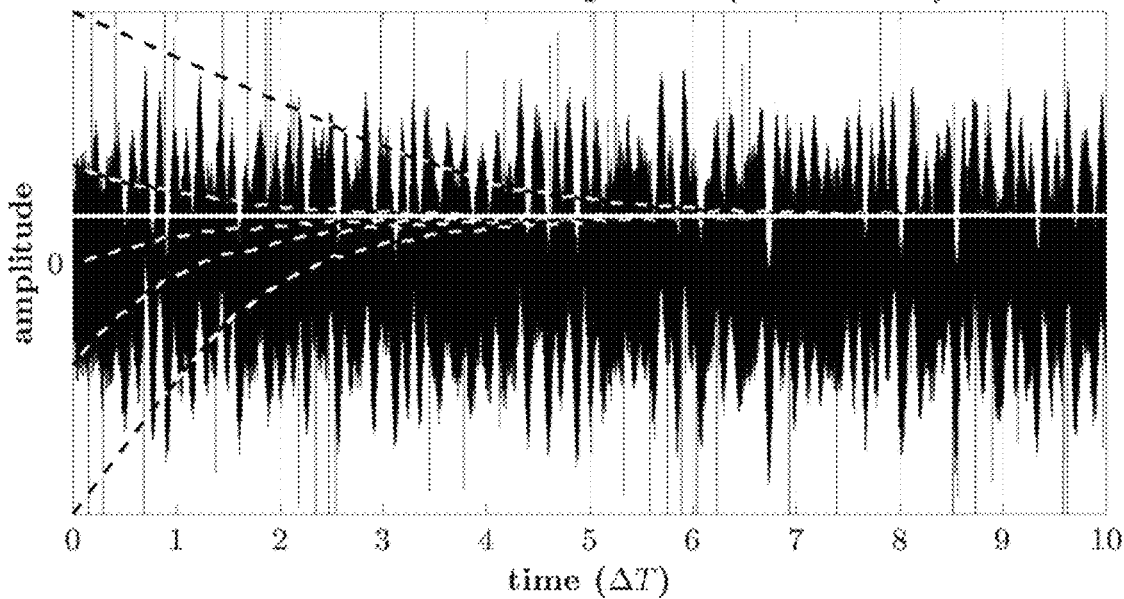
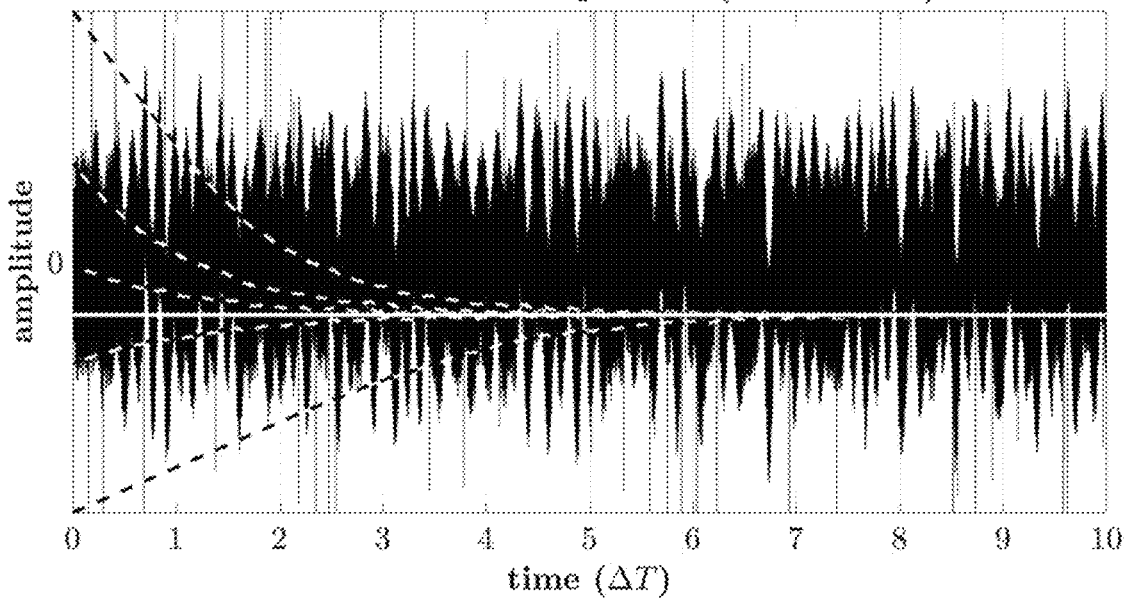
Fig. 18

METHOD AND APPARATUS FOR MITIGATION OF OUTLIER NOISE

CROSS REFERENCES TO RELATED APPLICATIONS

This application claims the benefit of the U.S. provisional patent applications 62/444,828 (filed on 11 Jan. 2017) and 62/569,807 (filed on 9 Oct. 2017).

STATEMENT REGARDING FEDERALLY SPONSORED RESEARCH OR DEVELOPMENT

None.

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to nonlinear signal processing, and, in particular, to method and apparatus for mitigation of outlier noise in the process of analog-to-digital conversion. More generally, this invention relates to adaptive real-time signal conditioning, processing, analysis, quantification, comparison, and control, and to methods, processes and apparatus for real-time measuring and analysis of variables, including statistical analysis, and to generic measurement systems and processes which are not specially adapted for any specific variables, or to one particular environment. This invention also relates to methods and corresponding apparatus for mitigation of electromagnetic interference, and further relates to improving properties of electronic devices and to improving and/or enabling coexistence of a plurality of electronic devices. The invention further relates to post-processing analysis of measured variables and to post-processing statistical analysis.

BACKGROUND

Non-Gaussian (and, in particular, impulsive, or outlier) noise affecting communication and data acquisition systems may originate from a multitude of natural and technogenic (man-made) phenomena in a variety of applications. Examples of natural impulsive (outlier) noise sources include ice cracking (in polar regions) and snapping shrimp (in warmer waters) affecting underwater acoustics [1-3]. Electrical man-made noise is transmitted into a system through the galvanic (direct electrical contact), electrostatic coupling, electromagnetic induction, or RF waves. Examples of systems and services harmfully affected by technogenic noise include various sensor, communication, and navigation devices and services [4-15], wireless internet [16], coherent imaging systems such as synthetic aperture radar [17], cable, DSL, and power line communications [18-24], wireless sensor networks [25], and many others. An impulsive noise problem also arises when devices based on the ultra-wideband (UWB) technology interfere with narrowband communication systems such as WLAN [26] or CDMA-based cellular systems [27]. A particular example of non-Gaussian interference is electromagnetic interference (EMI), which is a widely recognized cause of reception problems in communications and navigation devices. The detrimental effects of EMI are broadly acknowledged in the industry and include reduced signal quality to the point of reception failure, increased bit errors which degrade the system and result in lower data rates and decreased reach, and the need to increase power output of the transmitter, which increases its interference with nearby receivers and reduces the battery life of a device.

A major and rapidly growing source of EMI in communication and navigation receivers is other transmitters that are relatively close in frequency and/or distance to the receivers. Multiple transmitters and receivers are increasingly combined in single devices, which produces mutual interference. A typical example is a smartphone equipped with cellular, WiFi, Bluetooth, and GPS receivers, or a mobile WiFi hotspot containing an HSDPA and/or LTE receiver and a WiFi transmitter operating concurrently in close physical proximity. Other typical sources of strong EMI are on-board digital circuits, clocks, buses, and switching power supplies. This physical proximity, combined with a wide range of possible transmit and receive powers, creates a variety of challenging interference scenarios. Existing empirical evidence [8, 28, 29] and its theoretical support [6, 7, 10] show that such interference often manifests itself as impulsive noise, which in some instances may dominate over the thermal noise [5, 8, 28].

A simplified explanation of non-Gaussian (and often impulsive) nature of a technogenic noise produced by digital electronics and communication systems may be as follows. An idealized discrete-level (digital) signal may be viewed as a linear combination of Heaviside unit step functions [30]. Since the derivative of the Heaviside unit step function is the Dirac $\delta$-function [31], the derivative of an idealized digital signal is a linear combination of Dirac $\delta$-functions, which is a limitlessly impulsive signal with zero interquartile range and infinite peakedness. The derivative of a "real" (i.e. no longer idealized) digital signal may thus be viewed as a convolution of a linear combination of Dirac $\delta$-functions with a continuous kernel. If the kernel is sufficiently narrow (for example, the bandwidth is sufficiently large), the resulting signal would appear as an impulse train protruding from a continuous background signal. Thus impulsive interference occurs "naturally" in digital electronics as "di/dt" (inductive) noise or as the result of coupling (for example, capacitive) between various circuit components and traces, leading to the so-called "platform noise" [28]. Additional illustrative mechanisms of impulsive interference in digital communication systems may be found in [6-8, 10, 32].

The non-Gaussian noise described above affects the input (analog) signal. The current state-of-art approach to its mitigation is to convert the analog signal to digital, then apply digital nonlinear filters to remove this noise. There are two main problems with this approach. First, in the process of analog-to-digital conversion the signal bandwidth is reduced (and/or the ADC is saturated), and an initially impulsive broadband noise would appear less impulsive [7-10, 32]. Thus its removal by digital filters may be much harder to achieve. While this can be partially overcome by increasing the ADC resolution and the sampling rate (and thus the acquisition bandwidth) before applying digital nonlinear filtering, this further exacerbates the memory and the DSP intensity of numerical algorithms, making them unsuitable for real-time implementation and treatment of non-stationary noise. Thus, second, digital nonlinear filters may not be able to work in real time, as they are typically much more computationally intensive than linear filters. A better approach would be to filter impulsive noise from the analog input signal before the analog-to-digital converter (ADC), but such methodology is not widely known, even though the concepts of rank filtering of continuous signals are well understood [32-37].

Further, common limitations of nonlinear filters in comparison with linear filtering are that (1) nonlinear filters typically have various detrimental effects (e.g., instabilities and intermodulation distortions), and (2) linear filters are generally better than nonlinear in mitigating broadband Gaussian (e.g. thermal) noise.

Time Domain Analysis of 1st- and 2nd-Order Delta-Sigma (ΔΣ) ADCs with Linear Analog Loop Filters Nowadays, delta-sigma (ΔΣ) ADCs are used for converting analog signals over a wide range of frequencies, from DC to several megahertz. These converters comprise a highly oversampling modulator followed by a digital/decimation filter that together produce a high-resolution digital output. [38-40]. As discussed in this section, which reviews the basic principle of operation of ΔΣ ADCs from a time domain prospective, a sample of the digital output of a ΔΣ ADC represents its continuous (analog) input by a weighted average over a discrete time interval (that should be smaller than the inverted Nyquist rate) around that sample.

Since frequency domain representation is of limited use in analysis of nonlinear systems, let us first describe the basic ΔΣ ADCs with 1st- and 2nd-order linear analog loop filters in the time domain. Such 1st- and 2nd-order ΔΣ ADCs are illustrated in panels I and II of FIG. 1, respectively. Note that the vertical scales of the shown fragments of the signal traces vary for different fragments.

Without loss of generality, we may assume that if the input D to the flip-flop is greater than zero, D>0, at a specific instance in the clock cycle (e.g. the rising edge), then the output $\overline{Q}$ takes a negative value $\overline{Q}=V_c$. If D<0 at a rising edge of the clock, then the output $\overline{Q}$ takes a positive value $\overline{Q}=V_c$. At other times, the output $\overline{Q}$ does not change. We also assume in this example that x(t) is effectively band-limited, and is bounded by $V_c$ so that $|x(t)|<V_c$ for all t. Further, the clock frequency $F_s$ is significantly higher (e.g. by more than about 2 orders of magnitude) than the bandwidth $B_x$ of x(t), $\log_{10}(F_s/B_x) \gtrsim 2$. It may be then shown that, with the above assumptions, the input D to the flip-flop would be a zero-mean signal with an average zero crossing rate much higher than the bandwidth of x(t).

Note that in the limit of infinitely large clock frequency $F_s$ ($F_s \to \infty$) the behavior of the flip-flop would be equivalent to that of an analog comparator. Thus, while in practice a finite flip-flop clock frequency is used, based on the fact that it is orders of magnitude larger that the bandwidth of the signal of interest we may use continuous-time (e.g. (w*y)(t) and x(t−Δt)) rather than discrete-time (e.g. (w*y)[k] and x[k−m]) notations in reference to the ADC outputs, as a shorthand to simplify the mathematical description of our approach.

As can be seen in FIG. 1, for the 1st-order modulator shown in panel I $$\overline{x(t) - y(t)} = 0, \quad (1)$$

and for the 2nd-order modulator shown in panel II $$\overline{\dot{y}(t)} = \frac{1}{\tau}[x(t) - y(t)], \quad (2)$$

where the overdot denotes a time derivative, and the overlines denote averaging over a time interval between any pair of threshold (including zero) crossings of D (such as, e.g., the interval ΔT shown in FIG. 1). Indeed, for a continuous function ƒ(t), the time derivative of its average over a time interval ΔT may be expressed as $$\overline{\dot{f}(t)} = \overline{\dot{f}(t)} = \frac{d}{dt}\left[\frac{1}{\Delta T}\int_{t-\Delta T}^{t} ds\, f(s)\right] = \frac{1}{\Delta T}[f(t) - f(t-\Delta T)], \quad (3)$$

and it will be zero if ƒ(t)−ƒ(t−ΔT)=0.

Now, if the time averaging is performed by a lowpass filter with an impulse response w(t) and a bandwidth $B_w$ much smaller than the clock frequency, $B_w \ll F_s$, equation (1) implies that the filtered output of the 1st-order ΔΣ ADC would be effectively equal to the filtered input, $$(w*y)(t) = (w*x)(t) + \delta y, \quad (4)$$

where the asterisk denotes convolution, and the term δy (the "ripple", or "digitization noise") is small and will further be neglected. We would assume from here on that the filter w(t) has a flat frequency response and a constant group delay Δt over the bandwidth of x(t). Then equation (4) may be rewritten as $$(w*y)(t) = Z(t - \Delta t), \quad (5)$$

and the filtered output would accurately represent the input signal.

Since y(t) is a two-level staircase signal with a discrete step duration $n/F_s$, where n is a natural (counting) number, it may be accurately represented by a 1-bit discrete sequence y[k] with the sampling rate $F_s$. Thus the subsequent conversion to the discrete (digital) domain representation of x(t) (including the convolution of y[k] with w[k] and decimation to reduce the sampling rate) is rather straightforward and will not be discussed further.

If the input to a 1st-order ΔΣ ADC consists of a signal of interest x(t) and an additive noise n(t), then the filtered output may be written as $$(w*y)(t) = x(t - \Delta t) + (w*v)(t), \quad (6)$$

provided that $|x(t-\Delta t)+(w*v)(t)| < V_c$ for all t. Since w(t) has a flat frequency response over the bandwidth of x(t), it would not change the power spectral density of the additive noise v(t) in the signal passband, and the only improvement in the passband signal-to-noise ratio for the output (w*y)(t) would come from the reduction of the quantization noise δy by a well designed filter w(t).

Similarly, equation (2) implies that the filtered output of the 2nd-order ΔΣ ADC would be effectively equal to the filtered input further filtered by a 1st order lowpass filter with the time constant τ and the impulse response $h_\tau(t)$, $$(w*y)(t) = (h_\tau * w * x)(t). \quad (7)$$

From the differential equation for a 1st order lowpass filter it follows that $h_\tau *(w+\tau\dot{w}) = w$, and thus we may rewrite equation (7) as $$(h_\tau *(w+\tau\dot{w})*y)(t) = (h_\tau * w * x)(t). \quad (8)$$

Provided that τ is sufficiently small (e.g., $\tau \lesssim 1/(4\pi B_x)$), equation (8) may be further rewritten as $$((w+\tau\dot{w})*y)(t) = (w*x)(t) = x(t - \Delta t). \quad (9)$$

The effect of the 2nd-order loop filter on the quantization noise δy is outside the scope of this disclosure and will not be discussed.

SUMMARY

Since at any given frequency a linear filter affects both the noise and the signal of interest proportionally, when a linear filter is used to suppress the interference outside of the passband of interest the resulting signal quality is affected only by the total power and spectral composition, but not by the type of the amplitude distribution of the interfering signal. Thus a linear filter cannot improve the passband signal-to-noise ratio, regardless of the type of noise. On the other hand, a nonlinear filter has the ability to disproportionately affect signals with different temporal and/or amplitude structures, and it may reduce the spectral density of non-Gaussian (e.g. impulsive) interferences in the signal passband without significantly affecting the signal of interest. As a result, the signal quality may be improved in excess of that achievable by a linear filter. Such non-Gaussian (and, in particular, impulsive, or outlier, or transient) noise may originate from a multitude of natural and technogenic (man-made) phenomena. The technogenic noise specifically is a ubiquitous and growing source of harmful interference affecting communication and data acquisition systems, and such noise may dominate over the thermal noise. While the non-Gaussian nature of technogenic noise provides an opportunity for its effective mitigation by nonlinear filtering, current state-of-the-art approaches employ such filtering in the digital domain, after analog-to-digital conversion. In the process of such conversion, the signal bandwidth is reduced, and the broadband non-Gaussian noise becomes more Gaussian-like. This substantially diminishes the effectiveness of the subsequent noise removal techniques.

The present invention overcomes the limitations of the prior art through incorporation of a particular type of nonlinear noise filtering of the analog input signal into nonlinear analog filters preceding an ADC, and/or into loop filters of $\Delta\Sigma$ ADCs. Such ADCs thus combine analog-to-digital conversion with analog nonlinear filtering, enabling mitigation of various types of in-band non-Gaussian noise and interference, especially that of technogenic origin, including broadband impulsive interference. This may considerably increase quality of the acquired signal over that achievable by linear filtering in the presence of such interference. An important property of the presented approach is that, while being nonlinear in general, the proposed filters would largely behave linearly. They would exhibit nonlinear behavior only intermittently, in response to noise outliers, thus avoiding the detrimental effects, such as instabilities and intermodulation distortions, often associated with nonlinear filtering.

The intermittently nonlinear filters of the present invention would also enable separation of signals (and/or signal components) with sufficiently different temporal and/or amplitude structures in the time domain, even when these signals completely or partially overlap in the frequency domain. In addition, such separation may be achieved without reducing the bandwidths of said signal components.

Even though the nonlinear filters of the present invention are conceptually analog filters, they may be easily implemented digitally, for example, in Field Programmable Gate Arrays (FPGAs) or software. Such digital implementations would require very little memory and would be typically inexpensive computationally, which would make them suitable for real-time signal processing.

Further scope and the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

BRIEF DESCRIPTION OF FIGURES

FIG. 2. Simplified diagram of improving receiver performance in the presence of impulsive interference.

FIG. 5. Block diagrams of CMTFs with blanking ranges $[\alpha_-, \alpha_+]$ (a) and $[V_-, V_+]/G$ (b).

FIG. 10. Using sums and/or differences of input and output of CMTF and its various intermediate signals for separating impulsive (outlier) and non-impulsive signal components.

FIG. 18. Illustration of QTFs' convergence to steady state for different initial conditions.

ABBREVIATIONS

Figure 1:
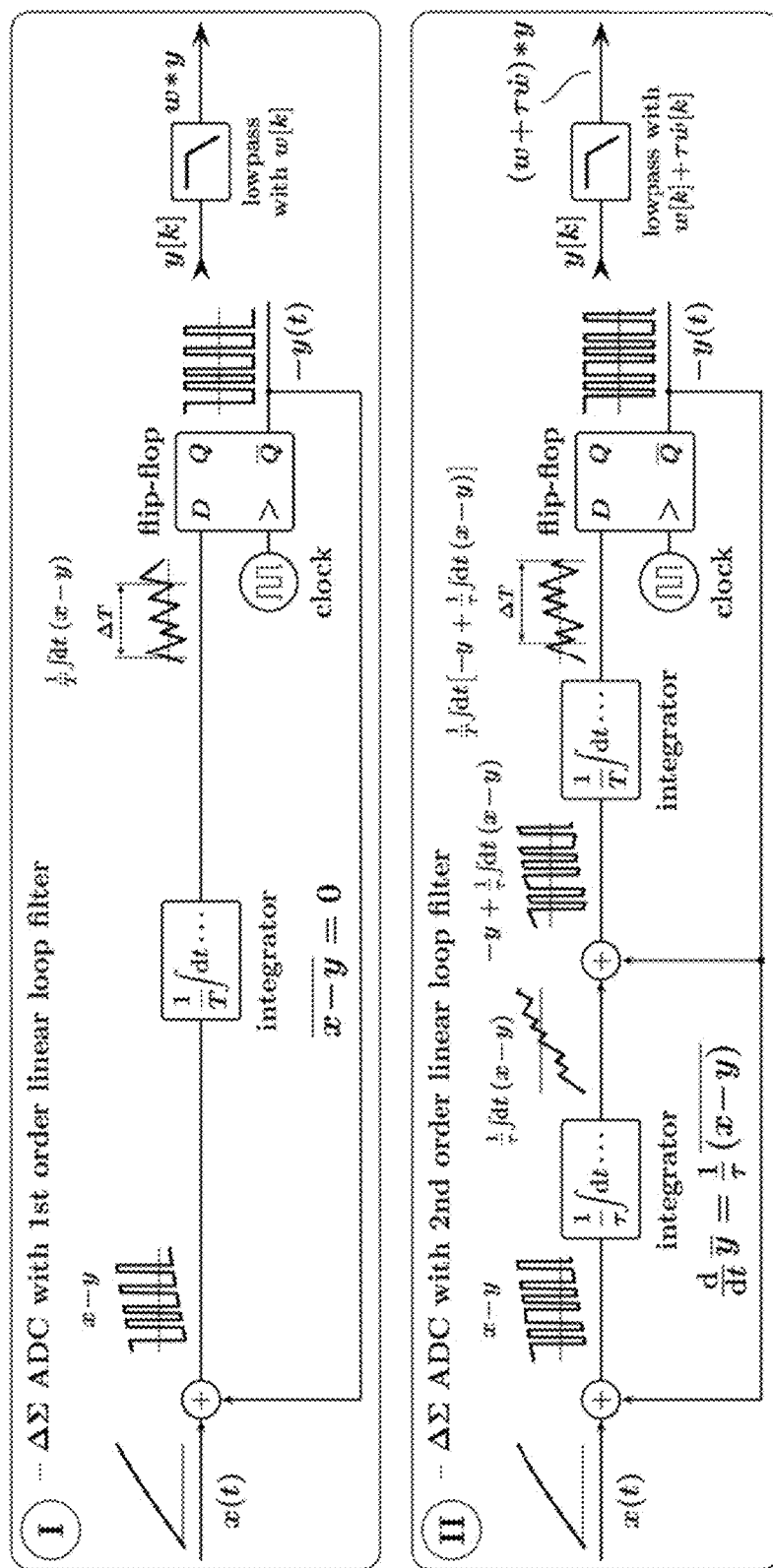
FIG. 1. $\Delta\Sigma$ ADCs with 1st-order (I) and 2nd-order (II) linear loop filters.

ABAINF: Analog Blind Adaptive Intermittently Nonlinear Filter; A/D: Analog-to-Digital; ADC: Analog-to-Digital Converter (or Conversion); ADiC: Analog Differential Clipper; AFE: Analog Front End; AGC: Automatic Gain Control; ASIC: Application-Specific Integrated Circuit: ASSP: Application-Specific Standard Product; AWGN: Additive White Gaussian Noise;

BAINF: Blind Adaptive Intermittently Nonlinear Filter; BER: Bit Error Rate, or Bit. Error Ratio;

CDL: Canonical Differential Limiter: CDMA: Code Division Multiple Access; CMTF: Clipped Mean Tracking Filter; COTS: Commercial Off-The-Shelf;

DSP: Digital Signal Processing/Processor;

EMC: electromagnetic compatibility; EMI: electromagnetic interference;

FIR: Finite Impulse Response; FPGA: Field Programmable Gate Array;

HSDPA: High Speed Downlink Packet. Access;

IC: Integrated Circuit; I/Q: In-phase/Quadrature; IQR: interquartile range;

MAD: Mean/Median Absolute Deviation; MATLAB: MATrix LABoratory (numerical computing environment and fourth-generation programming language developed by Math-Works); MTF: Median Tracking Filter;

NDL: Nonlinear Differential Limiter;

OOB: Out-Of-Band;

PDF: Probability Density Function; PSD: Power Spectral Density;

QTF: Quartile (or Quantile) Tracking Filter;

RF: Radio Frequency; RFI: Radio Frequency Interference; RMS: Root Mean Square; RRC: Root Raised Cosine; RX: Receiver;

SNR: Signal-to-Noise Ratio;

UWB: Ultra-wideband;

VGA: Variable-Gain Amplifier;

1 Analog Intermittently Nonlinear Filters for Mitigation of Outlier Noise

In the simplified illustration that follows, our focus is not on providing precise definitions and rigorous proof of the statements and assumptions, but on outlining the general idea of employing intermittently nonlinear filters for mitigation of outlier (e.g. impulsive) noise, and thus improving the performance of a communications receiver in the presence of such noise.

1.1 Motivation and Simplified System Model

Let us assume that the input noise affecting a baseband signal of interest with unit power consists of two additive components: (i) a Gaussian component with the power $P_G$ in the signal passband, and (ii) an outlier (impulsive) component with the power $P_i$ in the signal passband. Thus if a linear antialiasing filter is used before the analog-to-digital conversion (ADC), the resulting signal-to-noise ratio (SNR) may be expressed as $(P_G+P_i)^{-1}$.

For simplicity, let us further assume that the outlier noise is white and consists of short (with the characteristic duration much smaller than the reciprocal of the bandwidth of the signal of interest) random pulses with the average interarrival times significantly larger than their duration, yet significantly smaller than the reciprocal of the signal bandwidth. When the bandwidth of such noise is reduced to within the baseband by linear filtering, its distribution would be well approximated by Gaussian [41]. Thus the observed noise in the baseband may be considered Gaussian, and we may use the Shannon formula [42] to calculate the channel capacity.

Let us now assume that we use a nonlinear antialiasing filter such that it behaves linearly, and affects the signal and noise proportionally, when the baseband power of the impulsive noise is smaller than a certain fraction of that of the Gaussian component, $P_i \leq \varepsilon P_G$ ($\varepsilon \geq 0$) resulting in the SNR $(P_G+P_i)^{-1}$. However, when the baseband power of the impulsive noise increases beyond $\varepsilon P_G$, this filter maintains its linear behavior with respect to the signal and the Gaussian noise component, while limiting the amplitude of the outlier noise in such a way that the contribution of this noise into the baseband remains limited to $\varepsilon P_G < P_i$. Then the resulting baseband SNR would be $[(1+\varepsilon)P_G]^{-1} > (P_G+P_i)^{-1}$. We may view the observed noise in the baseband as Gaussian, and use the Shannon formula to calculate the limit on the channel capacity.

As one may see from this example, by disproportionately affecting high-amplitude outlier noise while otherwise preserving linear behavior, such nonlinear antialiasing filter would provide resistance to impulsive interference, limiting the effects of the latter, for small e, to an insignificant fraction of the Gaussian noise. FIG. 2 illustrates this with a simplified diagram of improving receiver performance in the presence of impulsive interference by employing such analog nonlinear filter before the ADC. In this illustration, $\varepsilon=0.2$.

Figure 3:
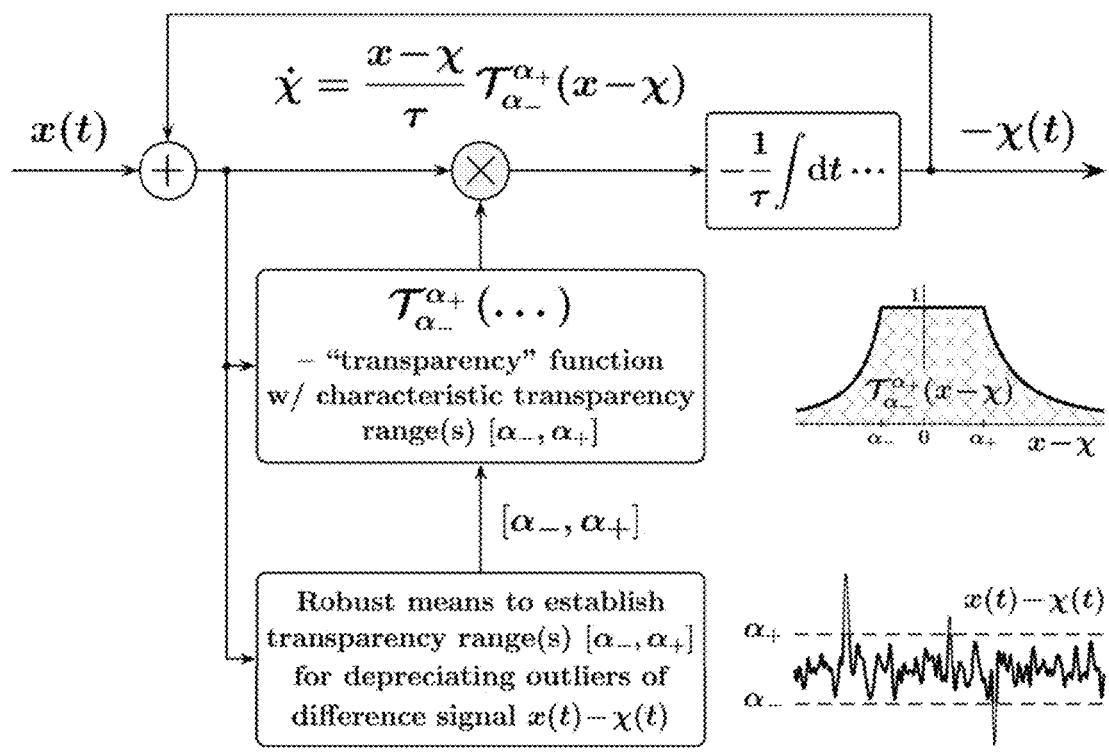
FIG. 3. Illustrative ABAINF block diagram.

2 Analog Blind Adaptive Intermittently Nonlinear Filters (ABAINFs) with the Desired Behavior The analog nonlinear filters with the behavior outlined in § 1.1 may be constructed using the approach shown in FIG. 3, which provides an illustrative block diagram of an Analog Blind Adaptive Intermittently Nonlinear Filter (ABAINF).

In FIG. 3, the influence function [43] $\mathcal{I}_{\alpha_-}^{\alpha_+}(x)$ is represented as $\mathcal{I}_{\alpha_-}^{\alpha_+}(x) = x \mathcal{T}_{\alpha_-}^{\alpha_+}(x)$, where $\mathcal{T}_{\alpha_-}^{\alpha_+}(x)$ is a transparency function with the characteristic transparency range $[\alpha_-, \alpha_+]$. We may require that $\mathcal{T}_{\alpha_-}^{\alpha_+}(x)$ is effectively (or approximately) unity for $\alpha_- \leq x \leq \alpha_+$, and that $\mathcal{T}_{\alpha_-}^{\alpha_+}(|x|)$ decays to zero (e.g. monotonically) for x outside of the range $[\alpha_-, \alpha_+]$.

As one should be able to see in FIG. 3, a (nonlinear) differential equation relating the input x(t) to the output x(t) of an ABAINF may be written as $$\frac{d}{dt}\chi = \frac{1}{\tau}\mathcal{I}_{\alpha_-}^{\alpha_+}(x-\chi) = \frac{x-\chi}{\tau}\mathcal{T}_{\alpha_-}^{\alpha_+}(x-\chi), \quad (10)$$

where τ is the ABAINF's time parameter (or time constant).

One skilled in the art will recognize that, according to equation (10), when the difference signal x(t)–χ(t) is within the transparency range $[\alpha_-, \alpha_+]$, the ABAINF would behave as a 1st order linear lowpass filter with the 3 dB corner frequency $1/(2\pi\tau)$, and, for a sufficiently large transparency range, the ABAINF would exhibit nonlinear behavior only intermittently, when the difference signal extends outside the transparency range.

If the transparency range $[\alpha_-, \alpha_+]$ is chosen in such a way that it excludes outliers of the difference signal x(t)–χ(t), then, since the transparency function $\mathcal{T}_{\alpha_-}^{\alpha_+}(x)$ decays to zero for x outside of the range $[\alpha_-, \alpha_+]$, the contribution of such outliers to the output χ(t) would be depreciated.

It may be important to note that outliers would be depreciated differentially, that is, based on the difference signal x(t)–χ(t) and not the input signal x(t).

The degree of depreciation of outliers based on their magnitude would depend on how rapidly the transparency function $\mathcal{T}_{\alpha_-}^{\alpha_+}(x)$ decays to zero for x outside of the transparency range. For example, as follows from equation (10), once the transparency function decays to zero, the output χ(t) would maintain a constant value until the difference signal x(t)–χ(t) returns to within non-zero values of the transparency function.

Figure 4:
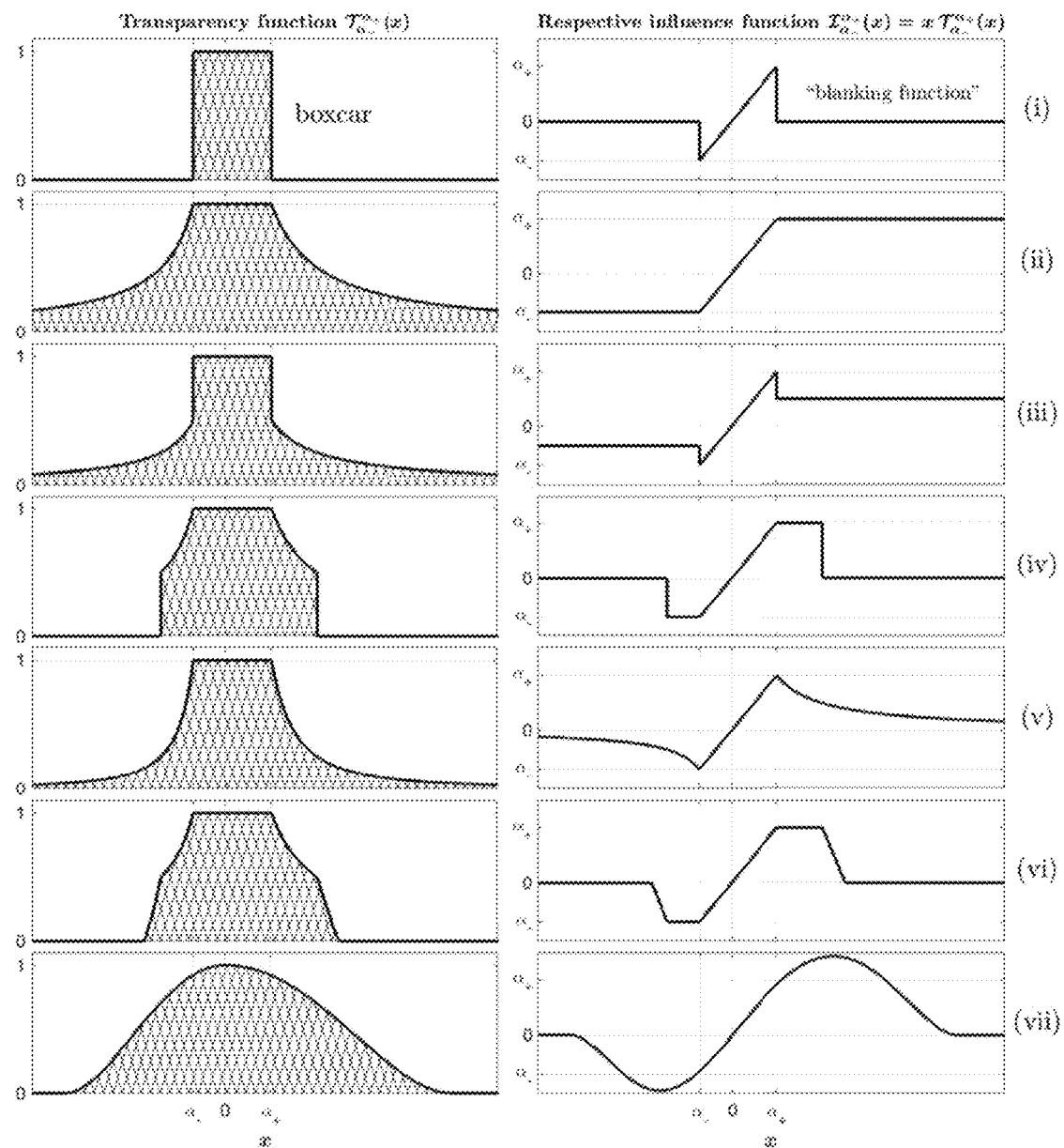
FIG. 4. Illustrative examples of the transparency functions and their respective influence functions.

FIG. 4 provides several illustrative examples of the transparency functions and their respective influence functions.

One skilled in the art will recognize that a transparency function with multiple transparency ranges may also be constructed as a product of (e.g. cascaded) transparency functions, wherein each transparency function is characterized by its respective transparency range.

2.1 A Particular ABAINF Example

As an example, let us consider a particular ABAINF with the influence function of a type shown in FIG. 4(iii), for a symmetrical transparency range $[\alpha_-, \alpha_+]=[-\alpha, \alpha]$:

$$\mathcal{I}_\alpha = x\mathcal{T}_\alpha(x) = x \times \begin{cases} 1 & \text{for } |x| \leq \alpha \\ \frac{\mu\tau}{|x|} & \text{otherwise} \end{cases}, \quad (11)$$

where $\alpha \geq 0$ is the resolution parameter (with units "amplitude"), $\mathcal{T} \geq 0$ is the time parameter (with units "time"), and $\mu \geq 0$ is the rate parameter (with units "amplitude per time").

For such an ABAINF, the relation between the input signal x(t) and the filtered output signal χ(t) may be expressed as $$\dot{\chi} = \frac{x-\chi}{\tau}\left[\theta(\alpha-|x-\chi|) + \frac{\mu\tau}{|x-\chi|}\theta(|x-\chi|-\alpha)\right], \quad (12)$$

where θ(x) is the Heaviside unit step function [30].

Note that when $|x-\chi| \leq \alpha$ (e.g., in the limit $\alpha \to \infty$) equation (12) describes a 1st order analog linear lowpass filter (RC integrator) with the time constant τ (the 3 dB corner frequency $1/(2\pi\tau)$). When the magnitude of the difference signal $|x-\chi|$ exceeds the resolution parameter α, however, the rate of change of the output is limited to the rate parameter μ, and no longer depends on the magnitude of the incoming signal x(t), providing an output insensitive to outliers with a characteristic amplitude determined by the resolution parameter α. Note that for a sufficiently large α this filter would exhibit nonlinear behavior only intermittently, in response to noise outliers, while otherwise acting as a 1st order linear lowpass filter.

Further note that for $\mu=\alpha/\tau$ equation (12) corresponds to the Canonical Differential Limiter (CDL) described in [9, 10, 24, 32], and in the limit $\alpha \to 0$ it corresponds to the Median Tracking Filter described in § 3.1.

However, an important distinction of this ABAINF from the nonlinear filters disclosed in [9, 10, 24, 32] would be that the resolution and the rate parameters are independent from each other. This may provide significant benefits in performance, ease of implementation, cost reduction, and in other areas, including those clarified and illustrated further in this disclosure.

2.2 Clipped Mean Tracking Filter (CMTF)

The blanking influence function shown in FIG. 4(i) would be another particular example of the ABAINF outlined in FIG. 3, where the transparency function may be represented as a boxcar function, $$\mathcal{T}_{\alpha_-}^{\alpha_+}(x) = \theta(x-\alpha_-) - \theta(x-\alpha_+). \quad (13)$$

For this particular choice, the ABAINF may be represented by the following 1st order nonlinear differential equation:

$$\frac{d}{dt}\chi = \frac{1}{\tau}\mathcal{B}_{\alpha_-}^{\alpha_+}(x-\chi), \quad (14)$$

where the blanking function $B_{\alpha_-}^{\alpha_+}(x)$ may be defined as $$\mathcal{B}_{\alpha_-}^{\alpha_+}(x) = \begin{cases} x & \text{for } \alpha_- \leq x \leq \alpha_+ \\ 0 & \text{otherwise} \end{cases}, \quad (15)$$

and where $[\alpha_-, \alpha_+]$ may be called the blanking range.

We shall call an ABAINF with such influence function a 1st order Clipped Mean Tracking Filter (CMTF).

A block diagram of a CMTF is shown in FIG. 5(a). In this figure, the blanker implements the blanking function $B_{\alpha_-}^{\alpha_+}(x)$.

In a similar fashion, we may call a circuit implementing an influence function $\mathcal{I}_{\alpha_-}^{\alpha_+}(x)$ a depreciator with characteristic depreciation (or transparency, or influence) range $[\alpha_-, \alpha_+]$.

Note that, for b>0, $$b^{-1}\mathcal{I}_{\alpha_-}^{\alpha_+}(bx) = \mathcal{I}_{\frac{\alpha_-}{b}}^{\frac{\alpha_+}{b}}(x), \quad (16)$$

and thus, if the blanker with the range $[V_-, V_+]$ is preceded by a gain stage with the gain G and followed by a gain stage with the gain $G^{-1}$, its apparent (or "equivalent") blanking range would be $[V_-, V_+]/G$, and would no longer be hardware limited. Thus control of transparency ranges of practical ABAINF implementations may be performed by automatic gain control (AGC) means. This may significantly simplify practical implementations of ABAINF circuits (e.g. by allowing constant hardware settings for the transparency ranges). This is illustrated in FIG. 5(b) for the CMTF circuit.

Figure 6:
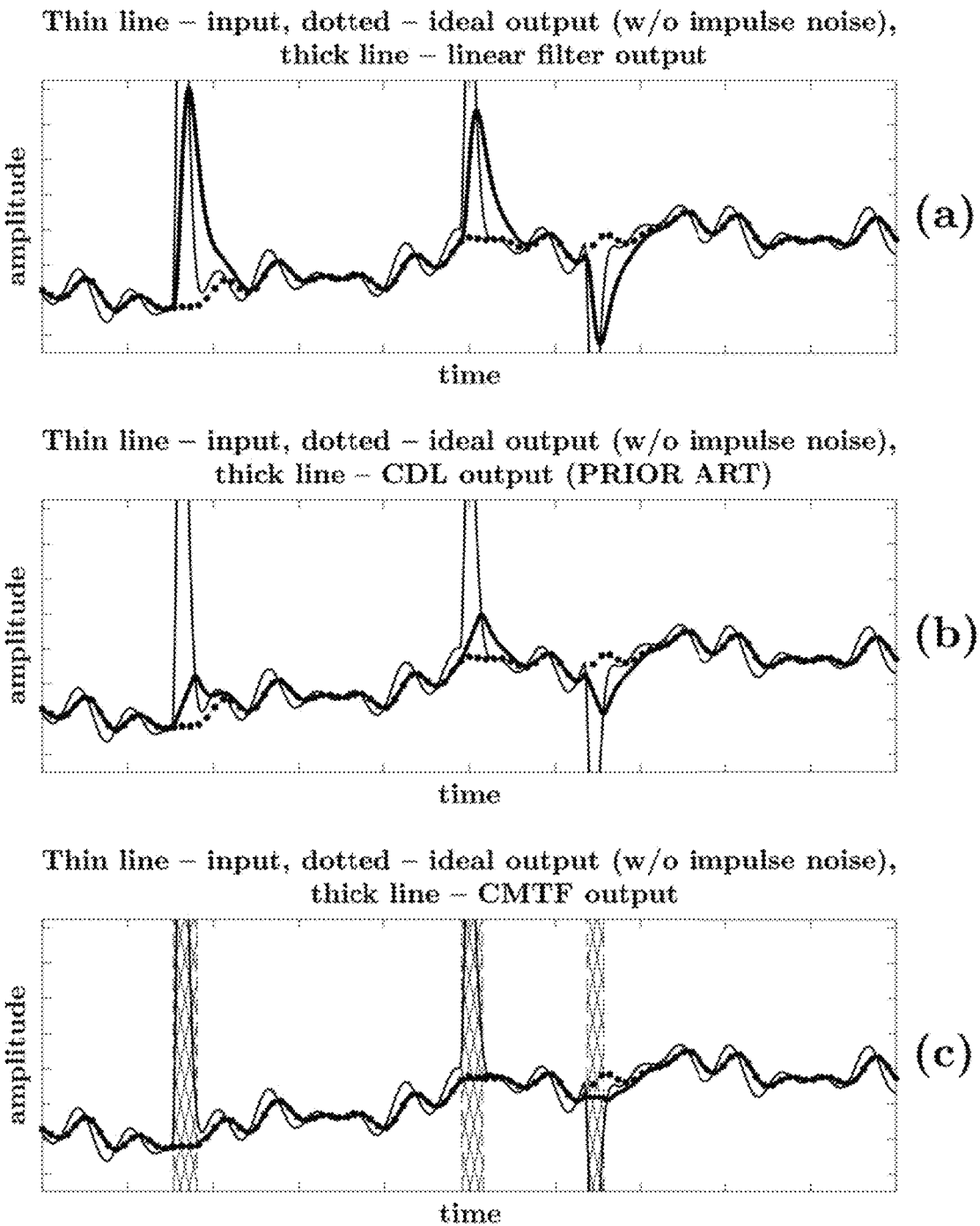
FIG. 6. Resistance of CMTF to outlier noise. The cross-hatched time intervals in panel (c) correspond to nonlinear CMTF behavior (zero rate of change).

FIG. 6 illustrates resistance of a CMTF (with a symmetrical blanking range $[-\alpha, \alpha]$) to outlier noise, in comparison with a 1st order linear lowpass filter with the same time constant (panel (a)), and with the CDL with the resolution parameter α and $\tau_0 = \tau$ (panel (b)). The cross-hatched time intervals in the lower panel (panel (c)) correspond to nonlinear CMTF behavior (zero rate of change of the output). Note that the clipping (i.e. zero rate of change of the CMTF output) is performed differentially, based on the magnitude of the difference signal $x(t)-\chi(t)$ and not that of the input signal $x(t)$.

Figure 7:
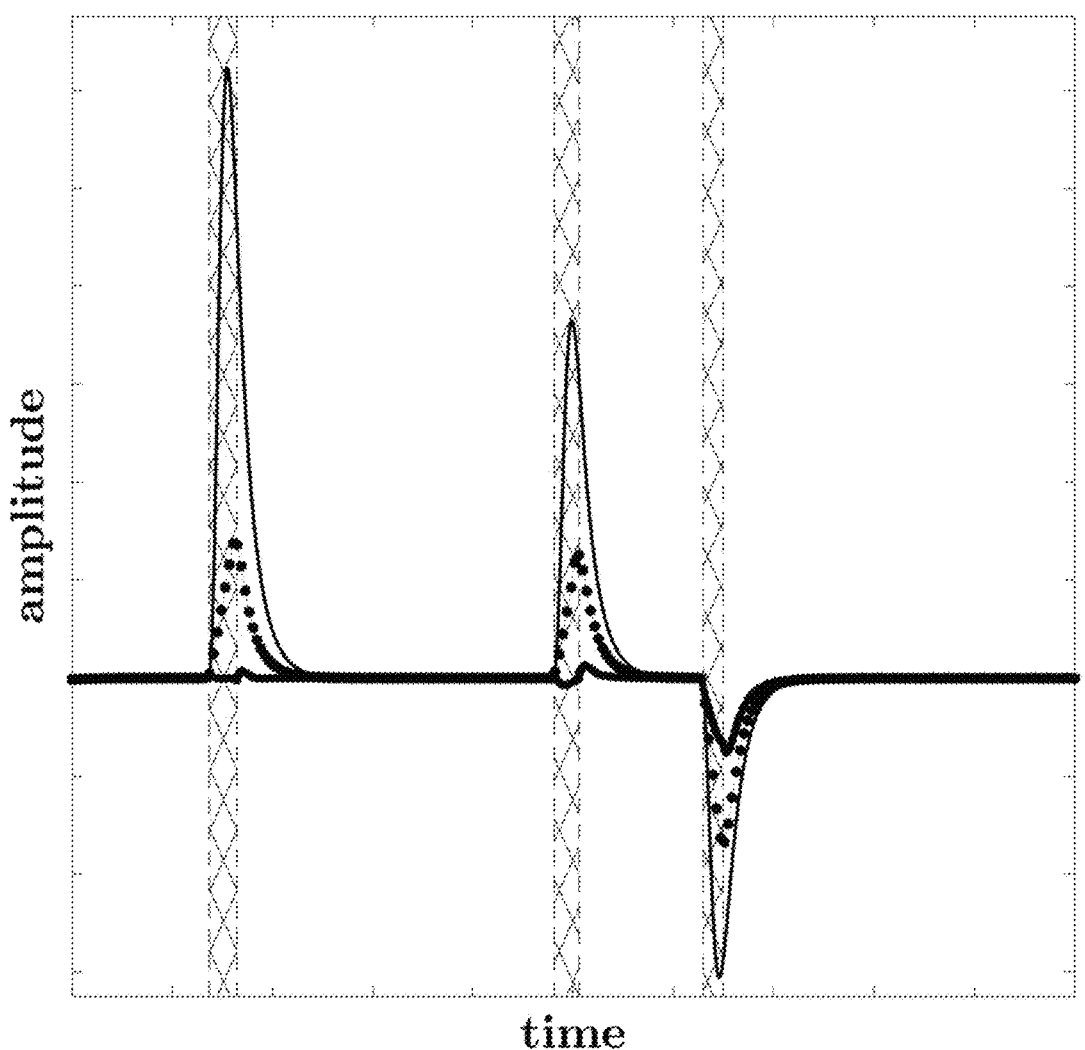
FIG. 7. Illustration of differences in the error signal for the example of FIG. 6. The cross-hatched time intervals indicate nonlinear CMTF behavior (zero rate of change).

We may call the difference between a filter output when the input signal is affected by impulsive noise and an "ideal" output (in the absence of impulsive noise) an "error signal". Then the smaller the error signal, the better the impulsive noise suppression. FIG. 7 illustrates differences in the error signal for the example of FIG. 6. The cross-hatched time intervals indicate nonlinear CMTF behavior (zero rate of change).

2.3 Illustrative CMTF Circuit

Figure 8:
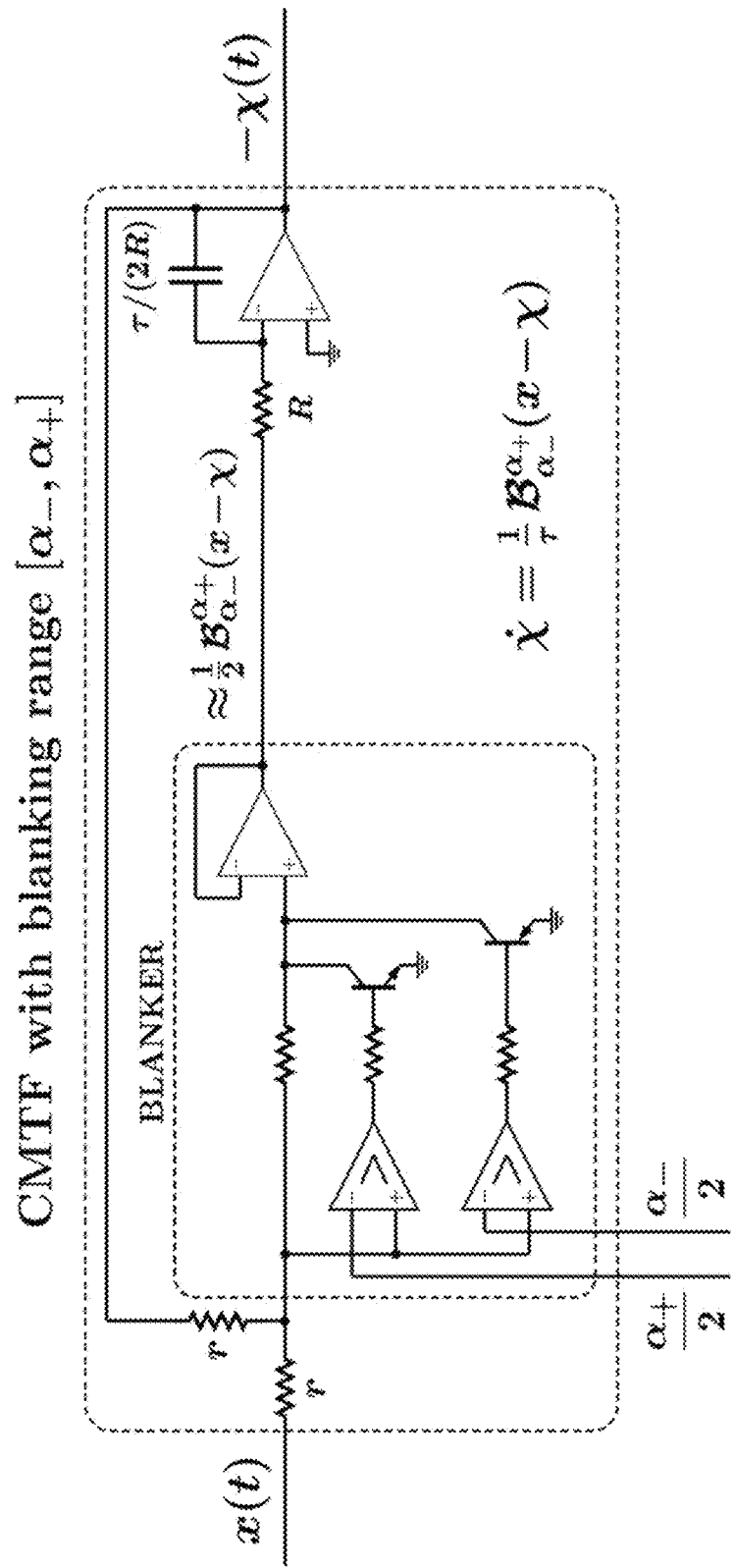
FIG. 8. Simplified illustrated schematic of CMTF circuit implementation.

FIG. 8 provides a simplified illustration of implementing a CMTF by solving equation (14) in an electronic circuit.

Figure 9:
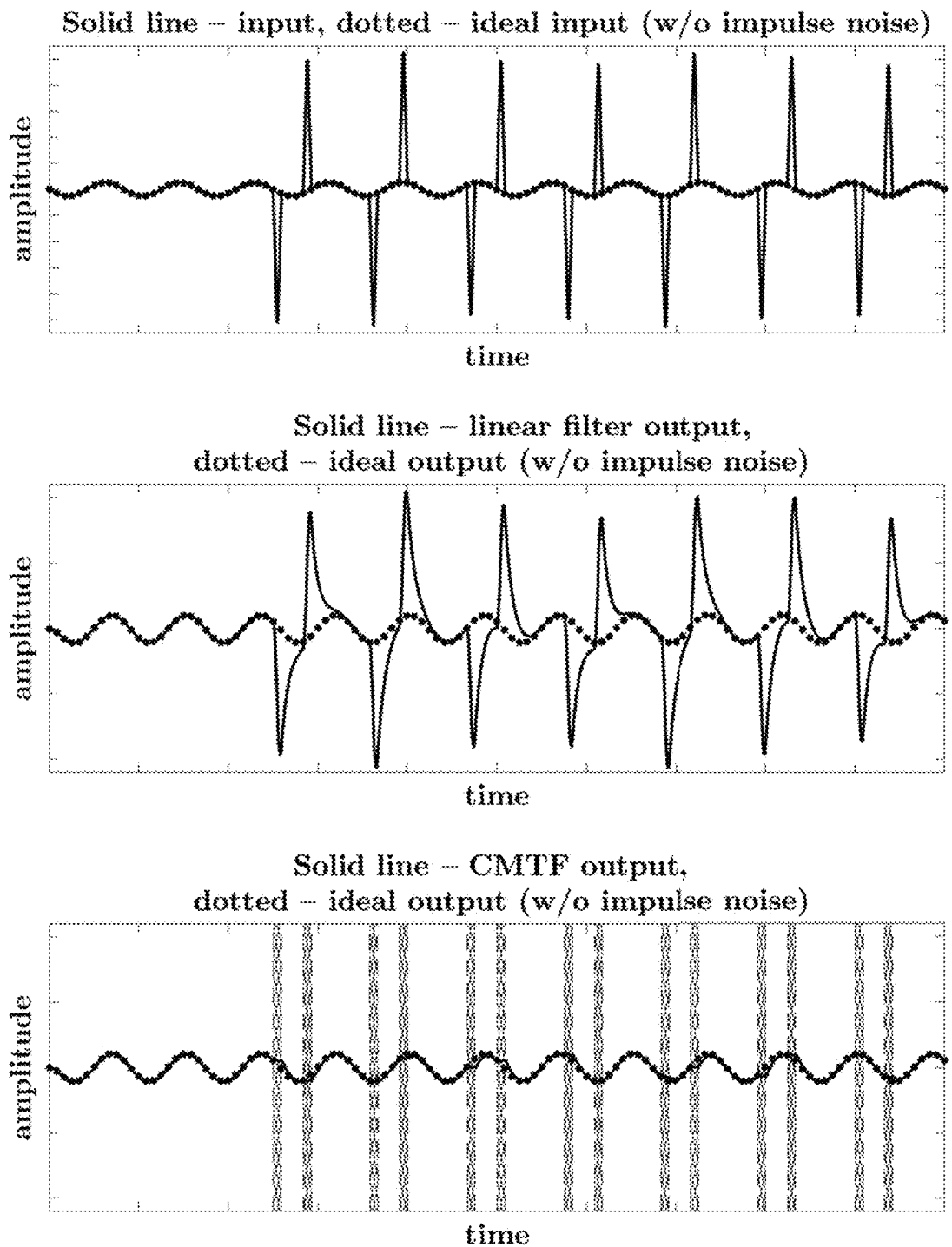
FIG. 9. Resistance of the CMTF circuit of FIG. 8 to outlier noise. The cross-hatched time intervals in the lower panel correspond to nonlinear CMTF behavior.

FIG. 9 provides an illustration of resistance of the CMTF circuit of FIG. 8 to outlier noise. The cross-hatched time intervals in the lower panel correspond to nonlinear CMTF behavior.

While FIG. 8 illustrates implementation of a CMTF in an electronic circuit comprising discrete components, one skilled in the art will recognize that the intended electronic functionality may be implemented by discrete components mounted on a printed circuit board, or by a combination of integrated circuits, or by an application-specific integrated circuit (ASIC). Further, one skilled in the art will recognize that a variety of alternative circuit topologies may be developed and/or used to implement the intended electronic functionality.

2.4 Using CMTFs for Separating Impulsive (Outlier) and Non-Impulsive Signal Components with Overlapping Frequency Spectra: Analog Differential Clippers (ADiCs)

In some applications it may be desirable to separate impulsive (outlier) and non-impulsive signal components with overlapping frequency spectra in time domain.

Examples of such applications would include radiation detection applications, and/or dual function systems (e.g. using radar as signal of opportunity for wireless communications and/or vice versa).

Such separation may be achieved by using sums and/or differences of the input and the output of a CMTF and its various intermediate signals. This is illustrated in FIG. 10.

In this figure, the difference between the input to the CMTF integrator (signal $\tau\dot\chi(t)$ at point III) and the CMTF output may be designated as a prime output of an Analog Differential Clipper (ADiC) and may be considered to be a non-impulsive ("background") component extracted from the input signal. Further, the signal across the blanker (i.e. the difference between the blanker input $x(t)-\chi(t)$ and the blanker output $\tau\dot\chi(t)$) may be designated as an auxiliary output of an ADiC and may be considered to be an impulsive (outlier) component extracted from the input signal.

Figure 11:
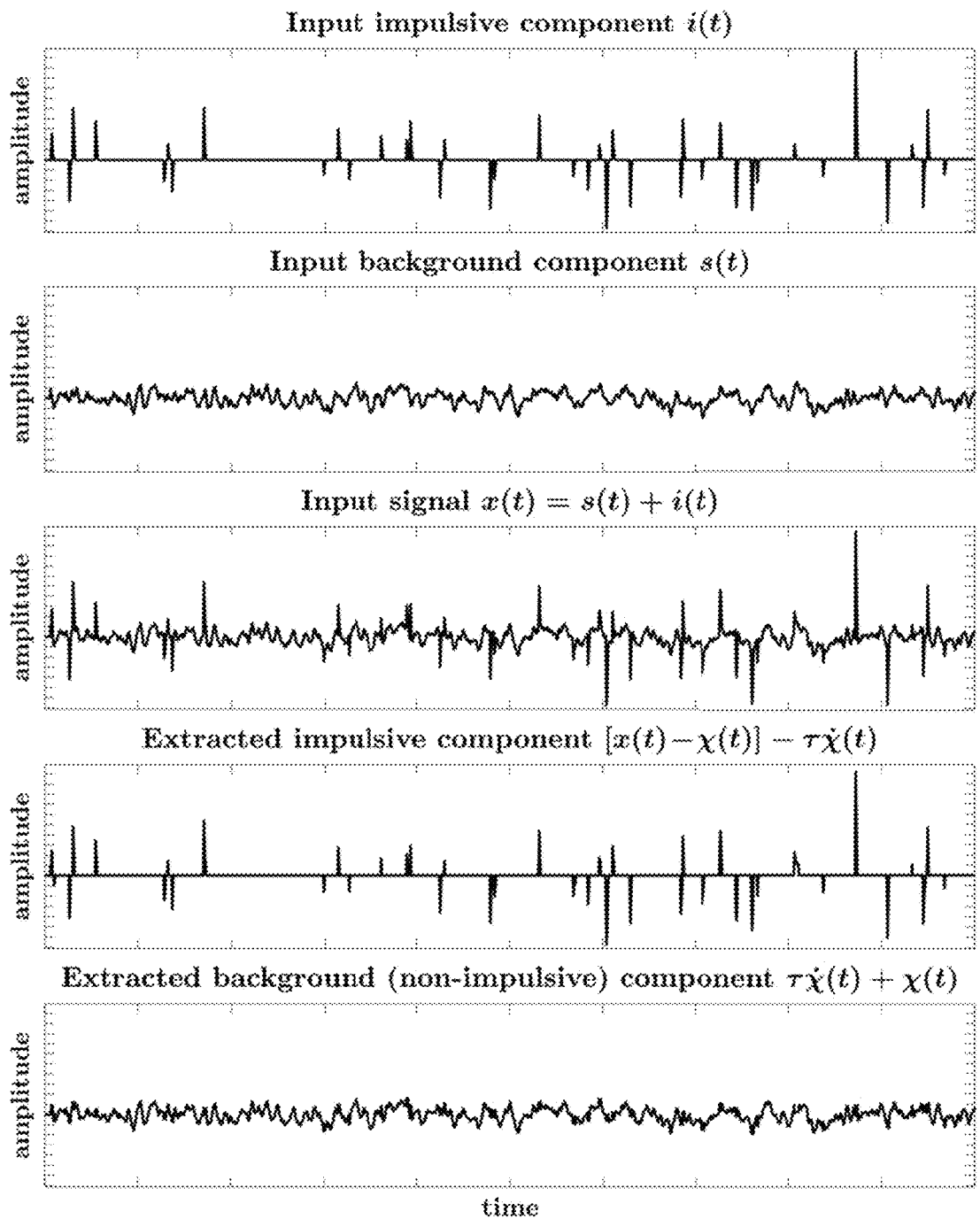
FIG. 11. Illustration of using CMTF with appropriate blanking range for separating impulsive and non-impulsive ("background") signal components.

FIG. 11 illustrates using a CMTF with an appropriately chosen blanking range for separating impulsive and non-impulsive ("background") signal components. Note that the sum of the prime and the auxiliary ADiC outputs would be effectively identical to the input signal, and thus the separation of impulsive and non-impulsive components may be achieved without reducing signal's bandwidth.

Figure 12:
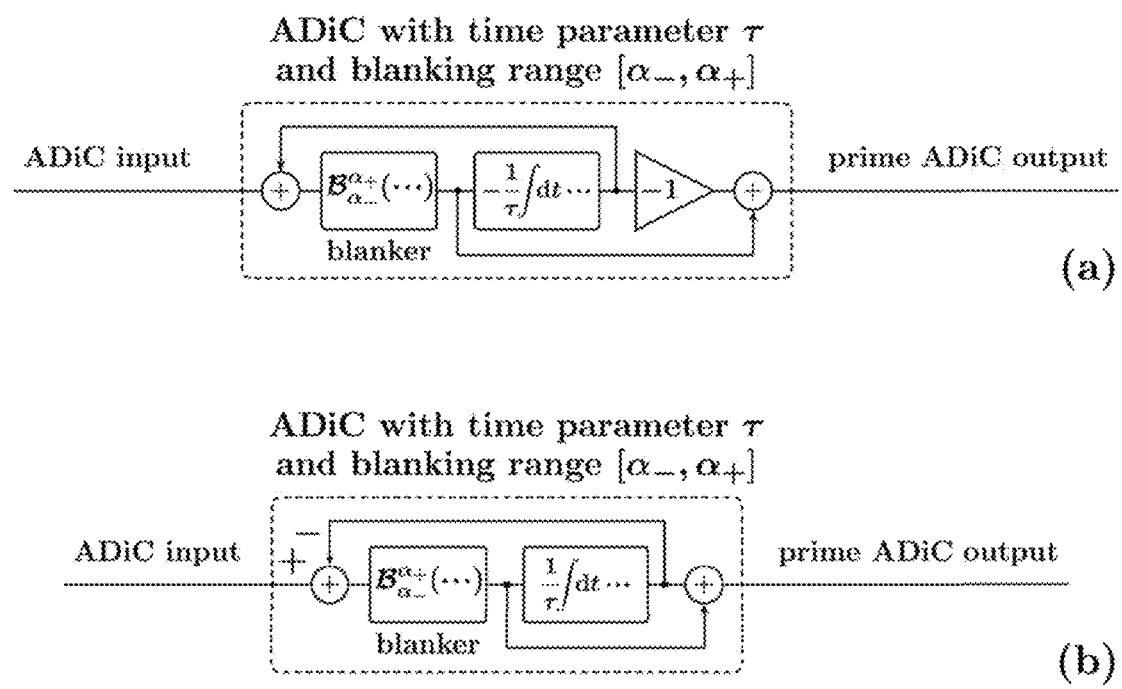
FIG. 12. Illustrative block diagrams of an ADiC with time parameter T and blanking range $[\alpha_-, \alpha_+]$.

FIG. 12 provides illustrative block diagrams of an ADiC with time parameter τ and blanking range [α_, α_+].

Figure 13:
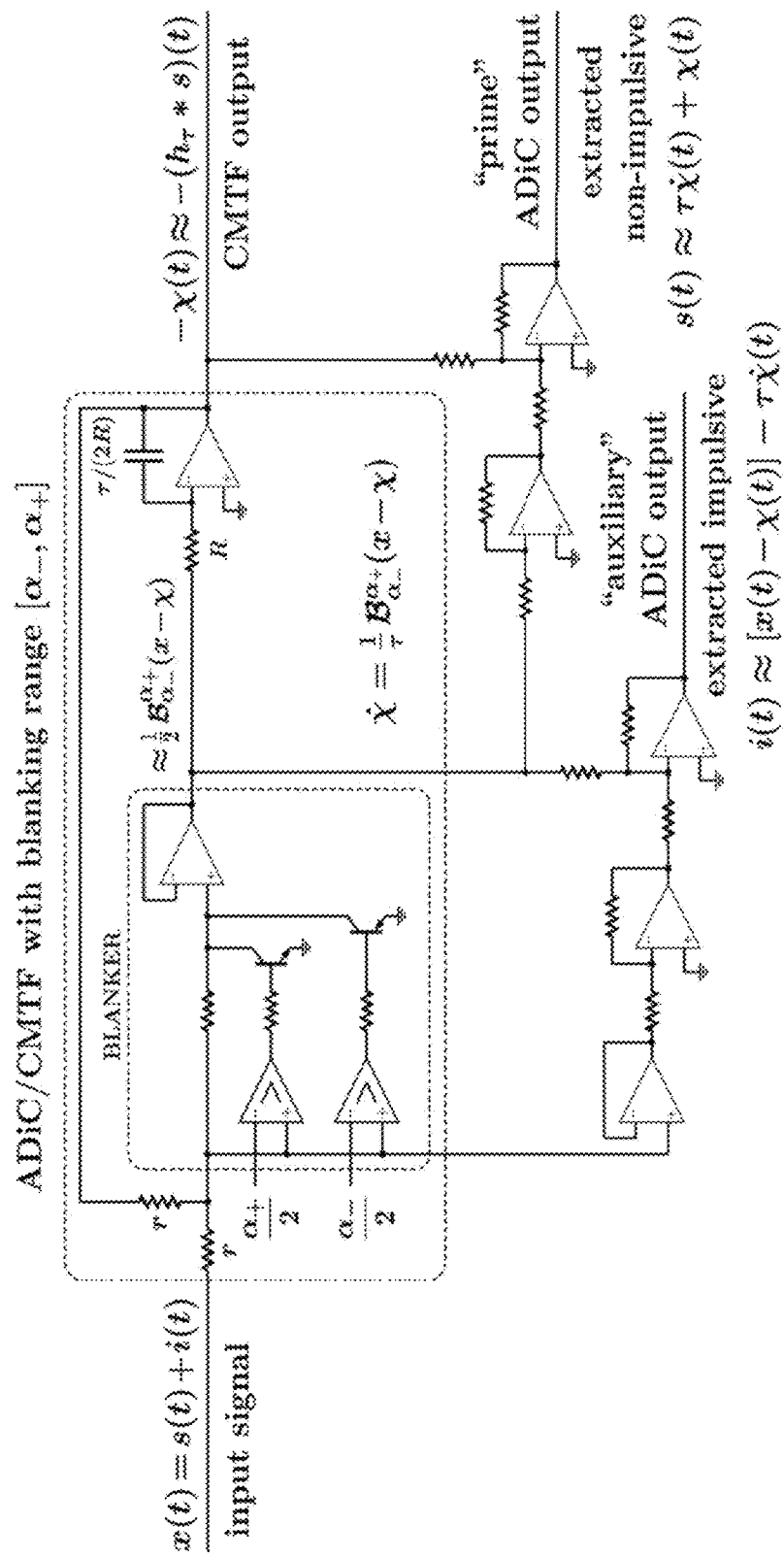
FIG. 13. Simplified illustrative electronic circuit diagram of using CMTF with appropriately chosen blanking range $[\alpha_-, \alpha_+]$ for separating incoming signal x(t) into impulsive i(t) and non-impulsive s(t) ("background") signal components.
Figure 14:
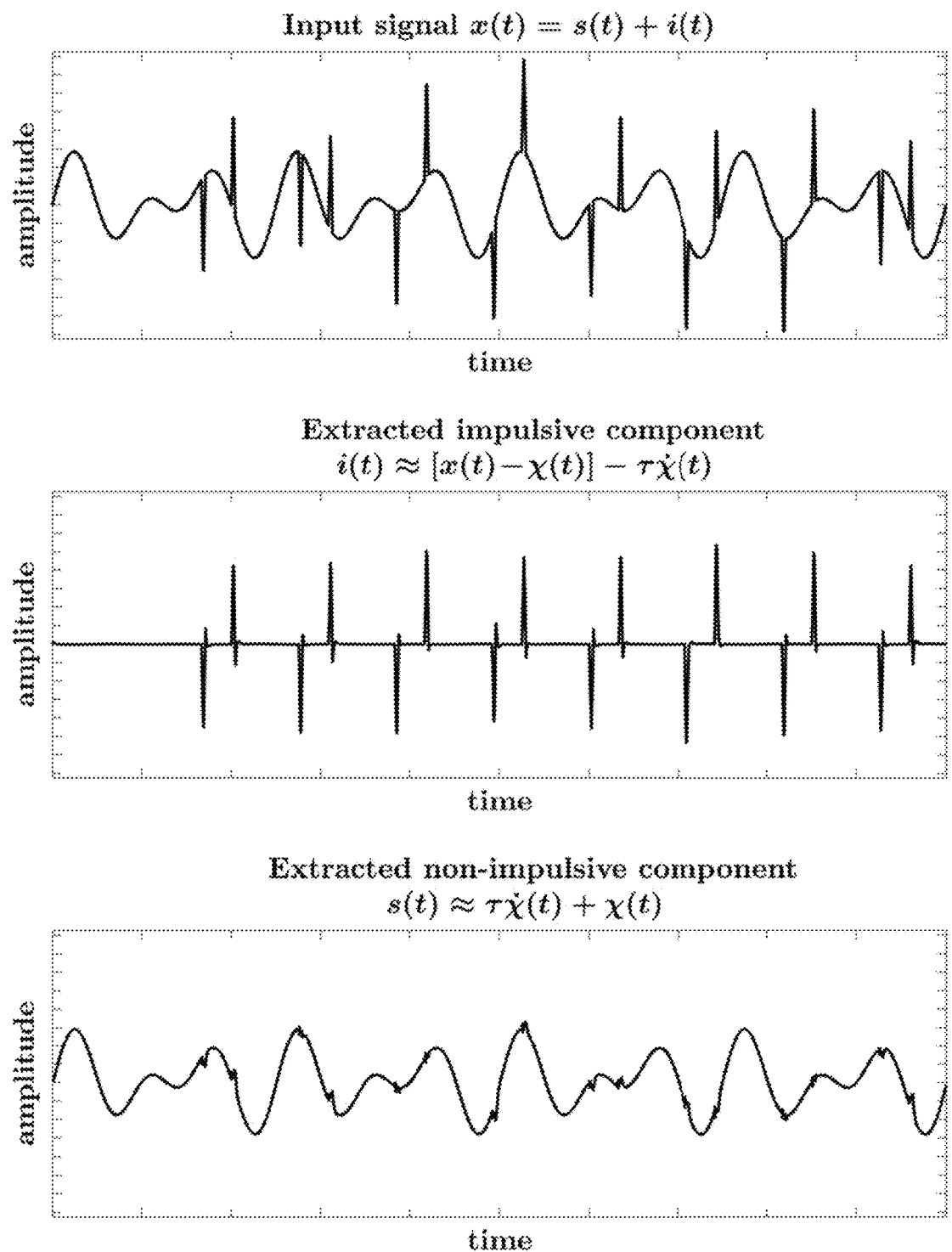
FIG. 14. Illustration of separating incoming signal x(t) into impulsive i(t) and non-impulsive s(t) ("background") components by the circuit of FIG. 13.

FIG. 13 provides a simplified illustrative electronic circuit diagram of using a CMTF/ADiC with an appropriately chosen blanking range [a_, α_+] for separating incoming signal x(t) into impulsive i(t) and non-impulsive s(t) ("background") signal components, and FIG. 14 provides an illustration of such separation by the circuit of FIG. 13.

2.5 Numerical Implementations of ABAINFs/CMTFs/ADiCs

Even though an ABAINF is an analog filter by definition, it may be easily implemented digitally, for example, in a Field Programmable Gate Array (FPGA) or software. A digital ABAINF would require very little memory and would be typically inexpensive computationally, which would make it suitable for real-time implementations.

An example of a numerical algorithm implementing a finite-difference version of a CMTF/ADiC may be given by the following MATLAB function:

```
function [chi,prime,aux] = CMTF_ADiC(x,t,tau,alpha_p,alpha_m)
    chi = zeros(size(x));
    aux = zeros(size(x));
    prime = zeros(size(x));
    dt = diff(t);
    chi(1) = x(1);
    B = 0;
    for i = 2:length(x);
        dX = x(i) - chi(i-1);
        if dX>alpha_p(i-1)
            B = 0;
        elseif dX<alpha_m(i-1)
            B = 0;
        else
            B = dX;
        end
        chi(i) = chi(i-1) + B/(tau+dt(i-1))*dt(i-1); % numerical antiderivative
        prime(i) = B + chi(i-1);
        aux(i) = dX - B;
    end
return
```

In this example, "x" is the input signal, "t" is the time array, "tau" is the CMTF's time constant. "alpha_p" and "alpha_m" are the upper and the lower, respectively, blanking values, "chi" is the CMTF's output, "aux" is the extracted impulsive component (auxiliary ADiC output), and "prime" is the extracted non-impulsive ("background") component (prime ADiC output).

Note that we retain, for convenience, the abbreviations "ABAINF" and/or "ADiC" for finite-difference (digital) ABAINF and/or ADiC implementations.

Figure 15:
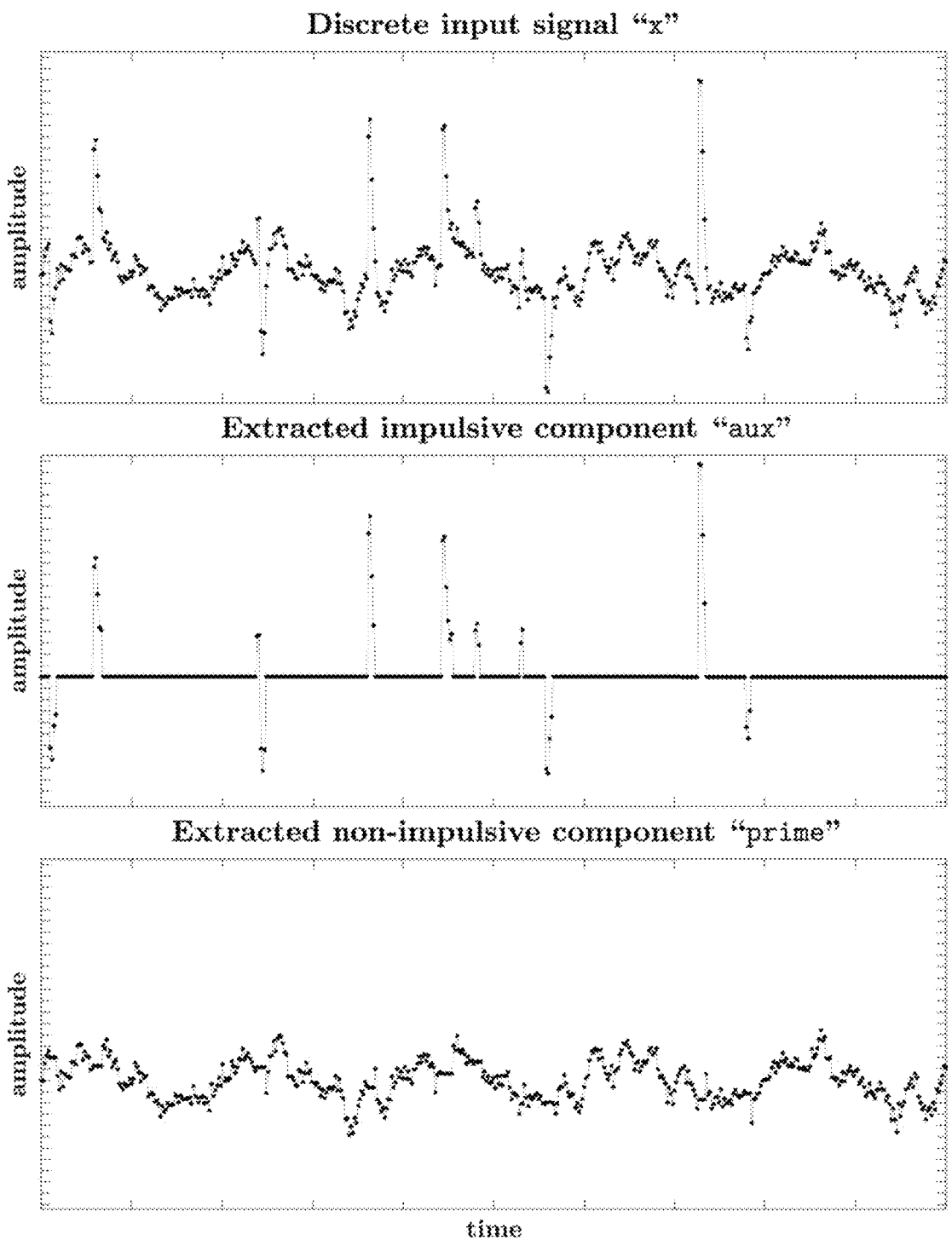
FIG. 15. Illustration of separation of discrete input signal "x" into impulsive component "aux" and non-impulsive ("background") component. "prime" using the MATLAB function of § 2.5 with appropriately chosen blanking values "alpha_p" and "alpha_m".

FIG. 15 provides an illustration of separation of a discrete input signal "x" into an impulsive component "aux" and a non-impulsive ("background") component "prime" using the above MATLAB function with appropriately chosen blanking values "alpha_p" and "alpha_m".

A digital signal processing apparatus performing an ABAINF filtering function transforming an input signal into an output filtered signal would comprise an influence function characterized by a transparency range and operable to receive an influence function input and to produce an influence function output, and an integrator function characterized by an integration time constant and operable to receive an integrator input and to produce an integrator output, wherein said integrator output is proportional to a numerical antiderivative of said integrator input.

A hardware implementation of a digital ABAINF/CMTF/ADiC filtering function may be achieved by various means including, but not limited to, general-purpose and specialized microprocessors (DSPs), microcontrollers, FPGAs, ASICs, and ASSPs. A digital or a mixed-signal processing unit performing such a filtering function may also perform a variety of other similar and/or different functions.

3 Quantile Tracking Filters as Robust Means to Establish the ABAINF Transparency Range(s)

Let y(t) be a quasi-stationary bandpass (zero-mean) signal with a finite interquartile range (IQR), characterised by an average crossing rate $\langle f \rangle$ of the threshold equal to some quantile q, 0<q<1, of y(t). (See [33, 34] for discussion of quantiles of continuous signals, and [44, 45] for discussion of threshold crossing rates.) Let us further consider the signal $Q_q(t)$ related to y(t) by the following differential equation:

$$\frac{d}{dt}Q_q = \frac{A}{T}\ [sgn(y - Q_q) + 2q - 1], \qquad (17)$$

where A is a constant (with the same units as y and $Q_q$), and T is a constant with the units of time. According to equation (17), $Q_q(t)$ is a piecewise-linear signal consisting of alternating segments with positive (2qA/T) and negative (2(q−1)A/T) slopes. Note that $Q_q(t) \approx$ const for a sufficiently small A/T (e.g., much smaller than the product of the IQR and the average crossing rate $\langle f \rangle$ of y(t) and its qth quantile), and a steady-state solution of equation (17) can be written implicitly as $$\overline{\theta(Q_q-y)} \approx q, \qquad (18)$$

where θ(x) is the Heaviside unit step function [30] and the overline denotes averaging over some time interval $\Delta T \gg \langle f \rangle$. Thus $Q_q$ would approximate the qth quantile of y(t) [33, 34] in the time interval ΔT.

We may call an apparatus (e.g. an electronic circuit) effectively implementing equation (17) a Quantile Tracking Filler.

Despite its simplicity, a circuit implementing equation (17) may provide robust means to establish the ABAINF transparency range(s) as a linear combination of various quantiles of the difference signal (e.g. its 1st and 3rd quartiles and/or the median). We will call such a circuit for q=½ a Median Tracking Filter (MTF), and for q=¼ and/or q=¾ a Quartile Tracking Filter (QTF).

Figure 16:
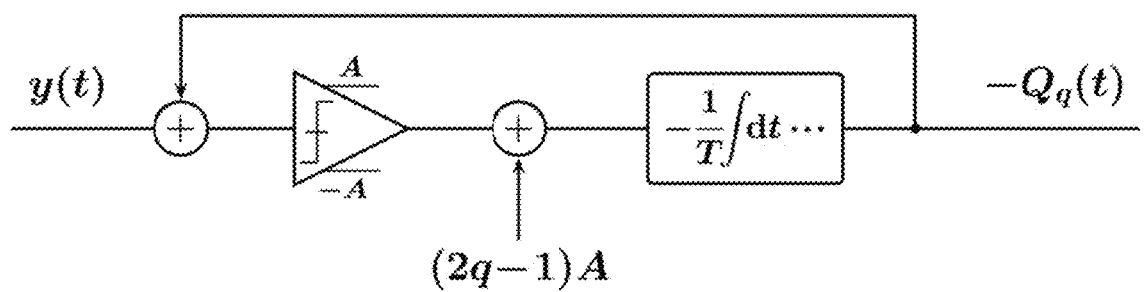
FIG. 16. Illustrative block diagram of a circuit implementing equation (17) and thus tracking a qth quantile of y(t).

FIG. 16 provides an illustrative block diagram of a circuit implementing equation (17) and thus tracking a qth quantile of y(t). As one may see in the figure, the difference between the input y(t) and the quantile output $Q_q(t)$ forms the input to an analog comparator which implements the function A sgn(y(t)−$Q_q$(t)). In reference to FIG. 16, we may call the term (2q−1) A added to the integrator input as the "quantile setting signal". A sum of the comparator output and the quantile setting signal forms the input of an integrator characterized by the time constant T, and the output of the integrator forms the quantile output $Q_q(t)$.

3.1 Median Tracking Filter

Figure 17:
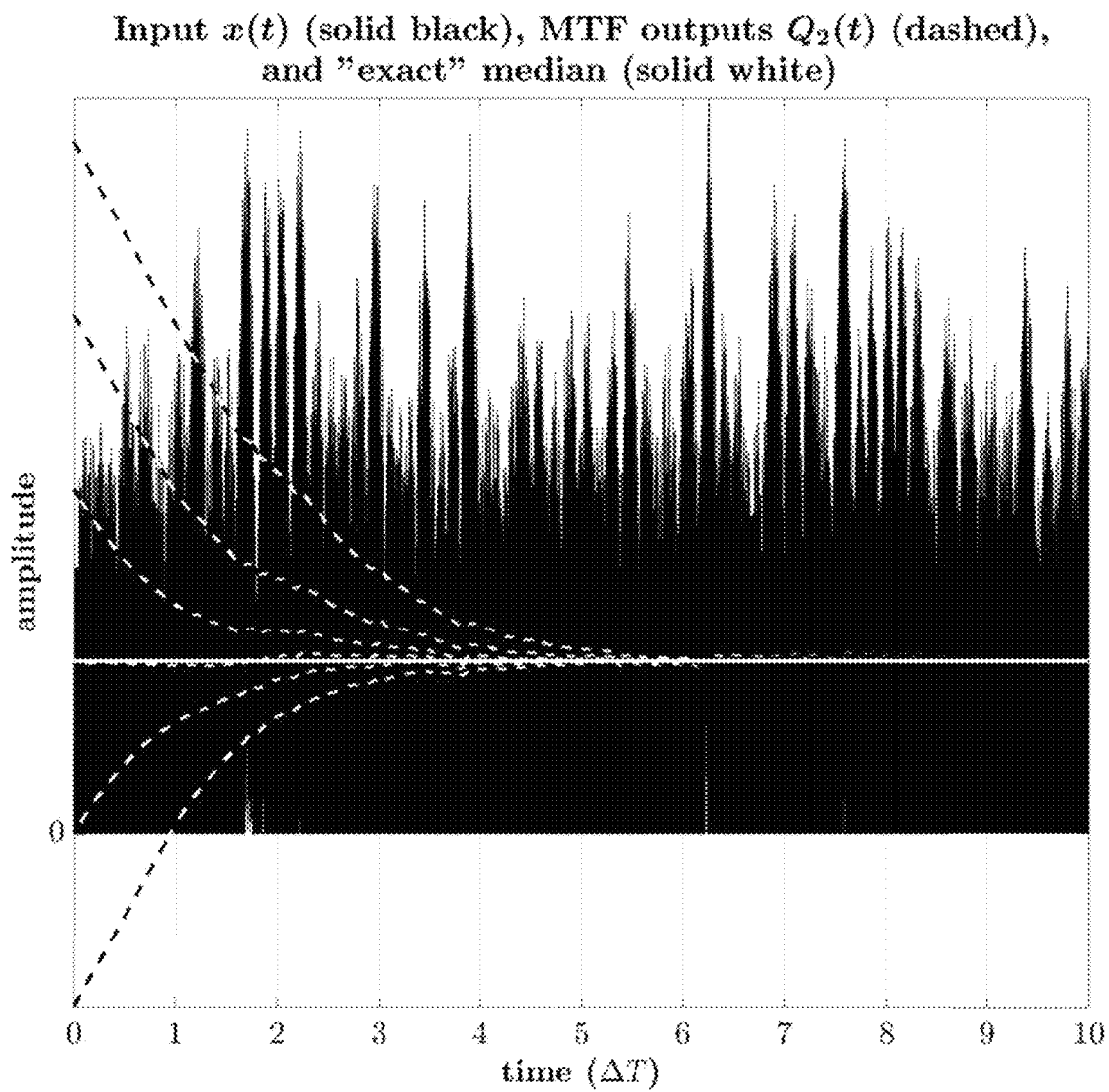
FIG. 17. Illustration of MTF convergence to steady state for different initial conditions.

Let x(t) be a quasi-stationary signal characterized by an average crossing rate $\langle f \rangle$ of the threshold equal to the second quartile (median) of x(t). Let us further consider the signal $Q_2(t)$ related to x(t) by the following differential equation:

$$\frac{d}{dt}Q_2 = \frac{A}{T}sgn(x - Q_2), \quad (19)$$

where A is a constant with the same units as x and $Q_2$, and T is a constant with the units of time. According to equation (19), $Q_2(t)$ is a piecewise-linear signal consisting of alternating segments with positive (A/T) and negative (–A/T) slopes. Note that $Q_2(t) \approx$ const for a sufficiently small A/T (e.g., much smaller than the product of the interquartile range and the average crossing rate $\langle f \rangle$ of x(t) and its second quartile), and a steady-state solution of equation (19) may be written implicitly as $$\overline{\theta(Q_2 - x)} \approx \frac{1}{2}, \quad (20)$$

where the overline denotes averaging over some time interval $\Delta T \gg \langle f \rangle^{-1}$. Thus $Q_2$ approximates the second quartile of x(t) in the time interval $\Delta T$, and equation (19) describes a Median Tracking Filter (MTF). FIG. 17 illustrates the MTF's convergence to the steady state for different initial conditions.

3.2 Quartile Tracking Filters

Let y(t) be a quasi-stationary bandpass (zero-mean) signal with a finite interquartile range (IQR), characterised by an average crossing rate <f> of the threshold equal to the third quartile of y(t). Let us further consider the signal $Q_3(t)$ related to y(t) by the following differential equation:

$$\frac{d}{dt}Q_3 = \frac{A}{T}\left[sgn(y - Q_3) + \frac{1}{2}\right], \quad (21)$$

where A is a constant (with the same units as y and $Q_3$), and T is a constant with the units of time. According to equation (21), $Q_3(t)$ is a piecewise-linear signal consisting of alternating segments with positive (3A/(2T)) and negative (–A/(2T)) slopes. Note that $Q_3(t) \approx$ const for a sufficiently small A/T (e.g., much smaller than the product of the IQR and the average crossing rate <f> of y(t) and its third quartile), and a steady-state solution of equation (21) may be written implicitly as $$\overline{\theta(Q_3 - y)} \approx \frac{3}{4}, \quad (22)$$

where the overline denotes averaging over some time interval $\Delta T \gg \langle f \rangle^{-1}$. Thus $Q_3$ approximates the third quartile of y(t) [33, 34] in the time interval $\Delta T$.

Similarly, for $$\frac{d}{dt}Q_1 = \frac{A}{T}\left[sgn(y - Q_1) - \frac{1}{2}\right] \quad (23)$$

a steady-state solution may be written as $$\overline{\theta(Q_1 - y)} \approx \frac{1}{4}, \quad (24)$$

and thus $Q_1$ would approximate the first quartile of y(t) in the time interval $\Delta T$.

FIG. 18 illustrates the QTFs' convergence to the steady state for different initial conditions.

One skilled in the art will recognize that (1) similar tracking filters may be constructed for other quantiles (such as, for example, terciles, quintiles, sextiles, and so on), and (2) a robust range $[\alpha_-, \alpha_+]$ that excludes outliers may be constructed in various ways, as, for example, a linear combination of various quantiles.

3.3 Numerical Implementations of ABAINFs/CMTFs/ADiCs Using Quantile Tracking Filters as Robust Means to Establish the Transparency Range For example, an ABAINF/CMTF/ADiC with an adaptive (possibly asymmetric) transparency range $[\alpha_-, \alpha_+]$ may be designed as follows. To ensure that the values of the difference signal $x(t) - \chi(t)$ that lie outside of $[\alpha_-, \alpha_+]$ are outliers, one may identify $[\alpha_-, \alpha_+]$ with Tukey's range [46], a linear combination of the 1st ($Q_1$) and the 3rd ($Q_3$) quartiles of the difference signal:

$$[\alpha_-, \alpha_+] = [Q_1 - \beta(Q_3 - Q_1), Q_3 + \beta(Q_3 - Q_1)]. \quad (25)$$

where $\beta$ is a coefficient of order unity (e.g. $\beta$=1.5).

An example of a numerical algorithm implementing a finite-difference version of a CMTF/ADiC with the blanking range computed as Tukey's range of the difference signal using digital QTFs may be given by the MATLAB function "CMTF_ADiC_alpha" below.

In this example, the CMTF/ADiC filtering function further comprises a means of tracking the range of the difference signal that effectively excludes outliers of the difference signal, and wherein said means comprises a QTF estimating a quartile of the difference signal:

```
function [chi,prime,aux,alpha_p,alpha_m] =
  CMTF_ADiC_alpha(x,t,tau,beta,mu)
    chi = zeros(size(x));
    aux = zeros(size(x));
    prime = zeros(size(x));
    alpha_p = zeros(size(x));
    alpha_m = zeros(size(x));
    dt = diff(t);
    chi(1) = x(1);
    Q1 = x(1);
    Q3 = x(1);
    B = 0;
    for i = 2:length(x);
        dX = x(i) - chi(i-1);
        %----------------------------------------------------------
        % Update 1st and 3rd quartile values:
        Q1 = Q1 + mu*(sign(dX-Q1)-0.5)*dt(i-1); % numerical
          antiderivative
        Q3 = Q3 + mu*(sign(dX-Q3)+0.5)*dt(i-1); % numerical
```

-continued

```
            antiderivative
%-----------------------------------------------------------------
    % Calculate blanking range:
        alpha_p(i) = Q3 + beta*(Q3-Q1);
        alpha_m(i) = Q1 - beta*(Q3-Q1);
%-----------------------------------------------------------------
        if dX>alpha_p(i)
            B = 0;
        elseif dX<alpha_m(i)
            B = 0;
        else
            B = dX;
        end
        chi(i) = chi(i-1) + B/(tau+dt(i-1))*dt(i-1); % numerical
            antiderivative
        prime(i) = B + chi(i-1);
        aux(i) = dX - B;
    end
return
```

Figure 19:
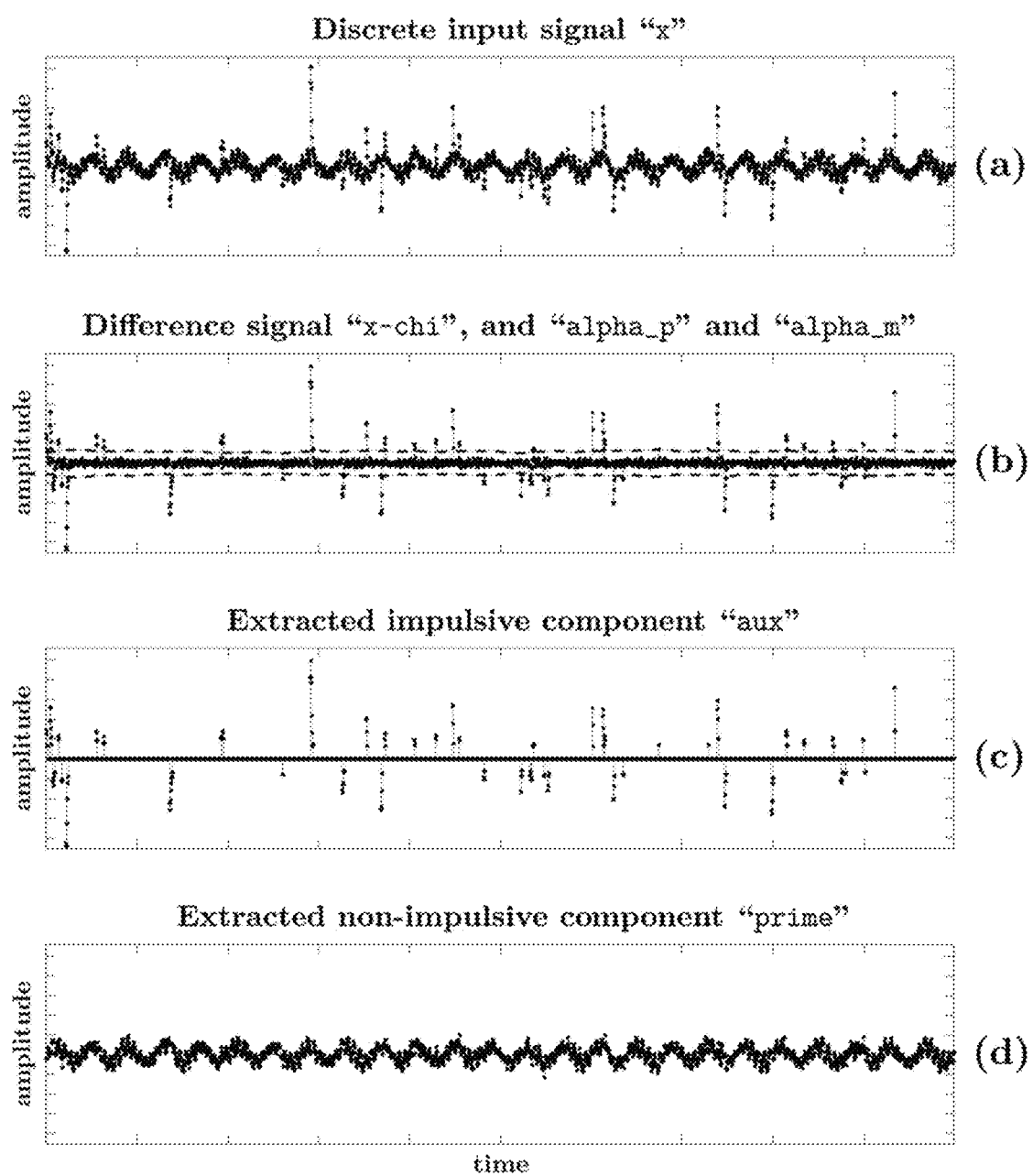
FIG. 19. Illustration of separation of discrete input signal "x" into impulsive component "aux" and non-impulsive ("background") component "prime" using the MATLAB function of § 3.3 with the blanking range computed as Tukey's range using digital QTFs.

FIG. 19 provides an illustration of separation of discrete input signal "x" into impulsive component "aux" and non-impulsive ("background") component "prime" using the above MATLAB function of § 3.3 with the blanking range computed as Tukey's range using digital QTFs. The upper and lower limits of the blanking range are shown by the dashed lines in panel (b).

3.4 Adaptive Influence Function Design

The influence function choice determines the structure of the local nonlinearity imposed on the input signal. If the distribution of the non-Gaussian technogenic noise is known, then one may invoke the classic locally most powerful (LMP) test [47] to detect and mitigate the noise. The LMP test involves the use of local nonlinearity whose optimal choice corresponds to $$g_{l_o}(n) = -\frac{f'(n)}{f(n)},$$

where $f(n)$ represents the technogenic noise density function and $f'(n)$ is its derivative. While the LMP test and the local nonlinearity is typically applied in the discrete time domain, the present invention enables the use of this idea to guide the design of influence functions in the analog domain. Additionally, non-stationarity in the noise distribution may motivate an online adaptive strategy to design influence functions.

Such adaptive online influence function design strategy may explore the methodology disclosed herein. In order to estimate the influence function, one may need to estimate both the density and its derivative of the noise. Since the difference signal $x(t)-\chi(t)$ of an ABAINF would effectively represent the non-Gaussian noise affecting the signal of interest, one may use a bank of N quantile tracking filters described in § 3 to determine the sample quantiles ($Q_1$, $Q_2$, ..., $Q_N$) of the difference signal. Then one may use a non-parametric regression technique such as, for example, a local polynomial kernel regression strategy to simultaneously estimate (1) the time-dependent amplitude distribution function $\Phi(D, t)$ of the difference signal, (2) its density function $\phi(D, t)$, and (3) the derivative of the density function $\partial\phi(D, t)/\partial D$.

4 Adaptive Intermittently Nonlinear Analog Filters for Mitigation of Outlier Noise in the Process of Analog-to-Digital Conversion Let us now illustrate analog-domain mitigation of outlier noise in the process of analog-to-digital (A/D) conversion that may be performed by deploying an ABAINF (for example, a CMTF) ahead of an ADC.

Figure 20:
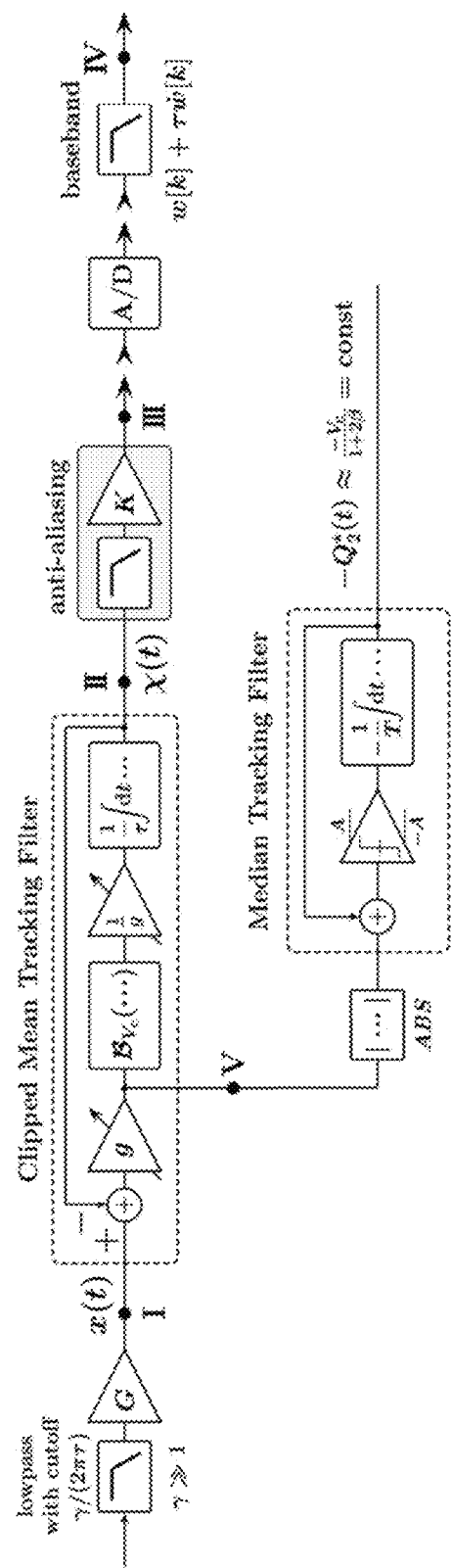
FIG. 20. Illustrative block diagram of an adaptive intermittently nonlinear filter for mitigation of outlier noise in the process of analog-to-digital conversion.

An illustrative principal block diagram of an adaptive CMTF for mitigation of outlier noise disclosed herein is shown in FIG. 20. Without loss of generality, here it may be assumed that the output ranges of the active components (e.g. the active filters, integrators, and comparators), as well as the input range of the analog-to-digital converter (A/D), are limited to a certain finite range, e.g., to the power supply range $\pm V_c$.

The time constant $\tau$ may be such that $1/(2\pi\tau)$ is similar to the corner frequency of the anti-aliasing filter (e.g., approximately twice the bandwidth of the signal of interest $B_x$), and the time constant T should be two to three orders of magnitude larger than $B_x^{-1}$. The purpose of the front-end lowpass filter would be to sufficiently limit the input noise power. However, its bandwidth may remain sufficiently wide (i.e. $\gamma \gg 1$) so that the impulsive noise is not excessively broadened.

Without loss of generality, we may further assume that the gain K is constant (and is largely determined by the value of the parameter $\gamma$, e.g., as $K \sim \sqrt{\gamma}$), and the gains G and g are adjusted (e.g. using automatic gain control) in order to well utilize the available output ranges of the active components, and the input range of the A/D. For example, G and g may be chosen to ensure that the average absolute value of the output signal (i.e., observed at point IV) is approximately $V_c/5$, and the average value of $Q_2^*(t)$ is approximately constant and is smaller than $V_c$.

4.1 CMTF Block

For the Clipped Mean Tracking Filter (CMTF) block shown in FIG. 20, the input $x(t)$ and the output $\chi(t)$ signals may be related by the following 1st order nonlinear differential equation:

$$\frac{d}{dt}\chi = \frac{1}{\tau}\mathcal{B}_{\frac{V_c}{g}}(x-\chi), \quad (26)$$

where the symmetrical blanking function $\beta_\alpha(x)$ may be defined as $$\mathcal{B}_\alpha(x) = \begin{cases} x & \text{for } |x| \le \alpha \\ 0 & \text{otherwise} \end{cases}, \quad (27)$$

and where the parameter $\alpha$ is the blanking value.

Figure 21:
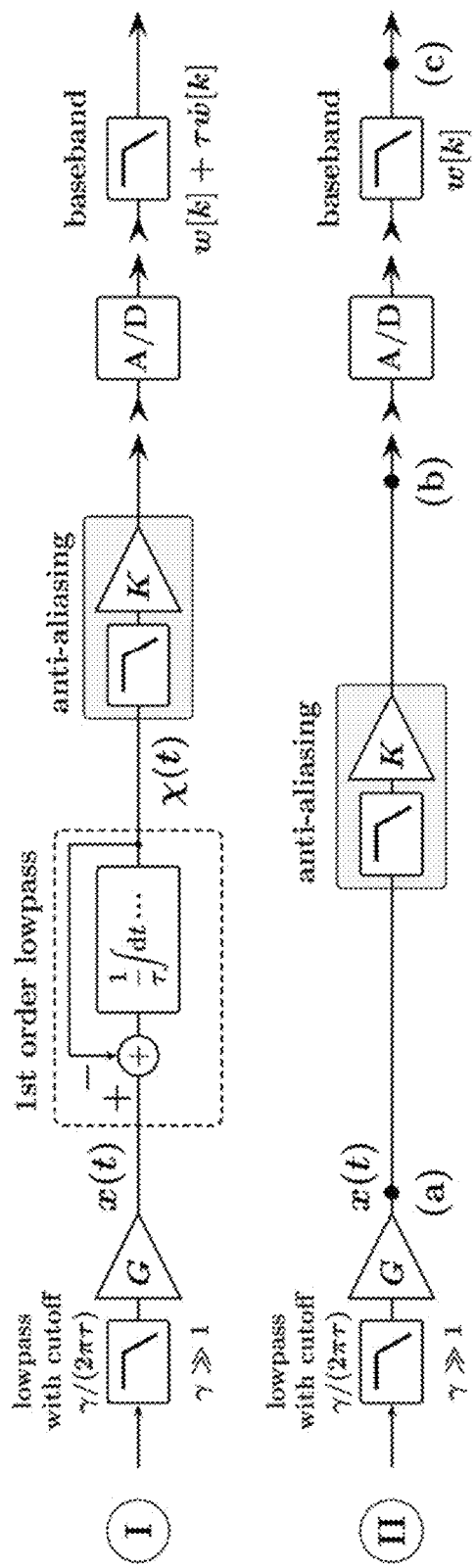
FIG. 21. Equivalent block diagram for the filter shown in FIG. 20 operating in linear regime.

Note that for the blanking values such that $|x(t)-\chi(t)| \le V_c/g$ for all t, equation (26) describes a 1st order linear lowpass filter with the corner frequency $1/(2\pi\tau)$, and the filter shown in FIG. 20 operates in a linear regime (see FIG. 21). However, when the values of the difference signal $x(t)-\chi(t)$ are outside of the interval $[-V_c/g, V_c/g]$, the rate of change of $\chi(t)$ is zero and no longer depends on the magnitude of $x(t)-\chi(t)$. Thus, if the values of the difference signal that lie outside of the interval $[-V_c/g, V_c/g]$ are outliers, the output, $\chi(t)$ would be insensitive to further increase in the amplitude of such outliers. FIG. 6 illustrates resistance of a CMTF to outlier noise, in comparison with a 1st order linear lowpass filter with the same time constant. The shaded time intervals correspond to nonlinear CMTF behavior (zero rate of change). Note that the clipping (i.e. zero rate of change of the CMTF output) is performed differentially, based on the magnitude of the difference signal $|x-\chi|$ and not that of the input signal x.

In the filter shown in FIG. 20 the range $[-V_c/g, V_c/g]$ that excludes outliers is obtained as Tukey's range [46] for a symmetrical distribution, with $V_c/g$ given by $$\frac{VB_c}{g} = (1 + 2\beta)Q_2^*, \quad (28)$$

where $Q_2^*$ is the 2nd quartile (median) of the absolute value of the difference signal $|x(t)-\chi(t)|$, and where $\beta$ is a coefficient of order unity (e.g. $\beta=3$). While in this example we use Tukey's range, various alternative approaches to establishing a robust interval $[-V_c/g, V_c/g]$ may be employed.

In FIG. 20, the MTF circuit receiving the absolute value of the blanker input and producing the MTF output, together with a means to maintain said MTF output at approximately constant value (e.g. using automatic gain control) and the gain stages preceding and following the blanker, establish a blanking range that effectively excludes outliers of the blanker input.

It would be important to note that, as illustrated in panel I of FIG. 21, in the linear regime the CMTF would operate as a 1st order linear lowpass filter with the corner frequency $1/(2\pi\tau)$. It would exhibit nonlinear behavior only intermittently, in response to outliers in the difference signal, thus avoiding the detrimental effects, such as instabilities and intermodulation distortions, often associated with nonlinear filtering.

4.2 Baseband Filter

In the absence of the CMTF in the signal processing chain, the baseband filter following the A/D would have the impulse response w[k] that may be viewed as a digitally sampled continuous-time impulse response w(t) (see panel II of FIG. 21). As one may see in FIG. 20, the impulse response of this filter may be modified by adding the term $\tau\dot{w}[k]$, where the dot over the variable denotes its time derivative, and where $\dot{w}[k]$ may be viewed as a digitally sampled continuous-time function $\dot{w}(t)$. This added term would compensate for the insertion of a 1st order linear lowpass filter in the signal chain, as illustrated in FIG. 21.

Figure 22:
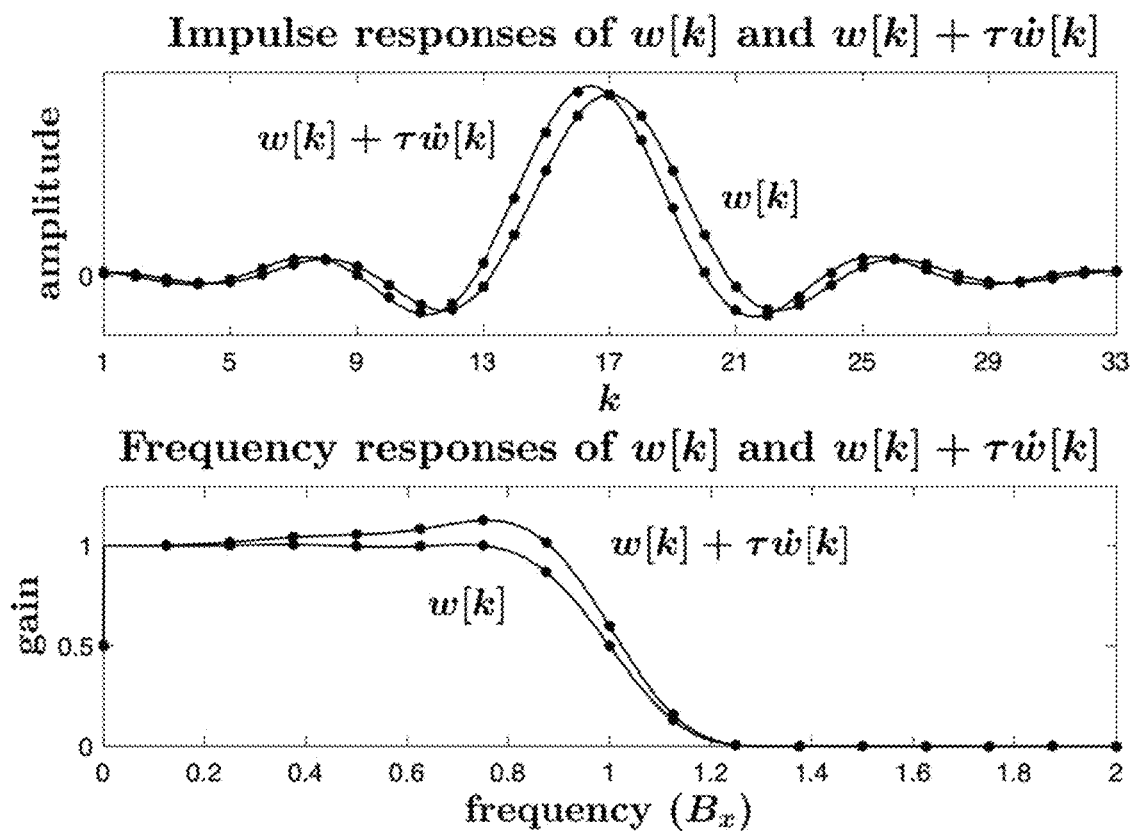
FIG. 22. Impulse and frequency responses of w[k] and w[k]+τw̄[k] used in the subsequent examples.

Indeed, from the differential equation for a 1st order lowpass filter it would follow that $h_\tau * (w+\tau\dot{w}) = w$, where the asterisk denotes convolution and where $h_\tau(t)$ is the impulse response of the 1st order linear lowpass filter with the corner frequency $1/(2\pi\tau)$. Thus, provided that $\tau$ is sufficiently small (e.g., $T \lesssim 1/(2\pi B_{aa})$, where $B_{aa}$ is the nominal bandwidth of the anti-aliasing filter), the signal chains shown in panels I and II of FIG. 21 would be effectively equivalent. The impulse and frequency responses of w[k] (a root-raised-cosine filter with the roll-off factor ¼, bandwidth $5B_x/4$, and the sampling rate $8B_x$) and $w[k]+\tau\dot{w}[k]$ (with $\tau=1/(4\pi B_x)$) used in the subsequent examples of this section are shown in FIG. 22.

4.3 Comparative Performance Examples

4.3.1 Simulation Parameters

To emulate the analog signals in the simulated examples presented below, the digitisation rate was chosen to be significantly higher (by about two orders of magnitude) than the A/D sampling rate.

The signal of interest is a Gaussian baseband signal in the nominal frequency rage $[0, B_x]$. It is generated as a broadband white Gaussian noise filtered with a root-raised-cosine filter with the roll-off factor ¼ and the bandwidth $5B_x/4$.

The noise affecting the signal of interest is a sum of an Additive White Gaussian Noise (AWGN) background component and white impulsive noise i(t). In order to demonstrate the applicability of the proposed approach to establishing a robust interval $[-V_c/g, V_c/g]$ for asymmetrical distributions, the impulsive noise is modelled as asymmetrical (unipolar) Poisson shot noise:

$$i(t) = |v(t)| \sum_{k=1}^{\infty} \delta(t - t_k), \quad (29)$$

where v(t) is AWGN noise, $t_k$ is the k-th arrival time of a Poisson point process with the rate parameter $\lambda$, and $\delta(x)$ is the Dirac $\delta$-function [31]. In the examples below, $\lambda=2B_x$.

The A/D sampling rate is $8B_x$ (that assumes a factor of 4 oversampling of the signal of interest), the A/D resolution is 12 bits, and the anti-aliasing filter is a 2nd order Butterworth lowpass filter with the corner frequency $2B_x$. Further, the range of the comparators in the QTFs is $\pm A = \pm V_c$, the time constants of the integrators are $7=1/(4\pi B_x)$ and $T=100/B_x$. The impulse responses of the baseband filters w[k] and $w[k]+\tau\dot{w}[k]$ are shown in the upper panel of FIG. 22.

The front-end lowpass filter is a 2nd order Bessel with the cutoff frequency $\gamma/(2\pi\tau)$. The value of the parameter $\gamma$ is chosen as $\gamma=16$, and the gain of the anti-aliasing filter is $K=\sqrt{\gamma}=4$. The gains G and g are chosen to ensure that the average absolute value of the output signal (i.e., observed at point IV in FIG. 20 and at point (c) in FIG. 21) is approximately $V_c/5$, and $$Q_2^*(t) \approx \frac{V_c}{1+2\beta} = \text{const.}$$

4.3.2 Comparative Channel Capacities

For the simulation parameters described above, FIG. 23 compares the simulated channel capacities (calculated from the baseband SNRs using the Shannon formula [42]) for various signal+noise compositions, for the linear signal processing chain shown in panel II of FIG. 21 (solid curves) and the CMTF-based chain of FIG. 20 with $\beta=3$ (dotted curves).

Figure 23:
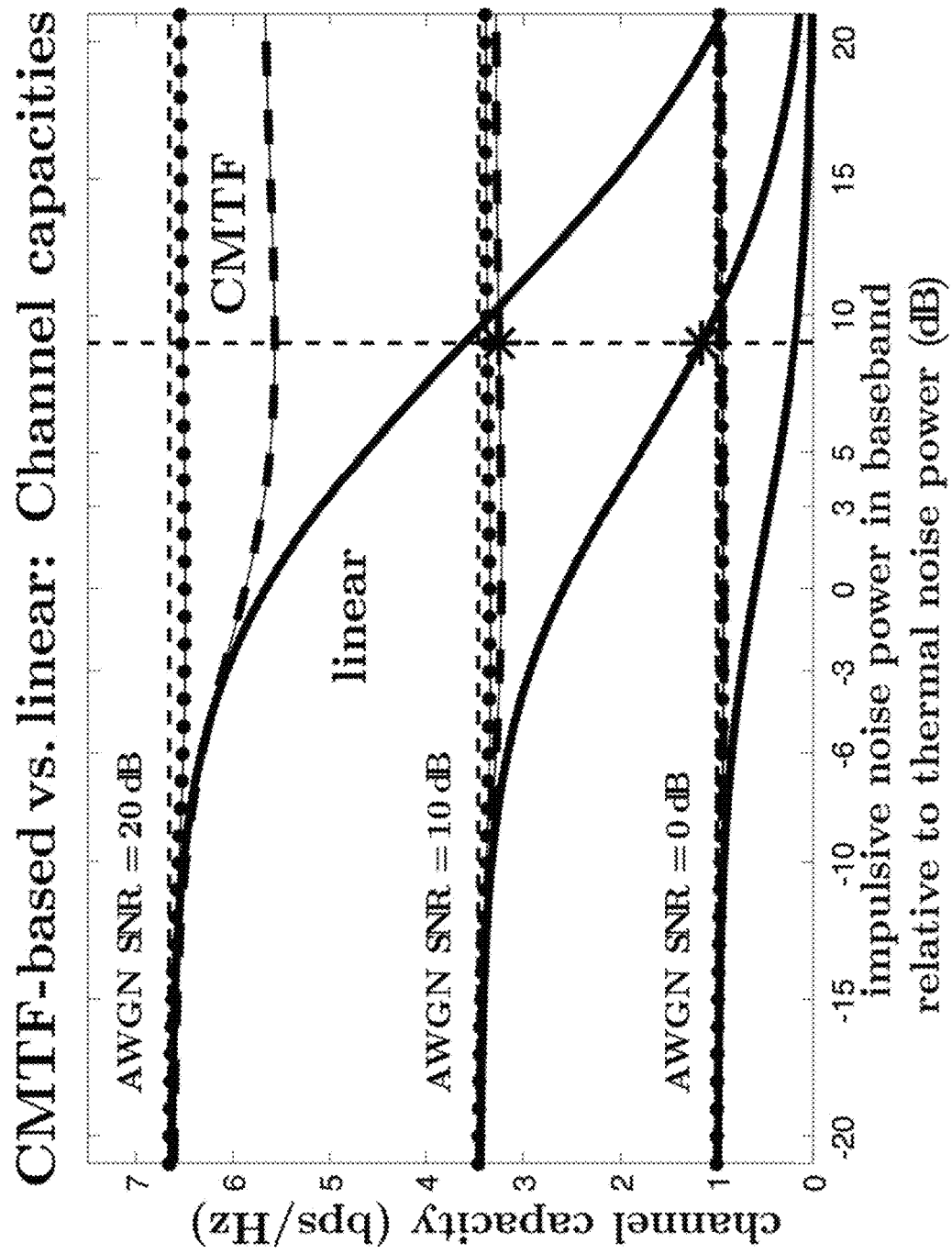
FIG. 23. Comparison of simulated channel capacities for the linear processing chain (solid curves) and the CMTF-based chains with β=3 (dotted and dashed curves). The dashed curves correspond to channel capacities for the CMTF-based chain with added interference in an adjacent channel. The asterisks correspond to the noise and adjacent channel interference conditions used in FIG. 24.

As one may see in FIG. 23 (and compare with the simplified diagram of FIG. 2), for a sufficiently large $\beta$ both linear and the CMTF-based chains provide effectively equivalent performance when the AWGN dominates over the impulsive noise. However, the CMTF-based chains are insensitive to further increase in the impulsive noise when the latter becomes comparable or dominates over the thermal (Gaussian) noise, thus providing resistance to impulsive interference.

Further, the dashed curves in FIG. 23 show the simulated channel capacities for the CMTF-based chain of FIG. 20 (with β=3) when additional interference in an adjacent channel is added, as would be a reasonably common practical scenario. The passband of this interference is approximately $[3B_x, 4B_x]$, and the total power is approximately 4 times (6 dB) larger that that of the signal of interest. As one may see in FIG. 23, such interference increases the apparent blanking value needed to maintain effectively linear CMTF behaviour in the absence of the outliers, reducing the effectiveness of the impulsive noise suppression (more noticeably for higher AWGN SNRs).

It may be instructive to illustrate and compare the changes in the signal's time and frequency domain properties, and in its amplitude distributions, while it propagates through the signal processing chains, linear (points (a), (b), and (c) in panel II of FIG. 21), and the CMTF-based (points I through IV, and point V, in FIG. 20). Such an illustration is provided in FIG. 24. In the figure, the dashed lines (and the respective cross-hatched areas) correspond to the "ideal" signal of interest (without noise and adjacent channel interference), and the solid lines correspond to the signal+noise+interference mixtures. The leftmost panels show the time domain traces, the rightmost panels show the power spectral densities (PSDs), and the middle panels show the amplitude densities. The baseband power of the AWGN is one tenth of that of the signal of interest (10 dB AWGN SNR), and the baseband power of the impulsive noise is approximately 8 times (9 dB) that of the AWGN. The value of the parameter β for Tukey's range is β=3. (These noise and adjacent channel interference conditions, and the value β=3, correspond to the respective channel capacities marked by the asterisks in FIG. 23).

Measure of Peakedness—

In the panels showing the amplitude densities, the peakedness of the signal+noise mixtures is measured and indicated in units of "decibels relative to Gaussian" (dBG). This measure is based on the classical definition of kurtosis [48], and for a real-valued signal may be expressed in terms of its kurtosis in relation to the kurtosis of the Gaussian (aka normal) distribution as follows [9, 10]:

$$K_{dBG}(x) = 10 lg\left[\frac{\langle(x-\langle x\rangle)^4\rangle}{3\langle(x-\langle x\rangle)^2\rangle^2}\right], \quad (30)$$

where the angular brackets denote the time averaging. According to this definition, a Gaussian distribution would have zero dBG peakedness, while sub-Gaussian and super-Gaussian distributions would have negative and positive dBG peakedness, respectively. In terms of the amplitude distribution of a signal, a higher peakedness compared to a Gaussian distribution (super-Gaussian) normally translates into "heavier tails" than those of a Gaussian distribution. In the time domain, high peakedness implies more frequent occurrence of outliers, that is, an impulsive signal.

Incoming Signal—

Figure 24:
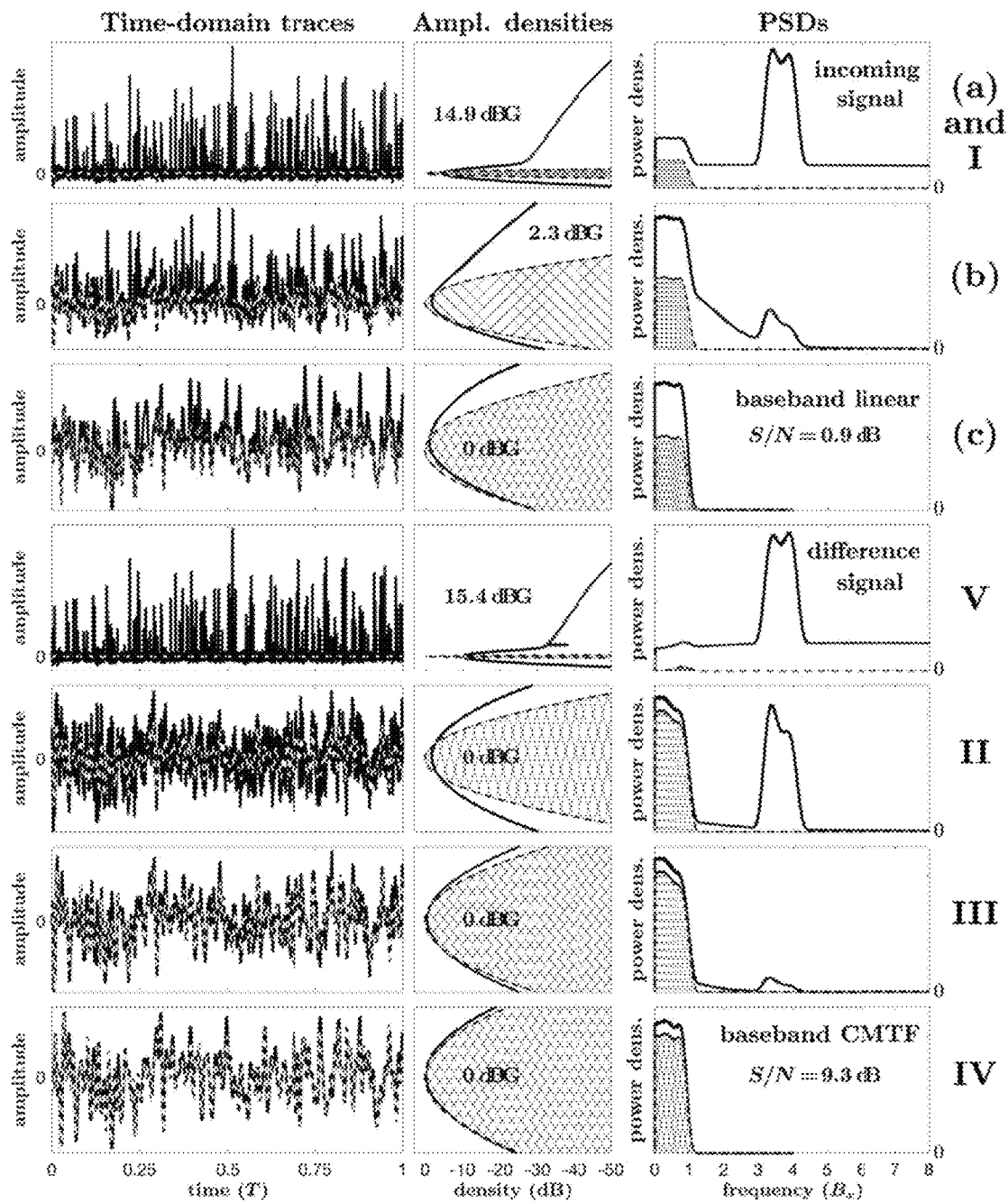
FIG. 24. Illustration of changes in the signal time- and frequency domain properties, and in its amplitude distributions, while it propagates through the signal processing chains, linear (points (a), (b), and (c) in panel II of FIG. 21), and the CMTF-based (points I through IV, and point V, in FIG. 20).

As one may see in the upper row of panels in FIG. 24, the incoming impulsive noise dominates over the AWGN. The peakedness of the signal+noise mixture is high (14.9 dBG), and its amplitude distribution has a heavy "tail" at positive amplitudes.

Linear Chain—

The anti-aliasing filter in the linear chain (row (b)) suppresses the high-frequency content of the noise, reducing the peakedness to 2.3 dBG. The matching filter in the baseband (row (c)) further limits the noise frequencies to within the baseband, reducing the peakedness to 0 dBG. Thus the observed baseband noise may be considered to be effectively Gaussian, and we may use the Shannon formula [42] based on the achieved baseband SNR (0.9 dB) to calculate the channel capacity. This is marked by the asterisk on the respective solid curve in FIG. 23. (Note that the achieved 0.9 dB baseband SNR is slightly larger than the "ideal" 0.5 dB SNR that would have been observed without "clipping" the outliers of the output of the anti-aliasing filter by the A/D at $\pm V_c$.)

CMTF-Based Chain—

As one may see in the panels of row V, the difference signal largely reflects the temporal and the amplitude structures of the noise and the adjacent channel signal. Thus its output may be used to obtain the range for identifying the noise outliers (i.e. the blanking value $V_c/g$). Note that a slight increase in the peakedness (from 14.9 dBG to 15.4 dBG) is mainly due to decreasing the contribution of the Gaussian signal of interest, as follows from the linearity property of kurtosis.

As may be seen in the panels of row II, since the CMTF disproportionately affects signals with different temporal and/or amplitude structures, it reduces the spectral density of the impulsive interference in the signal passband without significantly affecting the signal of interest. The impulsive noise is notably decreased, while the amplitude distribution of the filtered signal+noise mixture becomes effectively Gaussian.

The anti-aliasing (row III) and the baseband (row IV) filters further reduce the remaining noise to within the baseband, while the modified baseband filter also compensates for the insertion of the CMTF in the signal chain. This results in the 9.3 dB baseband SNR, leading to the channel capacity marked by the asterisk on the respective dashed-line curve in FIG. 23.

4.4 Alternative Topology for Signal Processing Chain Shown in FIG. 20

Figure 25:
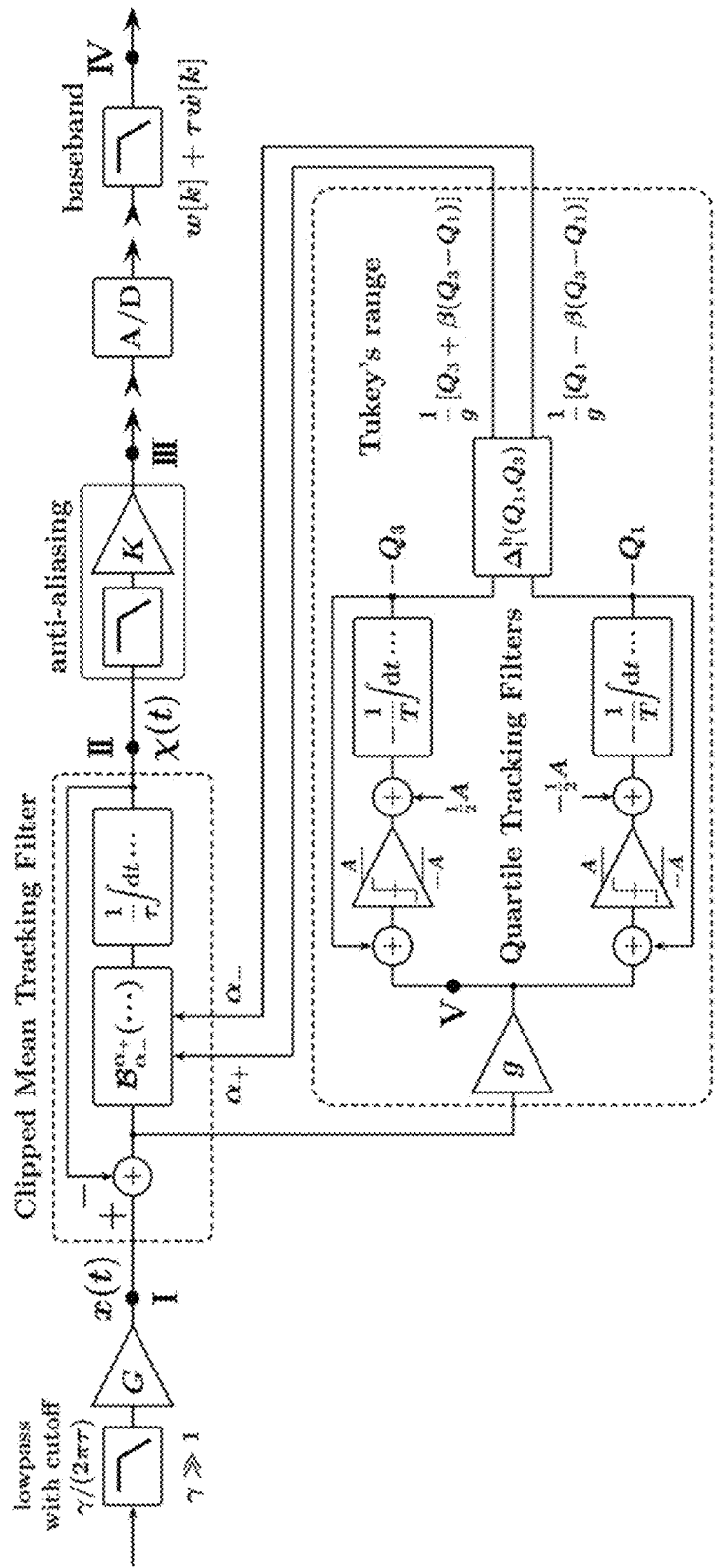
FIG. 25. Alternative topology for signal processing chain shown in FIG. 20.

FIG. 25 provides an illustration of an alternative topology for signal processing chain shown in FIG. 20, where the blanking range is determined according to equation (36).

One skilled in the art will recognize that the topology shown in FIG. 20 and the topology shown in FIG. 25 both comprise a CMTF filter (transforming an input signal x(t) into an output signal χ(t)) characterized by a blanking range, and a robust means to establish said blanking range in such a way that it excludes the outliers in the difference signal x(t)−χ(t).

In FIG. 25, two QTFs receive a signal proportional to the blanker input and produce two QTF outputs, corresponding to the 1st and the 3rd quartiles of the QTF input. Then the blanking range of the blanker is established as a linear combination of these two outputs.

5 ΔΣ ADC with CMTF-Based Loop Filter

While § 4 discloses mitigation of outlier noise in the process of analog-to-digital conversion by ADiCs/CMTFs deployed ahead of an ADC, CMTF-based outlier noise filtering of the analog input signal may also be incorporated into loop filters of ΔΣ analog-to-digital converters.

Figure 26:
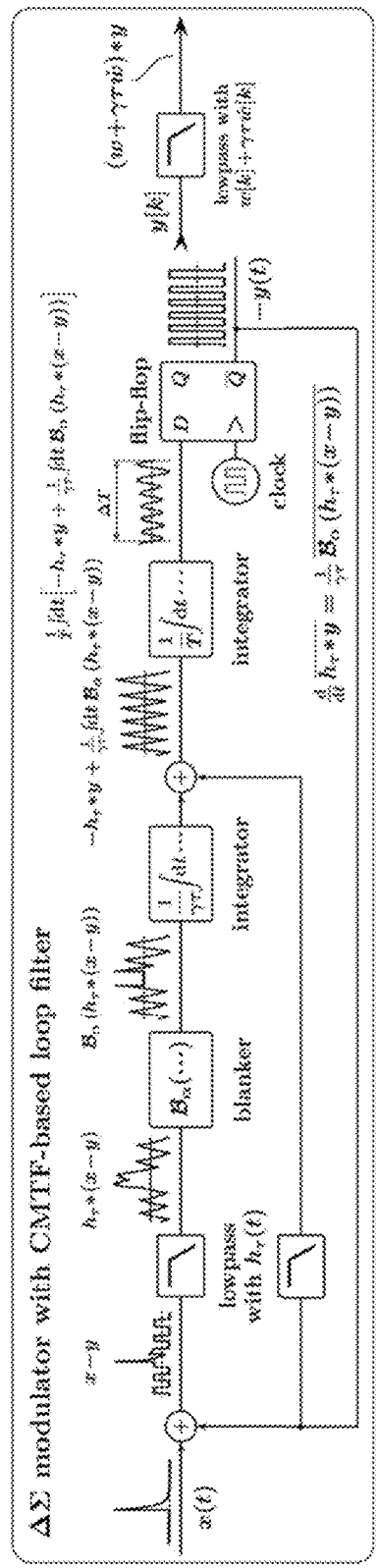
FIG. 26. ΔΣ ADC with an CMTF-based loop filter.

Let us consider the modifications to a 2nd-order ΔΣ ADC depicted in FIG. 26. (Note that the vertical scales of the shown fragments of the signal traces vary for different fragments.) We may assume from here on that the 1st order lowpass filters with the time constant τ and the impulse response $h_\tau(t)$ shown in the figure have a bandwidth (as signified by the 3 dB corner frequency) that is much larger than the bandwidth of the signal of interest $B_x$, yet much smaller than the sampling (clock) frequency $F_s$. For example, the bandwidth of $h_\tau(t)$ may be approximately equal to the geometric mean of $B_x$ and $F_s$, resulting in the following value for τ:

$$\tau \approx \frac{1}{2\pi\sqrt{B_x F_s}}. \quad (31)$$

As one may see in FIG. 26, the first integrator (with the time constant γτ) is preceded by a (symmetrical) blanker, where the (symmetrical) blanking function $B_\alpha(x)$ may be defined as $$\mathcal{B}_\alpha(x) = \begin{cases} x & \text{for } |x| \le \alpha \\ 0 & \text{otherwise} \end{cases}, \quad (32)$$

and where α is the blanking value.

As shown in the figure, the input x(t) and the output y(t) may be related by $$\frac{d}{dt}\overline{h_\tau * y} = \frac{1}{\gamma\tau}\overline{\mathcal{B}_\alpha(h_\tau * (x-y))}, \quad (33)$$

where the overlines denote averaging over a time interval between any pair of threshold (including zero) crossings of D (such as, e.g., the interval ΔT shown in FIG. 26), and the filter represented by equation (33) may be referred to as a Clipped Mean Tracking Filter (CMTF). Note that without the time averaging equation (33) corresponds to the ABAINF described by equation (12) with μ=0, and x and χ replaced by $h_\tau * x$ and $h_\tau * y$, respectively.

Figure 27:
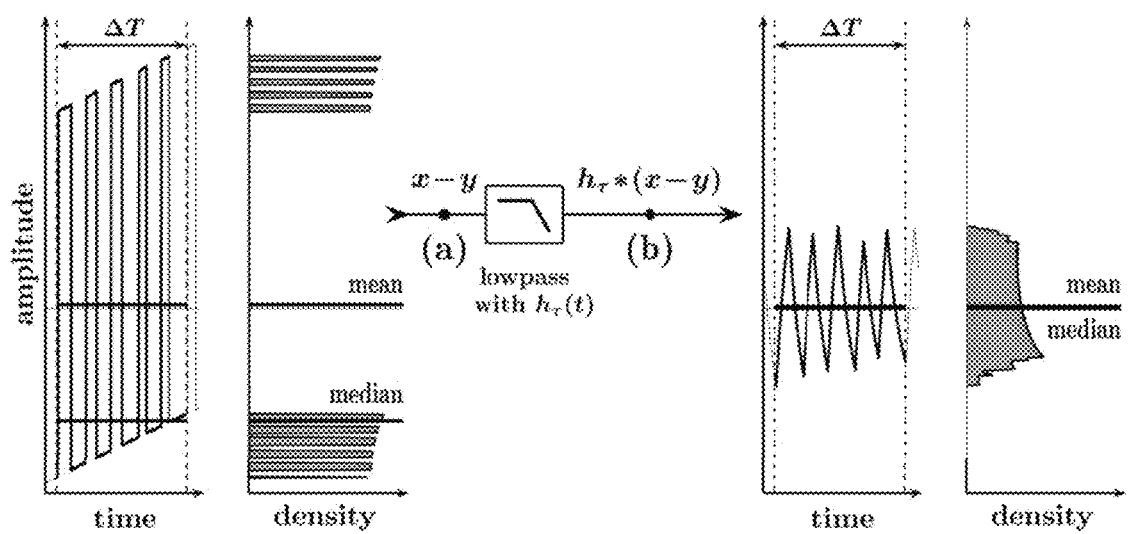
FIG. 27. Modifying the amplitude density of the difference signal x−y by a 1st order lowpass filter.

The utility of the 1st order lowpass filters $h_\tau(t)$ would be, first, to modify the amplitude density of the difference signal x−y so that for a slowly varying signal of interest x(t) the mean and the median values of $h_\tau *(x-y)$ in the time interval ΔT would become effectively equivalent, as illustrated in FIG. 27. However, the median value of $h_\tau *(x-y)$ would be more robust when the narrow-band signal of interest is affected by short-duration outliers such as broadband impulsive noise, since such outliers would not be excessively broadened by the wide-band filter $h_\tau(t)$. In addition, while being wide-band, this filter would prevent the amplitude of the background noise observed at the input of the blanker from being excessively large.

With τ given by equation (31), the parameter γ may be chosen as $$\gamma \approx \frac{1}{4\pi B_x \tau} \approx \frac{1}{2}\sqrt{\frac{F_s}{B_x}}, \quad (34)$$

and the relation between the input and the output of the ΔΣ ADCs with a CMTF-based loop filter may be expressed as $$x(t-\Delta t) \approx ((w+\gamma\tau\dot{w})*y)(t). \quad (35)$$

Note that for large blanking values such that $\alpha \gtrsim |h_\tau*(x-y)|$ for all t, according to equation (33) the average rate of change of $h_\tau*y$ would be proportional to the average of the difference signal $h_\tau*(x-y)$. When the magnitude of the difference signal $h_\tau*(x-y)$ exceeds the blanking value α, however, the average rate of change of $h_\tau*y$ would be zero and would no longer depend on the magnitude of $h_\tau*x$, providing an output that would be insensitive to outliers with a characteristic amplitude determined by the blanking value α.

Since linear filters are generally better than median for removing broadband Gaussian (e.g. thermal) noise, the blanking value in the CMTF-based topology should be chosen to ensure that the CMTF-based ΔΣ ADC performs effectively linearly when outliers are not present, and that it exhibits nonlinear behavior only intermittently, in response to outlier noise. An example of a robust approach to establishing such a blanking value is outlined in § 5.2.

One skilled in the art will recognize that the ΔΣ modulator depicted in FIG. 26 comprises a quantizer (flip-flop), a blanker, two integrators, and two wide-bandwidth 1st order lowpass filters, and the (nonlinear) loop filter of this modulator is configured in such a way that the value of the quantized representation (signal y(t)) of the input signal x(t), averaged over a time interval ΔT comparable with an inverse of the nominal bandwidth of the signal of interest, is effectively proportional to a nonlinear measure of central tendency of said input signal x(t) in said time interval ΔT.

5.1 Simplified Performance Example

Let us first use a simplified synthetic signal to illustrate the essential features, and the advantages provided by the ΔΣ ADC with the CMTF-based loop filter configuration when the impulsive noise affecting the signal of interest dominates over a low-level background Gaussian noise.

In this example, the signal of interest consists of two fragments of two sinusoidal tones with $0.9V_c$ amplitudes, and with frequencies $B_x$ and $B_x/8$, respectively, separated by zero-value segments. While pure sine waves are chosen for an ease of visual assessment of the effects of the noise, one may envision that the low-frequency tone corresponds to a vowel in a speech signal, and that the high-frequency tone corresponds to a fricative consonant.

Figure 28:
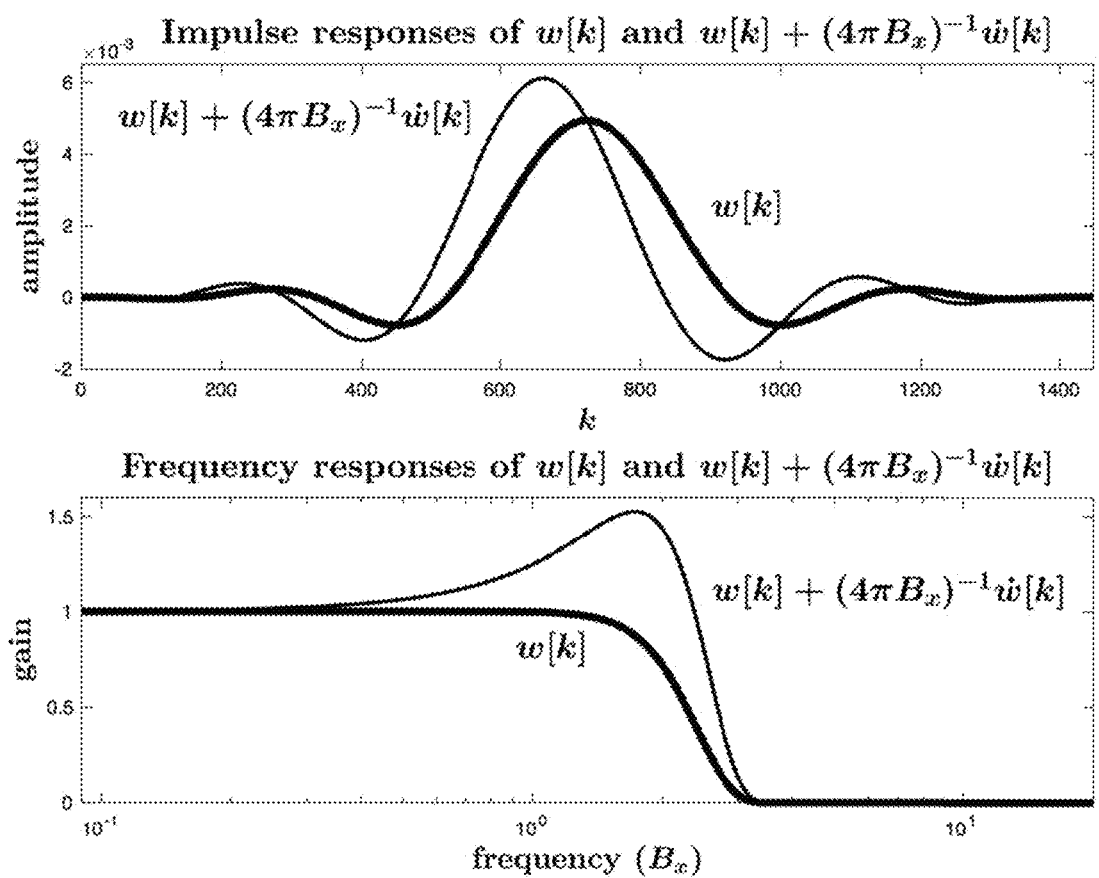
FIG. 28. Impulse and frequency responses of w[k] and w[k]+(4πB$_x$)$^{-1}$w̄[k] used in the examples of FIG. 29.

For all ΔΣ ADCs in this illustration, the flip-flop clock frequency is $F_s=NB_x$, where N=1024. For the 2nd-order loop filter in this illustration $\tau=(4\pi B_x)^{-1}$. The time constant τ of the 1st order lowpass filters in the CMTF-based loop filter is $\tau=(2\pi B_x\sqrt{N})^{-1}=(64\pi B_x)^{-1}$, and γ=16 (resulting in $\gamma\tau=(4\pi B_x)^{-1}$). The parameter α is chosen as $\alpha=V_c$. The output y[k] of the ΔΣ ADC with the 1st-order linear loop filter (panel I of FIG. 1) is filtered with a digital lowpass filter with the impulse response w[k]. The outputs of the ΔΣ ADCs with the 2nd-order linear (panel II of FIG. 1) and the CMTF-based (FIG. 5) loop filters are filtered with a digital lowpass filter with the impulse response $w[k]+(4\pi B_x)^{-1}\dot{w}[k]$. The impulse and frequency responses of w[k] and $w[k]+(4\pi B_x)^{-1}\dot{w}[k]$ are shown in FIG. 28.

Figure 29:
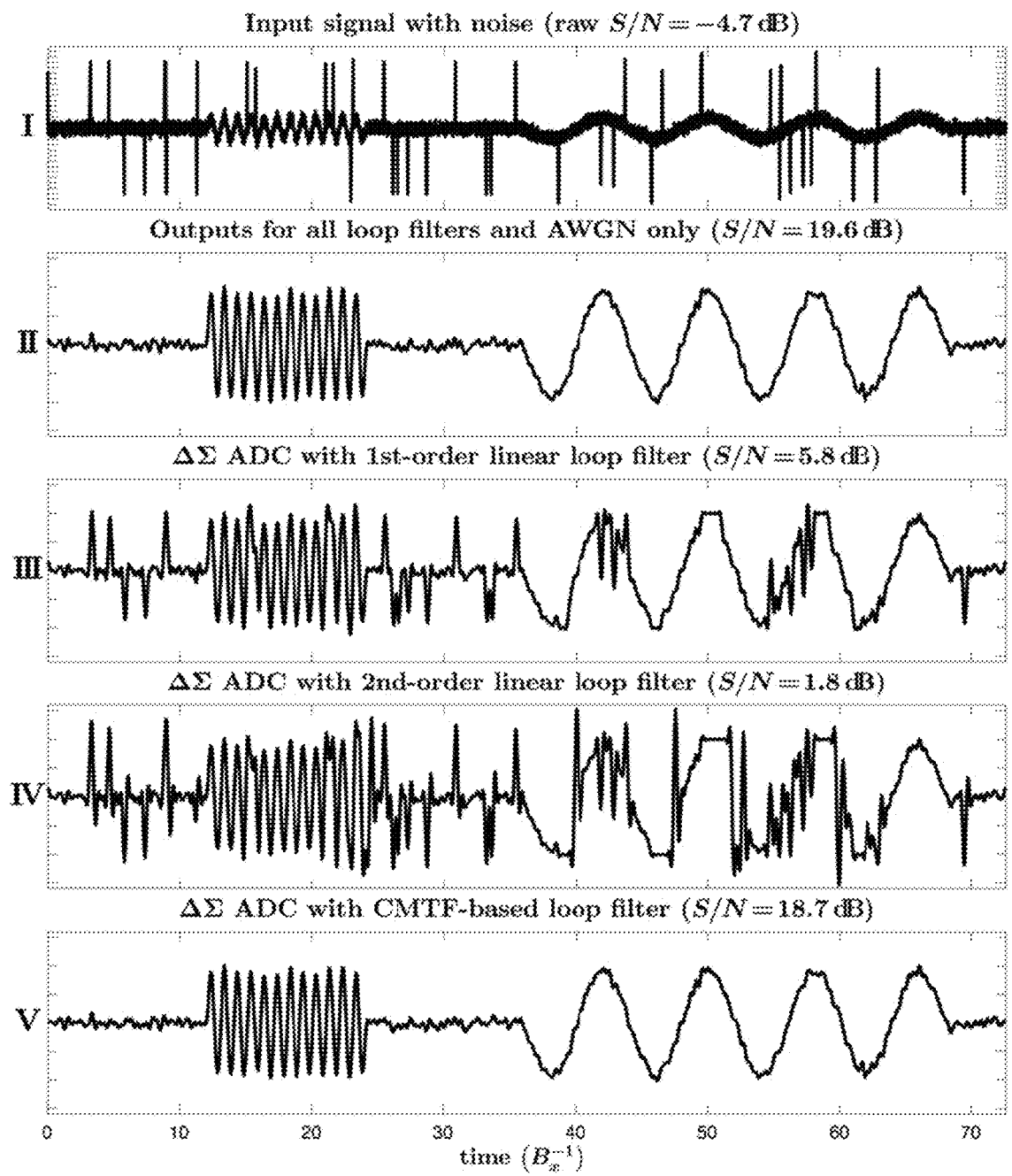
FIG. 29. Comparative performance of ΔΣ ADCs with linear and nonlinear analog loop filters.

As shown in panel I of FIG. 29, the signal is affected by a mixture of additive white Gaussian noise (AWGN) and white impulse (outlier) noise components, both band-limited to approximately $B_x\sqrt{N}$ bandwidth. As shown in panel II, in the absence of the outlier noise, the performance of all ΔΣ ADC in this example is effectively equivalent, and the amount of the AWGN is such that the resulting signal-to-noise ratio for the filtered output is approximately 20 dB in the absence of the outlier noise. The amount of the outlier noise is such that the resulting signal-to-noise ratio for the filtered output of the ΔΣ ADC with a 1st-order linear loop filter is approximately 6 dB in the absence of the AWGN.

As one may see in panels III and IV of FIG. 29, the linear loop filters are ineffective in suppressing the impulsive noise. Further, the performance of the ΔΣ ADC with the 2nd-order linear loop filter (see panel IV of FIG. 29) is more severely degraded by high-power noise, especially by high-amplitude outlier noise such that the condition $|x(t-\Delta t)+(w*v)(t)|<V_c$ is not satisfied for all t. On the other hand, as may be seen in panel V of FIG. 29, the ΔΣ ADC with the CMTF-based loop filter improves the signal-to-noise ratio by about 13 dB in comparison with the ΔΣ ADC with the 1st-order linear loop filter, thus removing about 95% of the impulsive noise.

Figure 30:
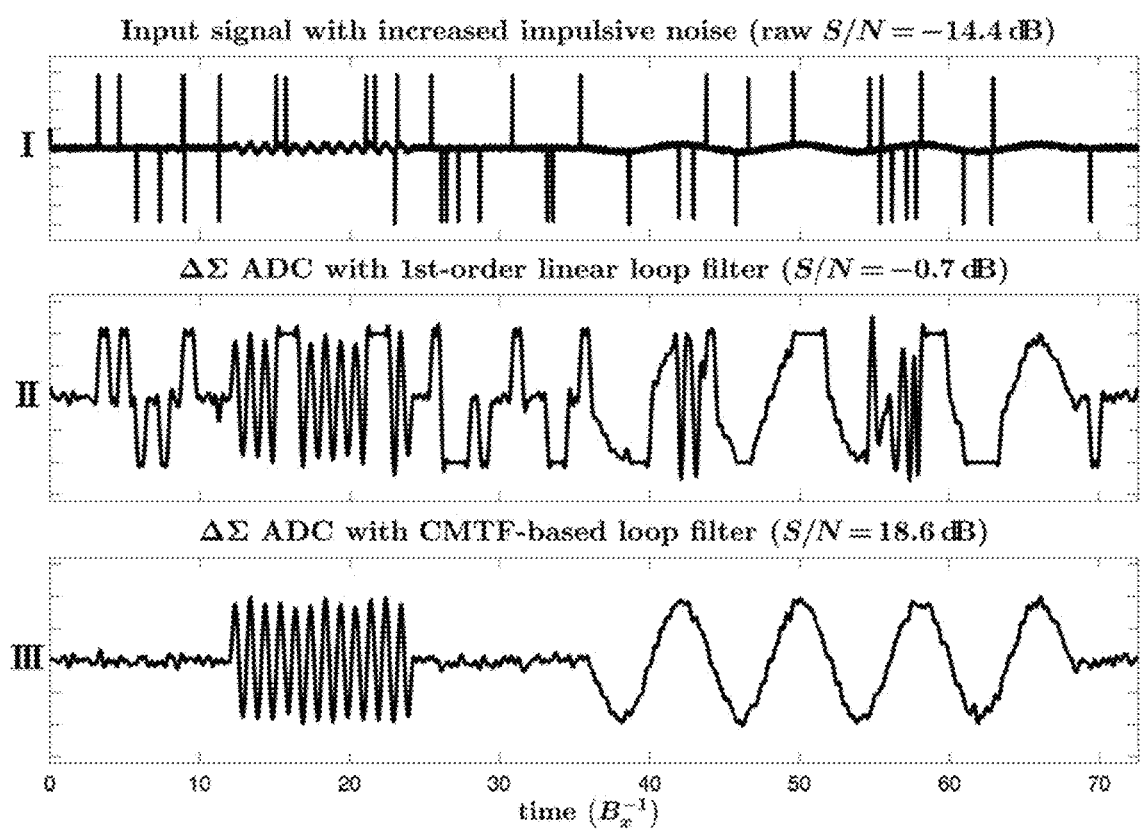
FIG. 30. Resistance of ΔΣ ADC with CMTF-based loop filter to increase in impulsive noise.

More importantly, as may be seen in panel III of FIG. 30, increasing the impulsive noise power by an order of magnitude hardly affects the output of the ΔΣ ADC with the CMTF-based loop filter (and thus about 99.5% of the impulsive noise is removed), while further exceedingly degrading the output of the ΔΣ ADC with the 1st-order linear loop filter (panel II).

5.2 ΔΣ ADC with Adaptive CMTF

A CMTF with an adaptive (possibly asymmetric) blanking range $[\alpha_-, \alpha_{3\sigma}]$ may be designed as follows. To ensure that the values of the difference signal $h_T*(x-y)$ that lie outside of $[\alpha_-, \alpha_+]$ are outliers, one may identify $[a_-, \alpha_+]$ with Tukey's range [46], a linear combination of the 1st ($Q_1$) and the 3rd ($Q_3$) quartiles of the difference signal (see [33, 34] for discussion of quantiles of continuous signals):

$$[\alpha_-, \alpha_+] = [Q_1 - \beta(Q_3 - Q_1), Q_3 + \beta(Q_3 - Q_1)], \quad (36)$$

where β is a coefficient of order unity (e.g. β=1.5). From equation (36), for a symmetrical distribution the range that excludes outliers may also be obtained as $[\alpha_-, \alpha_+] = [-\alpha, \alpha]$, where α is given by $$\alpha = (1+2\beta)Q_2^*, \quad (37)$$

and where $Q_2^*$ is the 2nd quartile (median) of the absolute value (or modulus) of the difference signal $|h_T*(x-y)|$.

Alternatively, since $2Q_2^* = Q_3 - Q_1$ for a symmetrical distribution, the resolution parameter α may be obtained as $$\alpha = (\tfrac{1}{2}+\beta)(Q_3 - Q_1), \quad (38)$$

where $Q_3 - Q_1$ is the interquartile range (IQR) of the difference signal.

Figure 31:
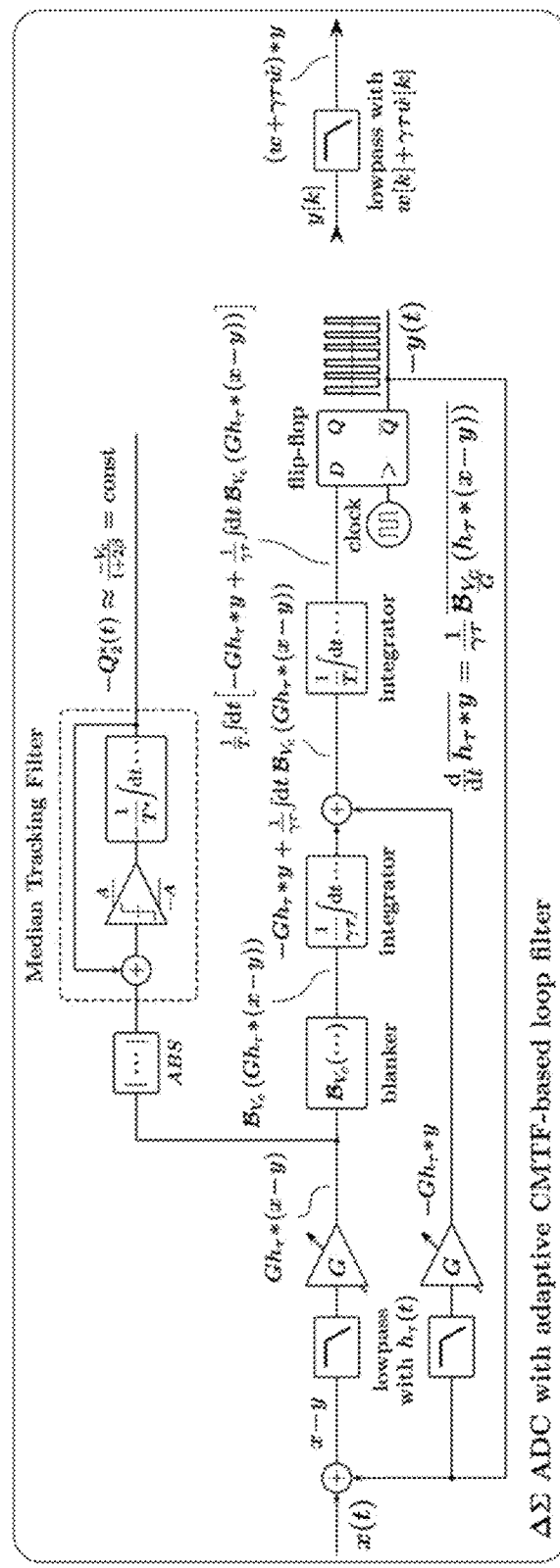
FIG. 31. Outline of ΔΣ ADC with adaptive CMTF-based loop filter.

FIG. 31 provides an outline of a ΔΣ ADC with an adaptive CMTF-based loop filter. In this example, the 1st order lowpass filters are followed by the gain stages with the gain G, while the blanking value is set to $V_c$. Note that $$\mathcal{B}_{V_c}(Gx) = G\mathcal{B}_{\frac{V_c}{G}}(x), \quad (39)$$

and thus the "apparent" (or "equivalent") blanking value would be no longer hardware limited. As shown in FIG. 31, the input x(t) and the output y(t) may be related by $$\frac{d}{dt}\overline{h_\tau * y} = \frac{1}{\gamma\tau}\overline{\mathcal{B}_{\frac{V_c}{G}}(h_\tau*(x-y))}. \quad (40)$$

If an automatic gain control circuit maintains a constant output $-V_c/(1+2\beta)$ of the MTF circuit in FIG. 31, then the apparent blanking value $\alpha = V_c/G$ in equation (40) may be given by equation (37).

5.2.1 Performance Example

Simulation Parameters—

To emulate the analog signals in the examples below, the digitization rate is two orders of magnitude higher than the sampling rate $F_s$. The signal of interest is a Gaussian baseband signal in the nominal frequency rage $[0, B_x]$. It is generated as a broadband white Gaussian noise filtered with a root-raised-cosine filter with the roll-off factor ¼ and the bandwidth $5B_x/4$. The noise affecting the signal of interest is a sum of an AWGN background component and white impulsive noise i(t). The impulsive noise is modeled as symmetrical (bipolar) Poisson shot noise:

$$i(t) = v(t)\sum_{k=1}^{\infty}\delta(t-t_k), \quad (41)$$

where v(t) is AWGN noise, $t_k$ is the k-th arrival time of a Poisson process with the rate parameter Δ, and δ(x) is the Dirac δ-function [31]. In the examples below, $\lambda = B_x$. The gain C is chosen to maintain the output of the MTF in FIG. 31 at $-V_c/(1+2\beta)$, and the digital lowpass filter w[k] is the root-raised-cosine filter with the roll-off factor ¼ and the bandwidth $5B_x/4$. The remaining hardware parameters are the same as those in § 5.1. Further, the magnitude of the input x(t) is chosen to ensure that the average absolute value of the output signal is approximately $V_c/5$.

Comparative Channel Capacities—

For the simulation parameters described above, FIG. 32 compares the simulated channel capacities (calculated from the baseband SNRs using the Shannon formula [42]) for various signal+noise compositions, for the linear signal processing chain (solid lines) and the CMTF-based chain of FIG. 31 with β=1.5 (dotted lines).

Figure 32:
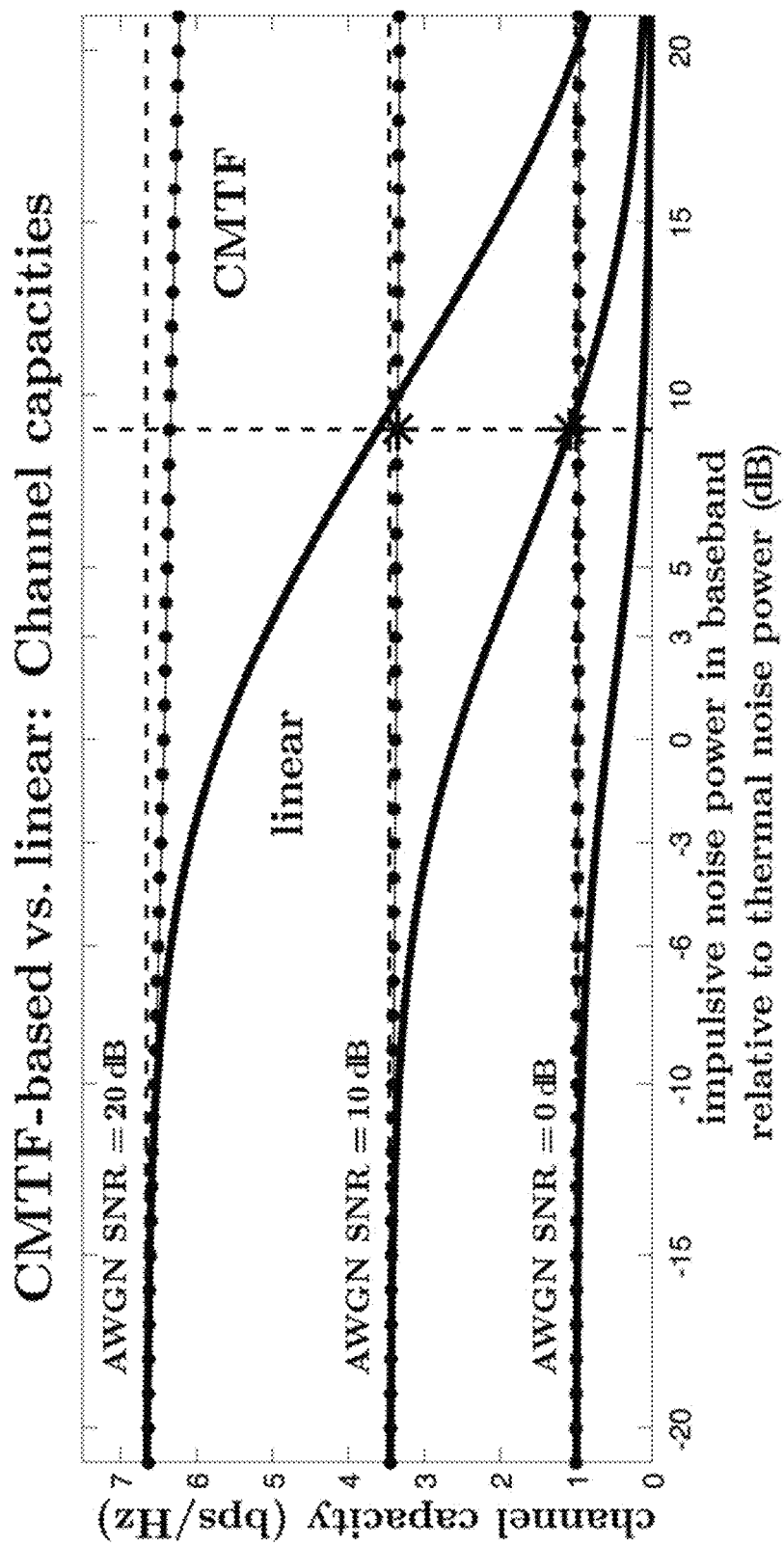
FIG. 32. Comparison of simulated channel capacities for the linear processing chain (solid lines) and the CMTF-based chains with β=1.5 (dotted lines). The meaning of the asterisks is explained in the text.

As one may see in FIG. 32 (and compare with the simplified diagram of FIG. 2), linear and the CMTF-based chains provide effectively equivalent performance when the AWGN dominates over the impulsive noise. However, the CMTF-based chains are insensitive to further increase in the impulsive noise when the latter becomes comparable or dominates over the thermal (Gaussian) noise, thus providing resistance to impulsive interference.

Disproportionate Effect on Baseband PSDs—

Figure 33A:
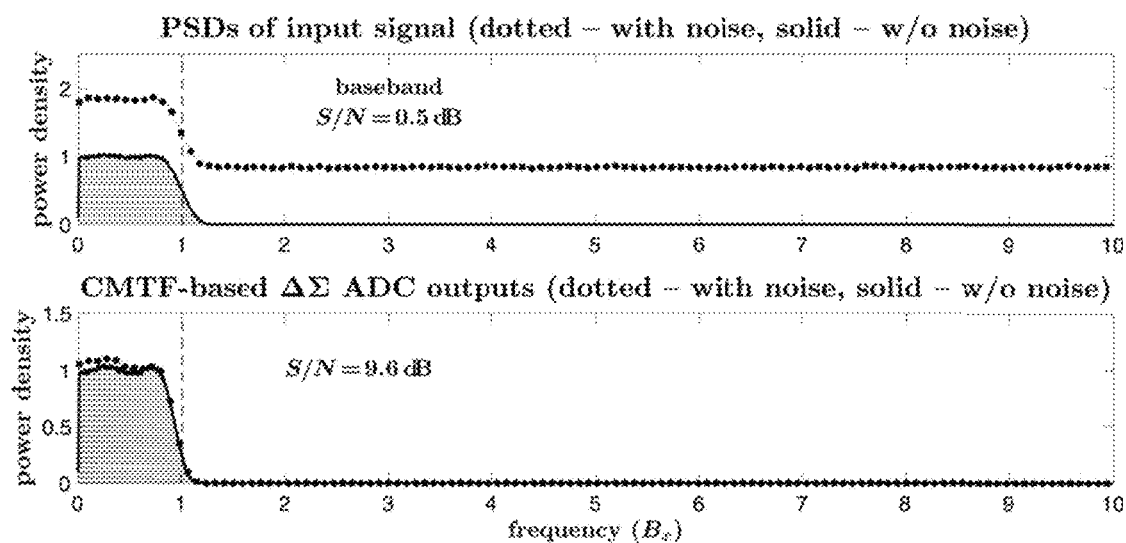
FIG. 33A. Reduction of the spectral density of impulsive noise in the signal baseband without affecting that of the signal of interest.

For a mixture of white Gaussian and white impulsive noise, FIG. 33A illustrates reduction of the spectral density of impulsive noise in the signal baseband without affecting that of the signal of interest. In the figure, the solid lines correspond to the "ideal" signal of interest (without noise), and the dotted lines correspond to the signal+noise mixtures. The baseband power of the AWGN is one tenth of that of the signal of interest (10 dB AWGN SNR), and the baseband power of the impulsive noise is approximately 8 times (9 dB) that of the AWGN. The value of the parameter β for Tukey's range is β=1.5. As may be seen in the figure, for the CMTF-based chain the baseband SNR increases from 0.5 dB to 9.7 dB.

For both the linear and the CMTF-based chains the observed baseband noise may be considered to be effectively Gaussian, and we may use the Shannon formula [42] based on the achieved baseband SNRs to calculate the channel capacities. Those are marked by the asterisks on the respective solid and dotted curves in FIG. 32.

Figure 33B:
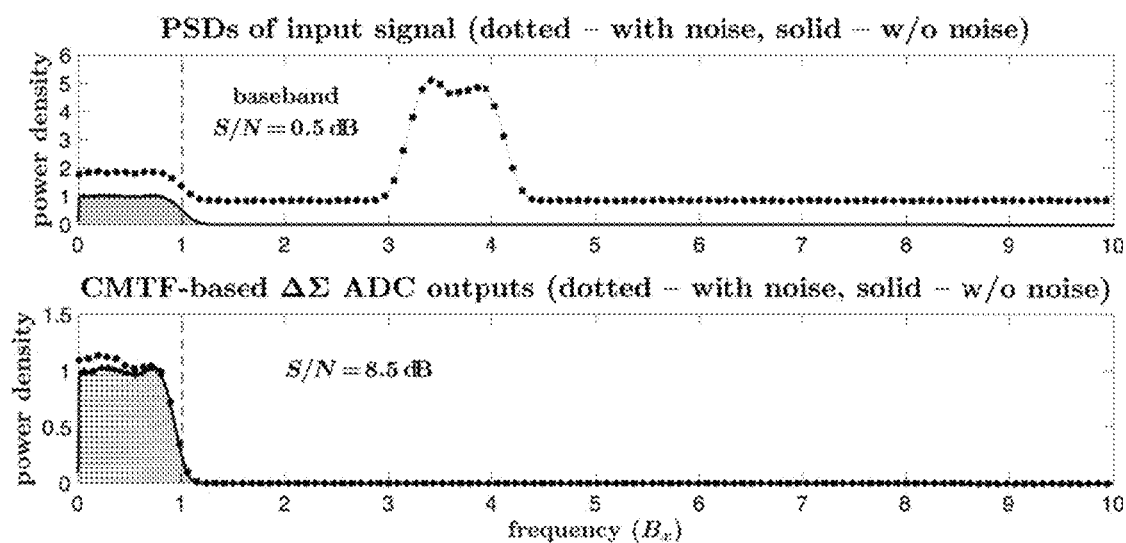
FIG. 33B. Reduction of the spectral density of impulsive noise in the signal baseband without affecting that of the signal of interest. (Illustration similar to FIG. 33A with additional interference in an adjacent channel.)

FIG. 33B provides a similar illustration with additional interference in an adjacent channel. Such interference increases the apparent blanking value needed to maintain effectively linear CMTF behavior in the absence of the outliers, slightly reducing the effectiveness of the impulsive noise suppression. As a result, the baseband SNR increases from 0.5 dB to only 8.5 dB.

6 ΔΣ ADCs with Linear Loop Filters and Digital ADiC/CMTF Filtering

While § 5 describes CMTF-based outlier noise filtering of the analog input signal incorporated into loop filters of ΔΣ analog-to-digital converters, the high raw sampling rate (e.g. the flip-flop clock frequency) of a ΔΣ ADC (e.g. two to three orders of magnitude larger than the bandwidth of the signal of interest) may be used for effective ABAINF/CMTF/ADiC-based outlier filtering in the digital domain, following a ΔΣ modulator with a linear loop filter.

Figure 34:
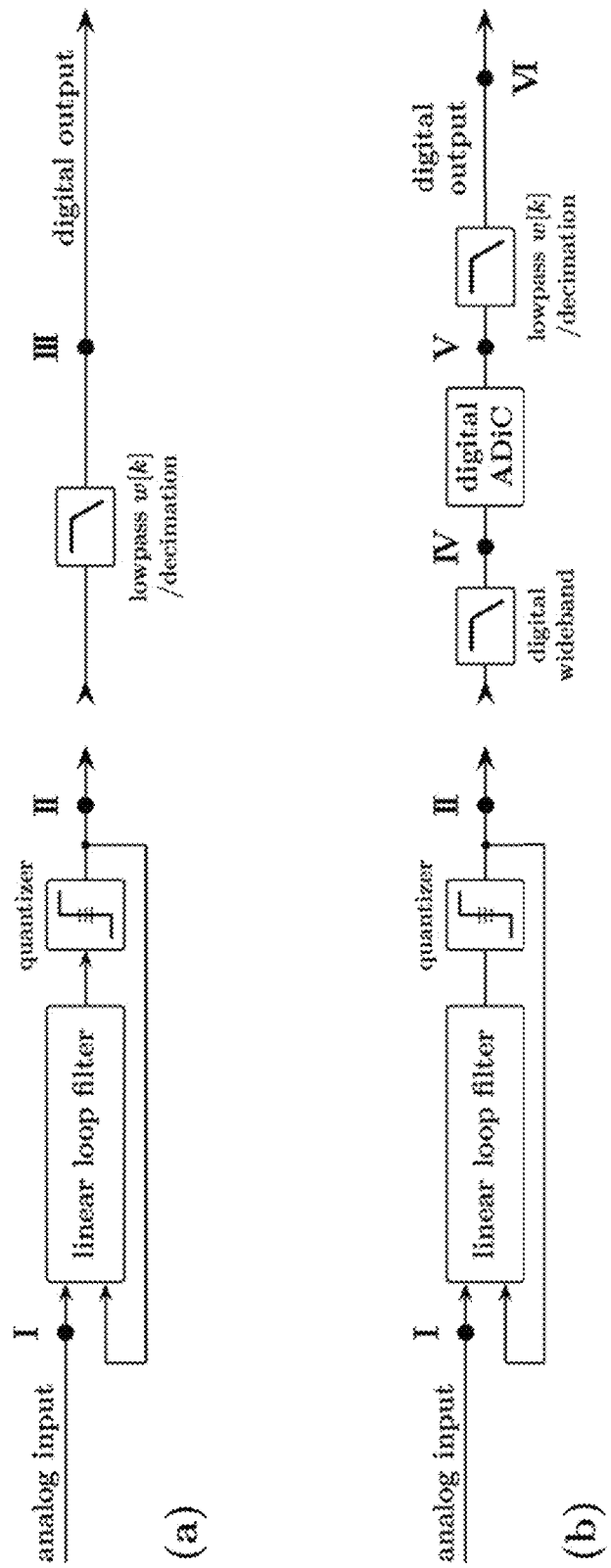
FIG. 34. Illustrative signal chains for a ΔΣ ADC with linear loop and decimation filters (panel (a)), and for a ΔΣ ADC with linear loop filter and ADiC-based digital filtering (panel (b)).

FIG. 34 shows illustrative signal chains for a ΔΣ ADC with linear loop and decimation filters (panel (a)), and for a ΔΣ ADC with linear loop filter and ADiC-based digital filtering (panel (b)). As may be seen in panel (a) of FIG. 34, the quantizer output of a ΔΣ ADC with linear loop filter would be filtered with a linear decimation filter that would typically combine lowpass filtering with downsampling. To enable an ADiC-based outlier filtering (panel (b)), a wideband (e.g. with bandwidth approximately equal to the geometric mean of the nominal signal bandwidth $B_x$ and the sampling frequency $F_s$) digital filter is first applied to the output of the quantizer. The output of this filter is then filtered by a digital ADiC (with appropriately chosen time parameter and the blanking range), followed by a linear lowpass/decimation filter.

Figure 35:
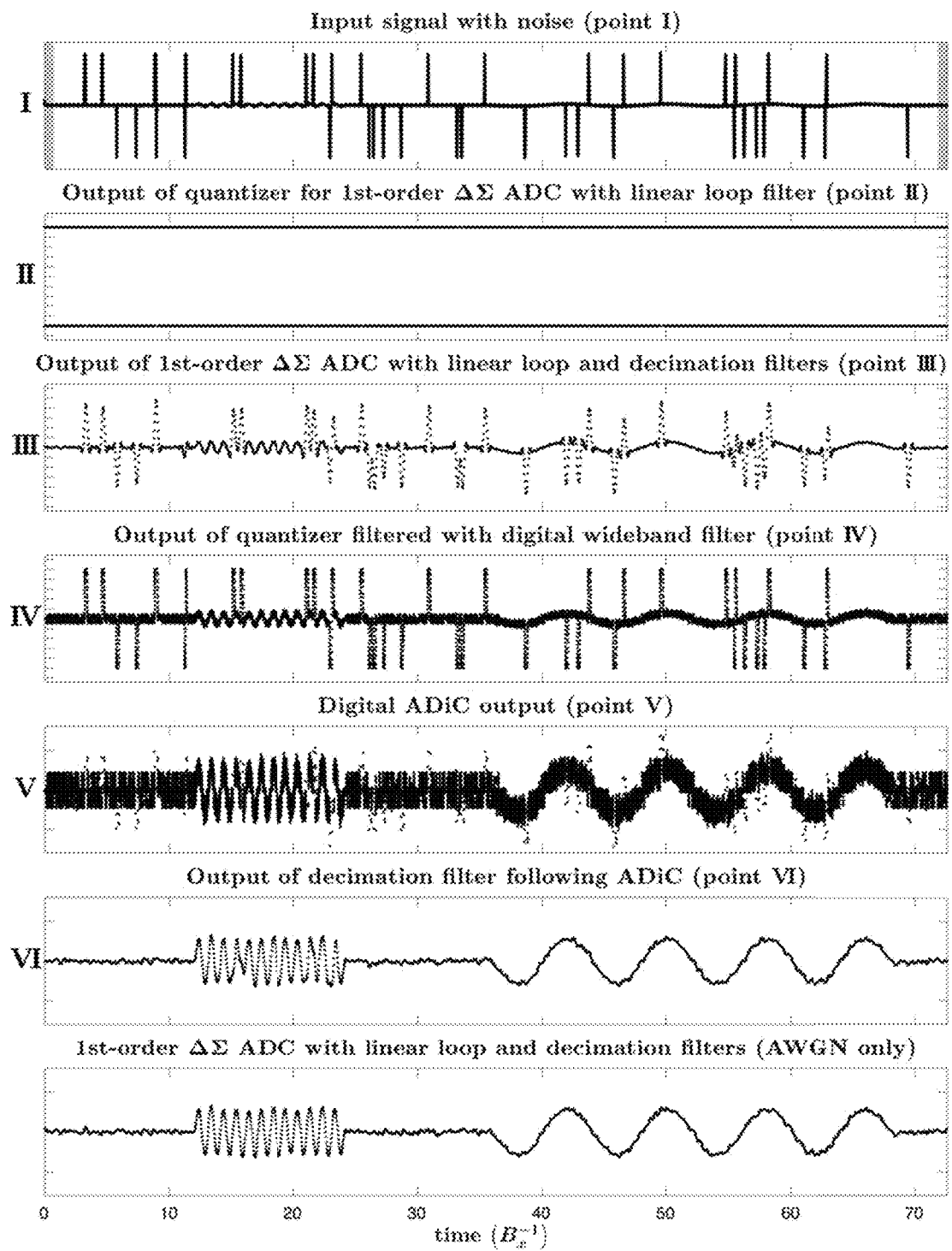
FIG. 35. Illustrative time-domain traces at points I through VI of FIG. 34, and the output of the ΔΣ ADC with linear loop and decimation filters for the signal affected by AWGN only (w/o impulsive noise).

FIG. 35 shows illustrative time-domain traces at points I through VI of FIG. 34, and the output of the ΔΣ ADC with linear loop and decimation filters for the signal affected by AWGN only (w/o impulsive noise). In this example, a 1st order ΔΣ modulator is used, and the quantizer produces a 1-bit output shown in panel II. The digital wideband filter is a 2nd order IIR Bessel filter with the corner frequency approximately equal to the geometric mean of the nominal signal bandwidth $B_x$ and the sampling frequency $F_s$. The time parameter of the ADiC is approximately $\tau \approx (4\pi B_x)^{-1}$, and the same lowpass/decimation filter is used as for the linear chain of FIG. 34 (a).

Figure 36:
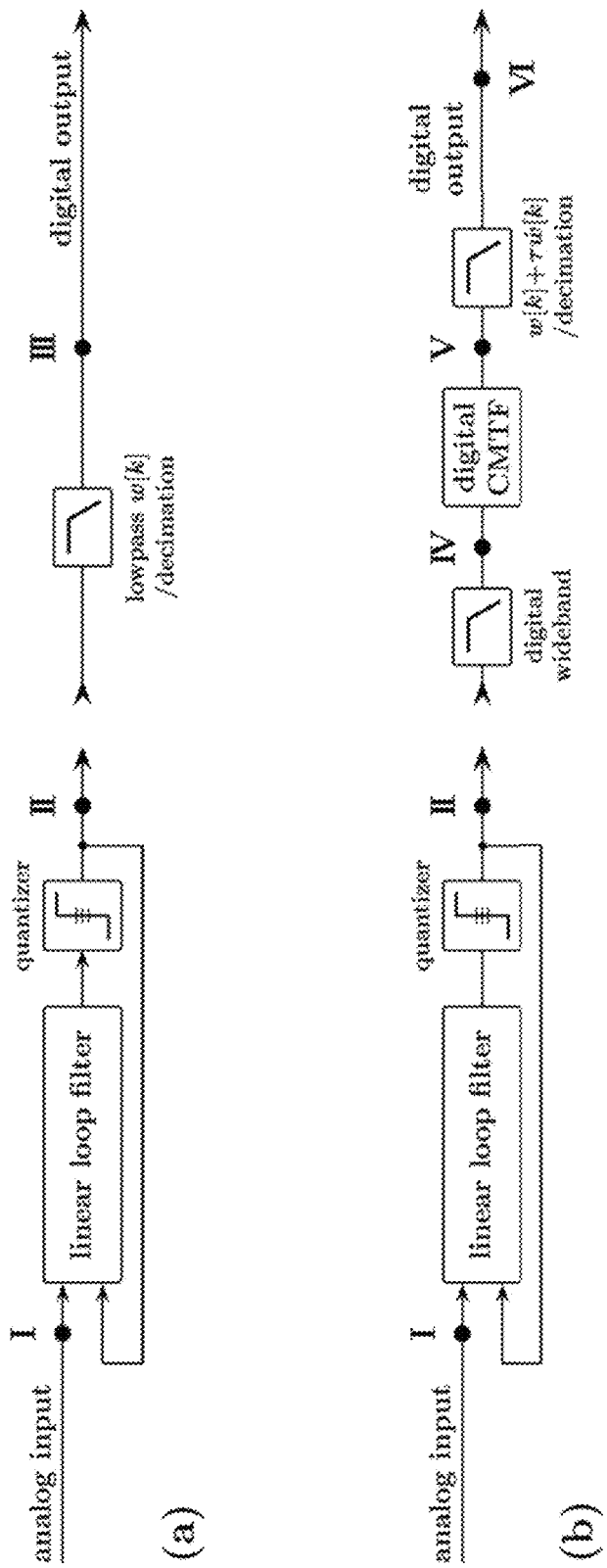
FIG. 36. Illustrative signal chains for a ΔΣ ADC with linear loop and decimation filters (panel (a)), and for a ΔΣ ADC with linear loop filter and CMTF-based digital filtering (panel (b)).

FIG. 36 shows illustrative signal chains for a ΔΣ ADC with linear loop and decimation filters (panel (a)), and for a ΔΣ ADC with linear loop filter and CMTF-based digital filtering (panel (b)). To enable a CMTF-based outlier filtering (panel (b)), a wideband digital filter is first applied to the output of the quantizer. The output of this filter is then filtered by a digital CMTF (with the time constant τ and appropriately chosen blanking range), followed by a linear lowpass filtering (with the modified impulse response w[k]+τẇ[k]) combined with decimation.

Figure 37:
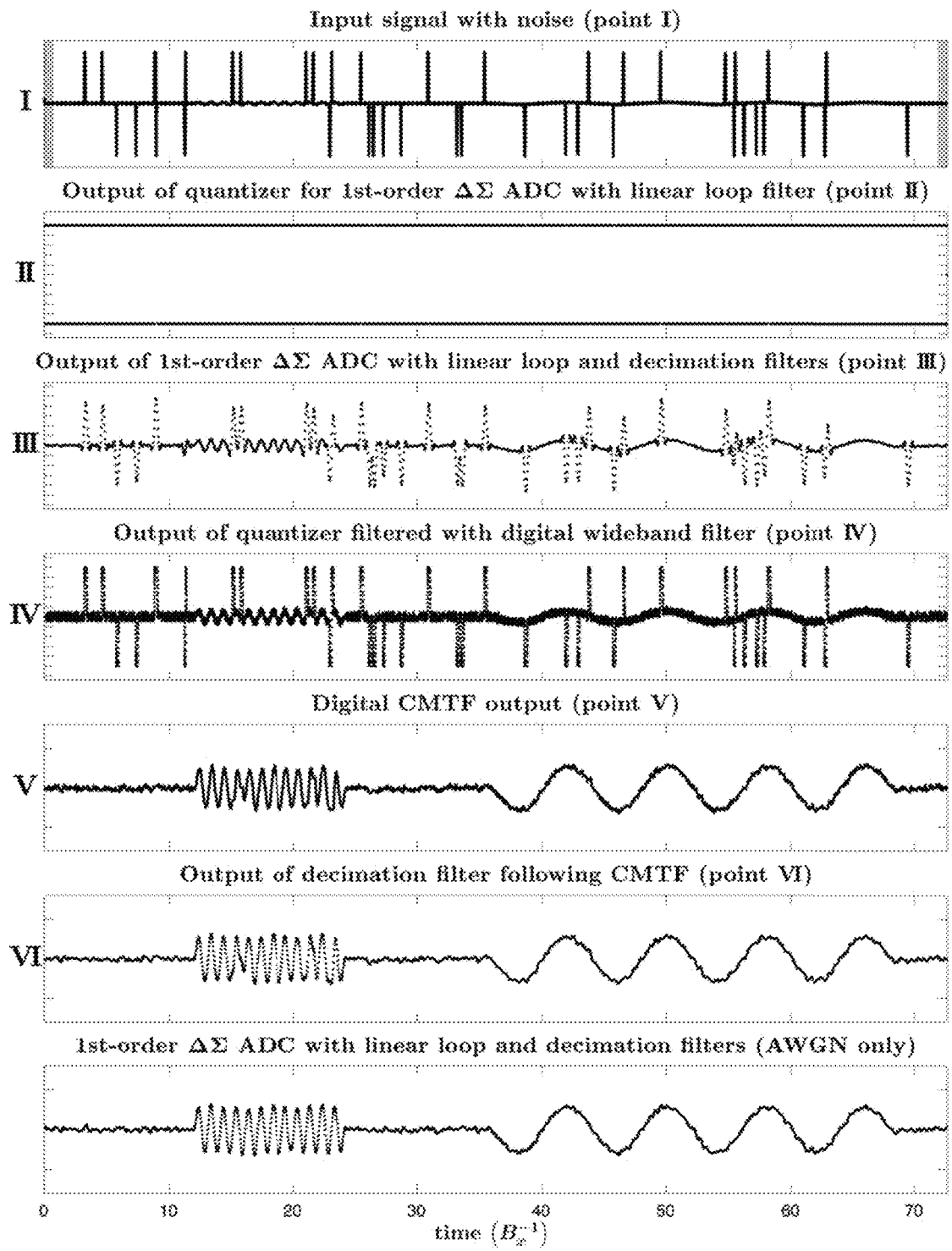
FIG. 37. Illustrative time-domain traces at points I through VI of FIG. 36, and the output of the ΔΣ ADC with linear loop and decimation filters for the signal affected by AWGN only (w/o impulsive noise).

FIG. 37 shows illustrative time-domain traces at points I through VI of FIG. 36, and the output of the ΔΣ ADC with linear loop and decimation filters for the signal affected by AWGN only (w/o impulsive noise). In this example, a 1st order ΔΣ modulator is used, and the quantizer produces a 1-bit output shown in panel II. The digital wideband filter is a 2nd order IIR Bessel filter with the corner frequency approximately equal to the geometric mean of the nominal signal bandwidth B and the sampling frequency $F_s$. The time parameter of the CMTF is $\tau = (4\pi B_x)^{-1}$, and the impulse response of the lowpass filter in the decimation stage is modified as w[k]+$(4\pi B_x)^{-1}$ẇ[k].

Figure 38:
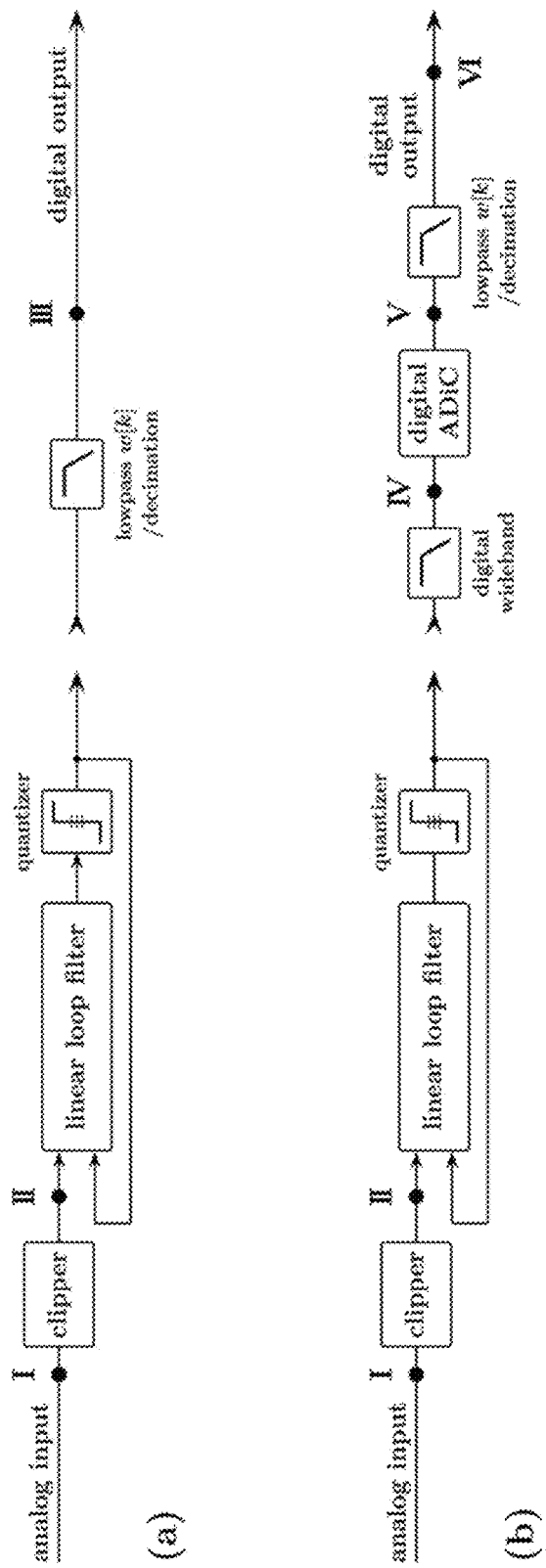
FIG. 38. Illustrative signal chains for a ΔΣ ADC with linear loop and decimation filters (panel (a)), and for a ΔΣ ADC with linear loop filter and ADiC-based digital filtering (panel (b)), with additional clipping of the analog input signal.
Figure 40:
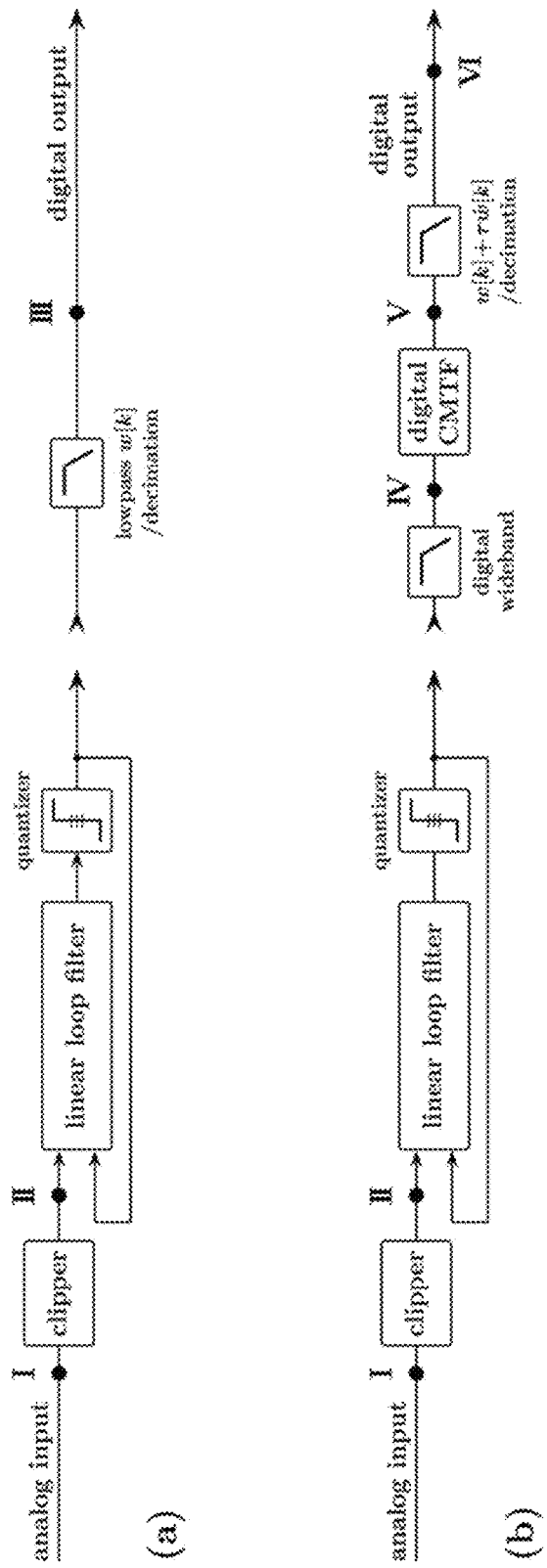
FIG. 40. Illustrative signal chains for a ΔΣ ADC with linear loop and decimation filters (panel (a)), and for a ΔΣ ADC with linear loop filter and CMTF-based digital filtering (panel (b)), with additional clipping of the analog input signal.

To prevent excessive distortions of the quantizer output by high-amplitude transients (especially for high-order ΔΣ modulators), and thus to increase the dynamic range of the ADC and/or the effectiveness of outlier filtering, an analog clipper (with appropriately chosen clipping values) should precede the ΔΣ modulator, as schematically shown in FIGS. 38 and 40.

FIG. 38 shows illustrative signal chains for a ΔΣ ADC with linear loop and decimation filters (panel (a)), and for a ΔΣ ADC with linear loop filter and ADiC-based digital filtering (panel (b)), with additional clipping of the analog input signal.

Figure 39:
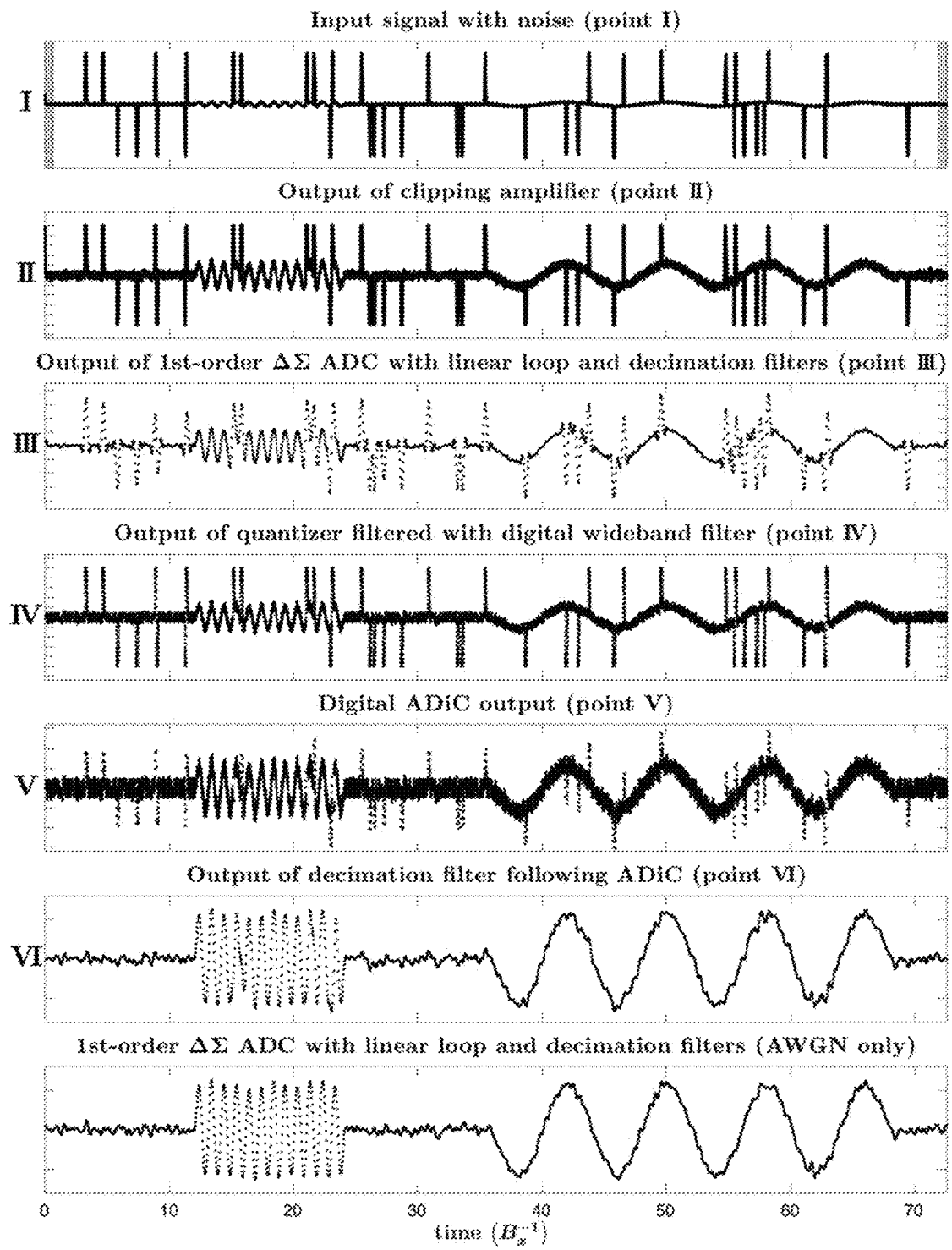
FIG. 39. Illustrative time-domain traces at points I through VI of FIG. 38, and the output of the ΔΣ ADC with linear loop and decimation filters for the signal affected by AWGN only (w/o impulsive noise).

FIG. 39 shows illustrative time-domain traces at points I through VI of FIG. 38, and the output of the ΔΣ ADC with linear loop and decimation filters for the signal affected by AWGN only (w/o impulsive noise). In this example, a 1st order ΔΣ modulator is used, and the quantizer produces a 1-bit output. The digital wideband filter is a 2nd order IIR Bessel filter with the corner frequency approximately equal to the geometric mean of the nominal signal bandwidth $B_x$ and the sampling frequency $F_s$. The time parameter of the ADiC is approximately $\tau \approx (4\pi B_x)^{-1}$, and the same lowpass/decimation filter is used as for the linear chain of FIG. 38 (a).

FIG. 40 shows illustrative signal chains for a ΔΣ ADC with linear loop and decimation filters (panel (a)), and for a ΔΣ ADC with linear loop filter and CMTF-based digital filtering (panel (b)), with additional clipping of the analog input signal.

Figure 41:
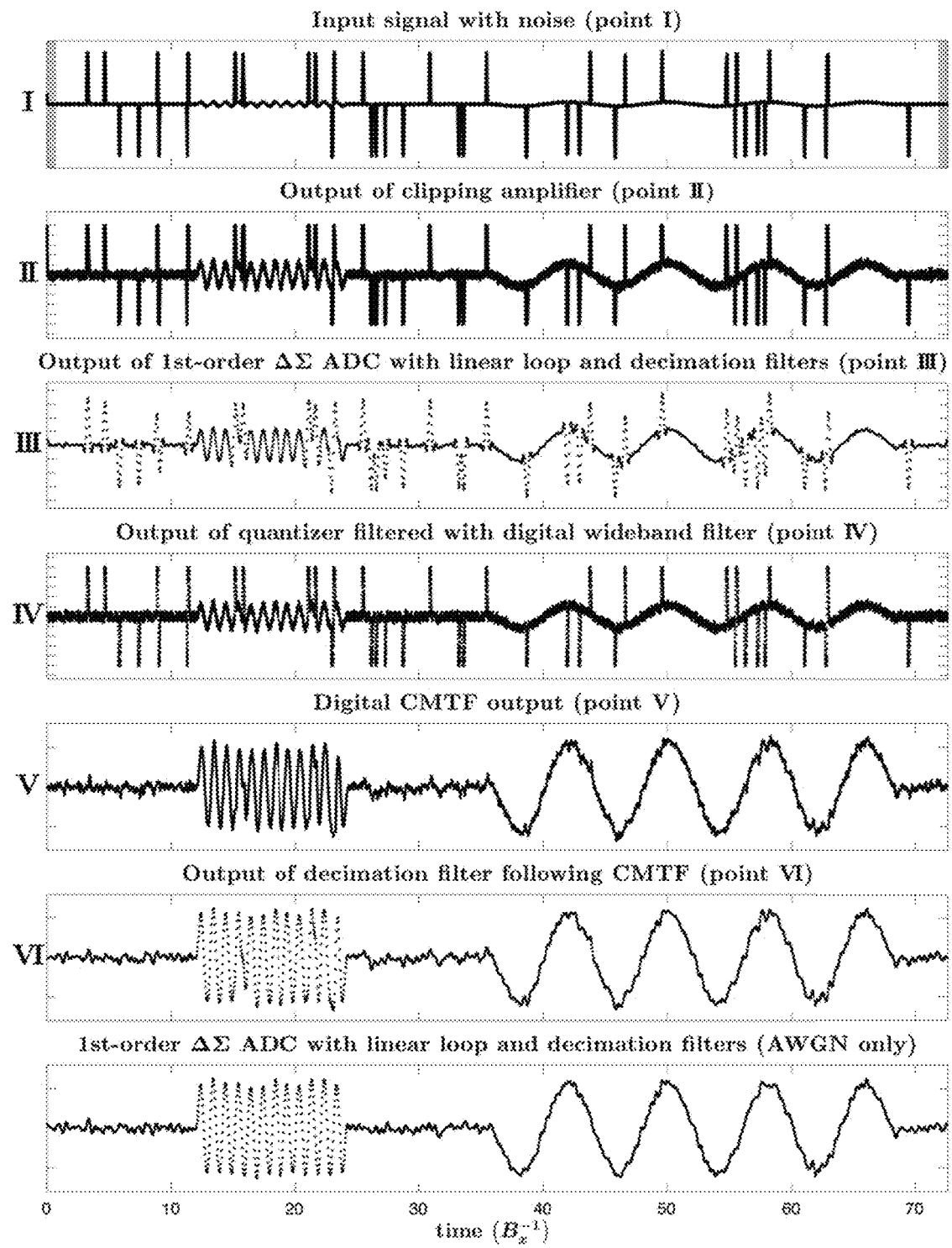
FIG. 41. Illustrative time-domain traces at points I through VI of FIG. 40, and the output of the ΔΣ ADC with linear loop and decimation filters for the signal affected by AWGN only (w/o impulsive noise).

FIG. 41 shows illustrative time-domain traces at points I through VI of FIG. 40, and the output of the ΔΣ ADC with linear loop and decimation filters for the signal affected by AWGN only (w/o impulsive noise). In this example, a 1st order ΔΣ modulator is used, and the quantizer produces a 1-bit output. The digital wideband filter is a 2nd order IIR Bessel filter with the corner frequency approximately equal to the geometric mean of the nominal signal bandwidth $B_x$ and the sampling frequency $F_s$. The time parameter of the CMTF is $\tau = (4\pi B_x)^{-1}$, and the impulse response of the lowpass filter in the decimation stage is modified as w[k]+$(4\pi B_x)^{-1}$ẇ[k].

7 Additional Comments

It should be understood that the specific examples in this disclosure, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

Further, one skilled in the art will recognize that the various equalities and/or mathematical functions used in this disclosure are approximations that are based on some simplifying assumptions and are used to represent quantities with only finite precision. We may use the word "effectively" (as opposed to "precisely") to emphasize that only a finite order of approximation (in amplitude as well as time and/or frequency domains) may be expected in hardware implementation.

Ideal Vs. "Real" Blankers—

For example, we may say that an output of a blanker characterized by a blanking value is effectively zero when the absolute value (modulus) of said output is much smaller (e.g. by an order of magnitude or more) than the blanking range.

In addition to finite precision, a "real" blanker may be characterized by various other non-idealities. For example, it may exhibit hysteresis, when the blanker's state depends on its history.

For a "real" blanker, when the value of its input x extends outside of its blanking range [$\alpha_-$, $\alpha_+$], the value of its transparancy function would decrease to effectively zero value over some finite range of the increase (decrease) in x. If said range of the increase (decrease) in x is much smaller (e.g. by an order of magnitude or more) than the blanking range, we may consider such a "real" blanker as being effectively described by equations (15), (27) and/or (32).

Further, in a "real" blanker the change in the blanker's output may be "lagging", due to various delays in a physical circuit, the change in the input signal. However, when the magnitude of such lagging is sufficiently small (e.g. smaller than the inverse bandwidth of the input signal), and provided that the absolute value of the blanker output decreases to effectively zero value, or restores back to the input value, over a range of change in x much smaller than the blanking range (e.g. by an order of magnitude or more), we may consider such a "real" blanker as being effectively described by equations (15), (27) and/or (32).

7.1 Mitigation of Non-Gaussian (e.g. Outlier) Noise in the Process of Analog-to-Digital Conversion: Analog and Digital Approaches Conceptually, ABAINFs are analog filters that combine bandwidth reduction with mitigation of interference. One may think of non-Gaussian interference as having some temporal and/or amplitude structure that distinguishes it form a purely random Gaussian (e.g. thermal) noise. Such structure may be viewed as some "coupling" among different frequencies of a non-Gaussian signal, and may typically require a relatively wide bandwidth to be observed. A linear filter that suppresses the frequency components outside of its passband, while reducing the non-Gaussian signal's bandwidth, may destroy this coupling, altering the structure of the signal. That may complicate further identification of the non-Gaussian interference and its separation from a Gaussian noise and the signal of interest by nonlinear filters such as ABAINFs.

In order to mitigate non-Gaussian interference efficiently, the input signal to an ABAINF would need to include the noise and interference in a relatively wide band, much wider (e.g. ten times wider) than the bandwidth of the signal of interest. Thus the best conceptual placement for an ABAINF may be in the analog part of the signal chain, for example, ahead of an ADC, or incorporated into the analog loop filter of a $\Delta\Sigma$ ADC. However, digital ABAINF implementations may offer many advantages typically associated with digital processing, including, but not limited to, simplified development and testing, configurability, and reproducibility.

In addition, as illustrated in § 3.3, a means of tracking the range of the difference signal that effectively excludes outliers of the difference signal may be easily incorporated into digital ABAINF implementations, without a need for separate circuits implementing such a means.

While real-time finite-difference implementations of the ABAINFs described above would be relatively simple and computationally inexpensive, their efficient use would still require a digital signal with a sampling rate much higher (for example, ten times or more higher) than the Nyquist rate of the signal of interest.

Since the magnitude of a noise affecting the signal of interest would typically increase with the increase in the bandwidth, while the amplitude of the signal+noise mixture would need to remain within the ADC range, a high-rate sampling may have a perceived disadvantage of lowering the effective ADC resolution with respect to the signal of interest, especially for strong noise and/or weak signal of interest, and especially for impulsive noise. However, since the sampling rate would be much higher (for example, ten times or more higher) than the Nyquist rate of the signal of interest, the ABAINF output may be further filtered and downsampled using an appropriate decimation filter (for example, a polyphase filter) to provide the desired higher-resolution signal at lower sampling rate. Such a decimation filter may counteract the apparent resolution loss, and may further increase the resolution (for example, if the ADC is based on $\Delta\Sigma$ modulators).

Further, a simple (non-differential) "hard" or "soft." clipper may be employed ahead of an ADC to limit the magnitude of excessively strong outliers in the input signal.

Figure 42:
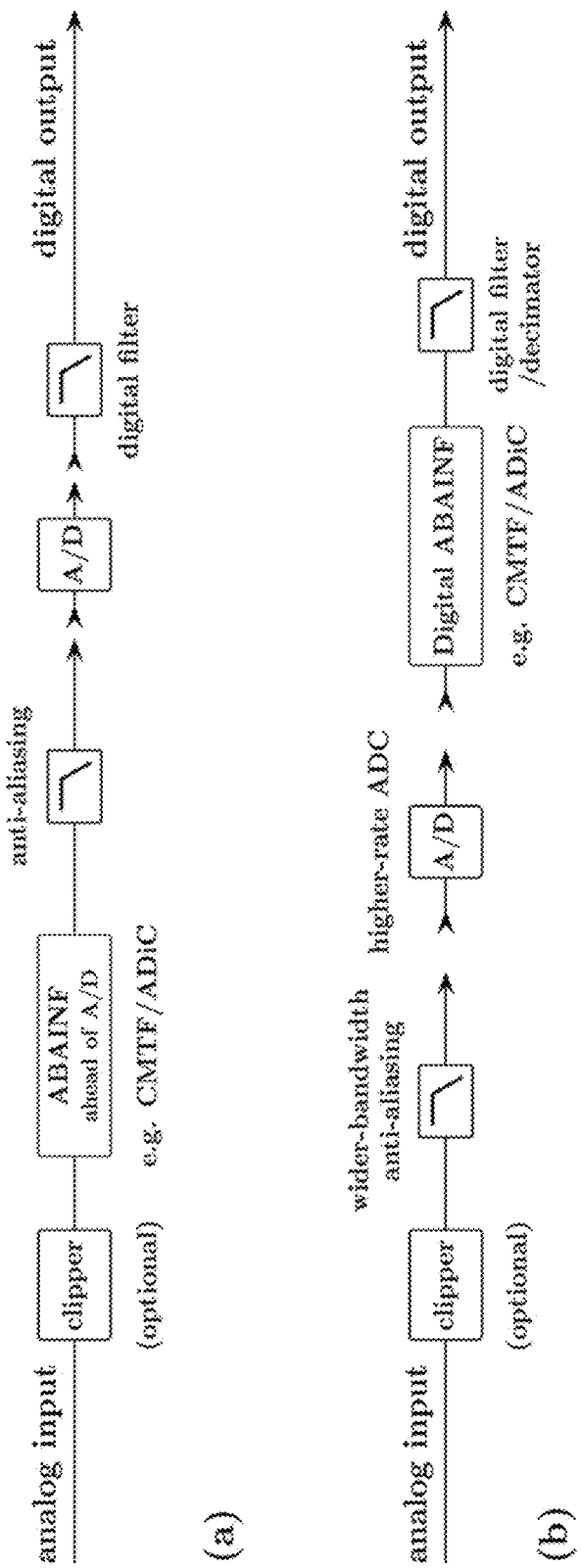
FIG. 42. Analog (panel (a)) and digital (panel (b)) ABAINF deployment for mitigation of non-Gaussian (e.g. outlier) noise in the process of analog-to-digital conversion.
Figure 43:
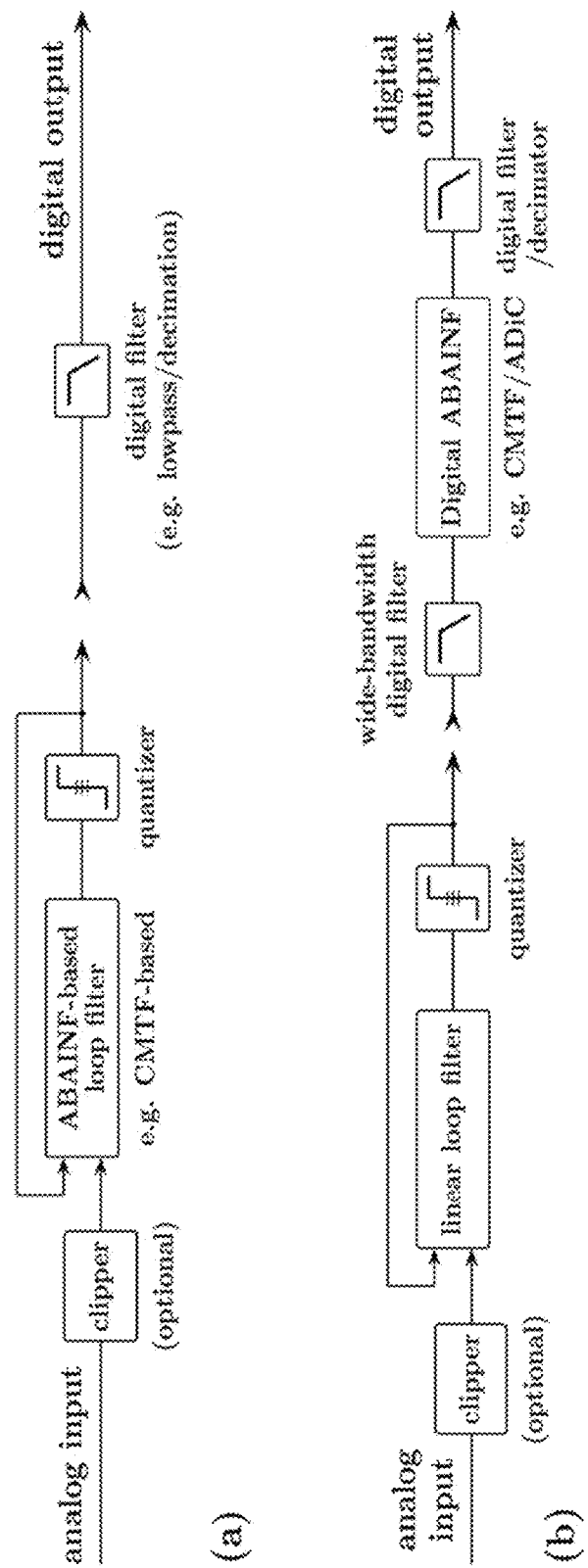
FIG. 43. Analog (panel (a)) and digital (panel (b)) ABAINF-based outlier filtering in ΔΣ ADCs.

As discussed earlier, mitigation of non-Gaussian (e.g. outlier) noise in the process of analog-to-digital conversion may be achieved by deploying analog ABAINFs (e.g. CMTFs or ADiCs) ahead of the anti-aliasing filter of an ADC, or by incorporating them into the analog loop filter of a $\Delta\Sigma$ ADC, as illustrated in FIGS. 42(a) and 43(a), respectively.

Alternatively, as illustrated in FIG. 42(b), a wider-bandwidth anti-aliasing filter may be employed ahead of an ADC, and an ADC with a respectively higher sampling rate may be employed in the digital part. A digital ABAINF (e.g. CMTF or ADiC) may then be used to reduce non-Gaussian (e.g. impulsive) interference affecting a narrower-band signal of interest. Then the output of the ABAINF may be further filtered with a digital filter, (optionally) downsampled, and passed to the subsequent digital signal processing.

Prohibitively low (e.g. 1-bit) amplitude resolution of the output of a $\Delta\Sigma$ modulator would not allow direct application of a digital ABAINF. However, since the oversampling rate of a $\Delta\Sigma$ modulator would be significantly higher (e.g. by two to three orders of magnitude) than the Nyquist rate of the signal of interest, a wideband (e.g. with bandwidth approximately equal to the geometric mean of the nominal signal bandwidth $B_7$ and the sampling frequency $F_s$) digital filter may be first applied to the output of the quantizer to enable ABAINF-based outlier filtering, as illustrated in FIG. 43(b).

It may be important to note that the output of such a wideband digital filter would still contain a significant amount of high-frequency digitization (quantization) noise. As follows from the discussion in § 3, the presence of such noise may significantly simplify using quantile tracking filters as a means of determining the range of the difference signal that effectively excludes outliers of the difference signal.

The output of the wideband filter may then be filtered by a digital ABAINF (with appropriately chosen time parameter and the blanking range), followed by a linear lowpass/decimation filter.

7.2 Comments on $\Delta\Sigma$ Modulators

The 1st order $\Delta\Sigma$ modulator shown in panel I of FIG. 1 may be described as follows. The input D to the flip-flop, or latch, is proportional to an integrated difference between the input signal x(t) of the modulator and the output Q. The clock input to the flip-flop provides a control signal. If the input D to the flip-flop is greater than zero, D>0, at, a definite portion of the clock cycle (such as the rising edge of the clock), then the output Q takes a positive value $V_c$, $Q=V_c$. If D<0 at a rising edge of the clock, then the output Q takes a negative value $-V_c$, $Q=-V_c$. At other times, the output Q does not change. It may be assumed that $\overline{Q}$ is the compliment of Q and $\overline{Q}=-Q$.

Without loss of generality, we may require that if D=0 at a clock's rising edge, the output Q retains its previous value.

One may see in panel I of FIG. 1 that the output Q is a quantized representation of the input signal, and the flip-flop may be viewed as a quantizer. One may also see that the integrated difference between the input signal of the modulator and the output Q (the input D to the flip-flop) may be viewed as a particular type of a weighted difference between the input and the output signals. One may further see that the output Q is indicative of this weighted difference, since the sign of the output values (positive or negative) is determined by the sign of the weighted difference (the input D to the flip-flop).

One skilled in the art will recognize that the digital quantizer in a $\Delta\Sigma$ modulator may be replaced by its analog "equivalent" (i.e. Schmitt trigger, or comparator with hysteresis).

Also, the quantizer may be realized with an N-level comparator, thus the modulator would have a $\log_2(N)$-bit output. A simple comparator with 2 levels would be a 1-bit quantizer; a 3-level quantizer may be called a "1.5-bit" quantizer; a 4-level quantizer would be a 2-bit quantizer; a 5-level quantizer would be a "2.5-bit" quantizer.

7.3 Comparators, Discriminators, Clippers, and Limiters

A comparator, or a discriminator, may be typically understood as a circuit or a device that only produces an output when the input exceeds a fixed value.

For example, consider a simple measurement process whereby a signal x(t) is compared to a threshold value D. The ideal measuring device would return '0' or '1' depending on whether x(t) is larger or smaller than D. The output of such a device may be represented by the Heaviside unit step function $\theta(D-x(t))$ [30], which is discontinuous at zero. Such a device may be called an ideal comparator, or an ideal discriminator.

More generally, a discriminator/comparator may be represented by a continuous discriminator function $\mathcal{F}_\alpha(x)$ with a characteristic width (resolution) a such that $\lim_{\alpha\to 0} \mathcal{F}_\alpha(x)=\theta(x)$.

In practice, many different circuits may serve as discriminators, since any continuous monotonic function with constant unequal horizontal asymptotes would produce the desired response under appropriate scaling and reflection. For example, the voltage-current characteristic of a subthreshold transconductance amplifier [49, 50] may be described by the hyperbolic tangent function, $\tilde{\mathcal{F}}_\alpha(x)=A \tan h(x/\alpha)$. Note that $$\lim_{\alpha\to 0} \frac{\tilde{\mathcal{F}}_\alpha(x)-A}{2A} = \theta(x),$$

and thus such an amplifier may serve as a discriminator.

When $\alpha \ll A$, a continuous comparator may be called a high-resolution comparator.

A particularly simple continuous discriminator function with a "ramp" transition may be defined as $$\mathcal{F}_{g,A}(x) = \begin{cases} gx & \text{for } g|x| \le A \\ A\ sgn(x) & \text{otherwise} \end{cases}, \quad (42)$$

where g may be called the gain of the comparator, and A is the comparator limit.

Note that a high-gain comparator would be a high-resolution comparator.

The "ramp" comparator described by equation (42) may also be called a clipping amplifier (or simply a "clipper") with the clipping value A and gain g.

For asymmetrical clipping values $\alpha_+$ (upper) and $a_-$ (lower), a clipper may be described by the following clipping function $C_{\alpha_-}^{\alpha_+}(x)$:

$$C_{\alpha_-}^{\alpha_+}(x) = \begin{cases} \alpha_+ & \text{for } x > \alpha_+ \\ \alpha_- & \text{for } x < \alpha_- \\ x & \text{otherwise} \end{cases} \quad (43)$$

It may be assumed in this disclosure that the outputs of the active components (such as, e.g., the active filters, integrators, and the gain/amplifier stages) may be limited to (or clipped at) certain finite ranges, for example, those determined by the power supplies, and that the recovery times from such saturation may be effectively negligible.

7.4 Nonlinear Measures of Central Tendency

A measure of central tendency would be a single value that attempts to describe a set, of data by identifying the central position within that set of data. As such, measures of central tendency are sometimes called measures of central location. They are also may be classed as summary statistics. The mean (often called the average), or weighted mean (weighted average) would be the most typically used measure of central tendency, and, when the weights do not depend on the data values, it may be considered a linear measure of central tendency.

An example of a (generally) nonlinear measure of central tendency would be the quasiarithmetic mean or generalized f-mean [51].

Other nonlinear measures of central tendency may include such measures as a median or a truncated mean value, or an L-estimator [46, 52, 53].

One skilled in the art will recognize that an output of a CMTF may be considered to be a nonlinear measure of central tendency of its input.

7.5 Mitigation of Non-Impulsive Non-Gaussian Noise

The temporal and/or amplitude structure (and thus the distributions) of non-Gaussian signals are generally modifiable by linear filtering, and non-Gaussian interference may often be converted from sub-Gaussian into super-Gaussian, and vice versa, by linear filtering [9, 10, 32, e.g.]. Thus the ability of the ADiCs/CMTFs disclosed herein, and $\Delta\Sigma$ ADCs with analog nonlinear loop filters, to mitigate impulsive (super-Gaussian) noise may translate into mitigation of non-Gaussian noise and interference in general, including sub-Gaussian noise (e.g. wind noise at microphones). For example, a linear analog filter may be employed as an input front end filter of the ADC to increase the peakedness of the interference, and the $\Delta\Sigma$ ADCs with analog nonlinear loop filter may perform analog-to-digital conversion combined with mitigation of this interference. Subsequently, if needed, a digital filter may be employed to compensate for the impact of the front end filter on the signal of interest.

REFERENCES

[1] M. Stojanovic and J. Preisig. Underwater acoustic communication channels: Propagation models and statistical characterization. In *IEEE Communications Magazine*, volume 47, pages 84-89, January 2009.

[2] J. S. G. Panaro, F. R. B. Lopes, L. M. Barreira, and F. E. Souza. Underwater acoustic noise model for shallow water communications. In *XXX Simpósio Brasileiro de Telecomunicações (SBrT 2012)*, Brazil, 13-16 Sep. 2012.

[3] G. B. Kinda, Y. Simard, C. Gervaise, J. I. Mars, and L. Fortier. Arctic underwater noise transients from sea ice deformation: Characteristics, annual time series, and forcing in Beaufort Sea. *The Journal of the Acoustical Society of America,* 138(4):2034-2045, October 2015.

[4] J. D. Parsons. *The Mobile Radio Propagation Channel.* Wiley, Chichester, 2 edition, 2000.

[5] X. Yang and A. P. Petropulu. Co-channel interference modeling and analysis in a Poisson field of interferers in wireless communications. *IEEE Transactions on Signal Processing*, 51 (1):64-76, 2003.

[6] A. V. Nikitin. On the impulsive nature of interchannel interference in digital communication systems. In *Proc. IEEE Radio and Wireless Symposium*, pages 118-121, Phoenix, Ariz. 2011.

[7] A. V. Nikitin. On the interchannel interference in digital communication systems, its impulsive nature, and its mitigation. *EURASIP Journal on Advances in Signal Processing*, 2011(137), 2011.

[8] A. V. Nikitin, M. Epard, J. B. Lancaster, R. L. Lutes, and E. A. Shumaker. Impulsive interference in communication channels and its mitigation by SPART and other nonlinear filters. *EURASIP Journal on Advances in Signal Processing*, 2012(79), 2012.

[9] A. V. Nikitin, R. L. Davidchack, and T. J. Sobering. Adaptive analog nonlinear algorithms and circuits for improving signal quality in the presence of technogenic interference. In *Proceedings of IEEE Military Communications Conference* 2013, San Diego, Calif., 18-20 Nov. 2013.

[10] A. V. Nikitin, R. L. Davidchack, and J. E. Smith. Out-of-band and adjacent-channel interference reduction by analog nonlinear filters. *EURASIP Journal on Advances in Signal Processing*, 2015(12), 2015.

[11] J. Carey. Noise wars: Projected capacitance strikes back against internal noise. *EDN*, pages 61-65. Jan. 19, 2012.

[12] T. B. Gabrielson. Mechanical-thermal noise in mnicromrachined acoustic and vibration sensors. *IEEE Transactions on Electron Devices*, 40(5):903-909, 1993.

[13] F. Mohd-Yasin, D. J. Nagel. and C. E. Korman. Noise in MEMS. *Measurement Science and Technology,* 21(012001), 2010.

[14] S. H. Ardalan and J. J. Paulos. An analysis of nonlinear behavior in delta-sigma modulators. *IEEE Transactions on Circuits and Systems*, CAS-34(6), 1987.

[15] E. Janssen and A. van Roermund. *Look-Ahead Based Sigma-Delta Modulation*. Springer, 2011.

[16] A. Chopra. *Modeling and Mitigation of Interference in Wireless Receivers with Multiple Antennae*. Phd thesis, The University of Texas at Austin, December 2011.

[17] I. Shanthi and M. L. Valarmathi. Speckle noise suppression of SAR image using hybrid order statistics filters. *International Journal of Advanced Engineering Sciences and Technologies (IJAEST)*, 5(2):229-235, 2011.

[18] R. Dragomir, S. Puscoci, and D. Dragomir. A synthetic impulse noise environment for DSL access networks. In *Proceedings of the 2nd International conference on Circuits, Systems, Control, Signals (CSCS'11)*, pages 116-119, 2011.

[19] V. Guillet, G. Lamarque, P. Ravier, and C. Léger. Improving the power line communication signal-to-noise ratio during a resistive load commutation. *Journal of Communications*, 4(2):126-132, 2009.

[20] M. Katayama, T. Yamazato, and H. Okada. A mathematical model of noise in narrow-band power line communication systems. *IEEE J. Sel. Areas Commun.*, 24(7): 1267-1276, 2006.

[21] M. Nassar, J. Lin, Y. Mortazavi, A. Dabak, I. H. Kim, and B. L. Evans. Local utility power line communications in the 3-500 kHz band: Channel impairments, noise, and standards. *IEEE Signal Processing Magazine*, 29(5):116-127, 2012.

[22] M. Nassar, A. Dabak, II Han Kim, T. Pande, and B. L. Evans. Cyclostationary noise modeling in narrowband powerline communication for Smart Grid applications. In 2012 *IEEE Int. Conf. Acoust. Speech Signal Process. (ICASSP)*, pages 3089-3092, 25-30 Mar. 2012.

[23] J. Lin, M. Nassar, and B. L. Evans. Impulsive noise mitigation in powerline communications using sparse Bayesian learning. *IEEE Journal on Selected Areas in Communications*, 31(7):1172-1183, 2013.

[24] A. V. Nikitin, D. Scutti, B. Natarajan, and R. L. Davidchack. Blind adaptive analog nonlinear filters for noise mitigation in powerline communication systems. In *Proc. IEEE International Symposium on Power Line Communications and Its Applications (ISPLC 2015)*, Austin, Tex., 29-31 Mar. 2015.

[25] S. A. Bhatti, Q. Shan, R. Atkinson, M. Vieira, and I. A. Glover. Vulnerability of Zigbee to impulsive noise in electricity substations. *In General Assembly and Scientific Symposium,* 2011 *XXXth URSI,* 13-20 Aug. 2011.

[26] S. R. Mallipeddy and R. S. Kshetrimayum. Impact of UWB interference on IEEE 802.11a WLAN system. In *National Conference on Communications (NCC)*, 2010.

[27] C. Fischer. Analysis of cellular CDMA systems under UWB interference. In *International Zurich Seminar on Communications*, pages 130-133, 2006.

[28] K. Slattery and H. Skinner. *Platform Interference in Wireless Systems*. Elsevier, 2008.

[29] F. Leferink, F. Silva, J. Catrysse, S. Batterman, V. Beauvois, and A. Roc'h. Man-made noise in our living environments. *Radio Science Bulletin*, (334):49-57, September 2010.

[30] R. Bracewell. *The Fourier Transform and Its Applications*, chapter "Heaviside's Unit Step Function, H(x)", pages 61-65. McGraw-Hill, New York, 3rd edition, 2000.

[31] P. A. M. Dirac. *The Principles of Quantum Mechanics*. Oxford University Press, London, 4th edition, 1958.

[32] A. V. Nikitin. Method and apparatus for signal filtering and for improving properties of electronic devices. U.S. Pat. No. 8,489,666 (16 Jul. 2013), U.S. Pat. No. 8,990,284

(24 Mar. 2015), U.S. Pat. No. 9,117,099 (Aug. 25, 2015), U.S. Pat. No. 9,130,455 (8 Sep. 2015), and U.S. Pat. No. 9,467,113 (11 Oct. 2016).

[33] A. V. Nikitin and R. L. Davidchack. Signal analysis through analog representation. *Proc. R. Soc. Lond. A,* 459(2033):1171-1192, 2003.

[34] A. V. Nikitin and R. L. Davidchack. Adaptive approximation of feedback rank filters for continuous signals. *Signal Processing,* 84(4):805-811, 2004.

[35] A. V. Nikitin and R. L. Davidchack. Method and apparatus for analysis of variables. U.S. Pat. No. 7,133,568 (Nov. 7, 2006) and U.S. Pat. No. 7,242,808 (Jul. 10, 2007).

[36] A. V. Nikitin. Method and apparatus for real-time signal conditioning, processing, analysis, quantification, comparison, and control. U.S. Pat. No. 7,107,306 (Sep. 12, 2006), U.S. Pat. No. 7,418,469 (Aug. 26, 2008), and U.S. Pat. No. 7,617,270 (Nov. 10, 2009).

[37] A. V. Nikitin. Method and apparatus for adaptive real-time signal conditioning and analysis. U.S. Pat. No. 8,694,273 (Apr. 8, 2014).

[38] G. I. Bourdopoulos, A. Pnevmatikakis. V. Anastassopoulos, and T. L. Deliyannis. *Delta-Sigma Modulators: Modeling. Design and Applications*. Imperial College Press, London, 2003.

[39] W. Kester, editor. *Data Conversion Handbook.* Elsevier, Oxford, 2005.

[40] Y. Geerts, M. Steyaert, and W. M. C. Sansen. *Design of Multi-Bit Delta-Sigma A/D Converters*. The Springer International Series in Engineering and Computer Science. Springer US, 2006.

[41] A. V. Nikitin. *Pulse Pileup Effects in Counting Detectors*. Phd thesis, University of Kansas, Lawrence, 1998.

[42] C. E. Shannon. Communication in the presence of noise. *Proc. Institute of Radio Engineers,* 37(1):10-21, January 1949.

[43] F. R. Hampel. The influence curve and its role in robust estimation. *J. Am. Slat. Assoc.,* 69(346):383-393, 1974.

[44] S. O. Rice. Mathematical analysis of random noise. *Bell System Technical Journal,* 23: 282-332, 1944. Ibid. 24:46-156, 1945. Reprinted in: Nelson Wax, editor, *Selected papers on noise and stochastic processes*. Dover, N.Y., 1954.

[45] A. V. Nikitin, R. L. Davidchack, and T. P. Armstrong. The effect of pulse pile-up on threshold crossing rates in a system with a known impulse response.

[46] J. W. Tukey. *Exploratory Data Analysis*. Addison-Wesley, 1977.

[47] H. V. Poor. *An Introduction to signal detection and estimation theory*. Springer, 1998.

[48] M. Abramowitz and I. A. Stegun, editors. *Handbook of Mathematical Functions with Formulas, Graphs, and Mathematical Tables*. 9th printing. New York: Dover, 1972.

[49] C. Mead. *Analog VLSI and neural systems*. Addison-Wesley, 1989.

[50] K. Urahama and T. Nagao. Direct analog rank filtering. *IEEE Trans. Circuits Syst.—I.* 42(7):385-388, July 1995.

[51] V. M. Tikhomirov, editor. *Selected Works of A. N. Kolmogorov,* volume I: Mathematics and Mechanics, pages 144-146. Springer Netherlands, 1991.

[52] P. J. Huber. *Robust Statistics*. Wiley Series in Probability and Statistics. Wiley, 2005.

[53] S. V. Vaseghi. *Advanced Digital Signal Processing and Noise Reduction*. Wiley, 4th edition, 2008.

Regarding the invention being thus described, it will be obvious that the same may be varied in many ways. Such variations are not to be regarded as a departure from the spirit and scope of the invention, and all such modifications as would be obvious to one skilled in the art are intended to be included within the scope of the claims. It is to be understood that while certain now preferred forms of this invention have been illustrated and described, it is not limited thereto except insofar as such limitations are included in the following claims.

I claim:

1. An apparatus for signal filtering converting an input signal into an output signal, wherein said input signal is a physical signal and wherein said output signal is a physical signal, the apparatus comprising:

a) a blanker characterized by a blanking range and operable to receive a blanker input and to produce a blanker output, wherein said blanker output is proportional to said blanker input when said blanker input is within said blanking range, and wherein said blanker output is effectively zero when said blanker input is outside of said blanking range;

b) integrator characterized by an integration time constant and operable to receive an integrator input and to produce an integrator output, wherein said integrator output is proportional to an antiderivative of said integrator input;

wherein said blanker input is proportional to a difference signal, wherein said difference signal is the difference between said input signal and said output signal, wherein said integrator input is proportional to said blanker output, and wherein said output signal is proportional to said integrator output.

2. The apparatus of claim 1 wherein said blanking range is a range that effectively excludes outliers of said blanker input.

3. The apparatus of claim 1 further comprising a means of establishing said blanking range, wherein said means comprises a quantile tracking filter operable to receive said blanker input and to produce a quantile tracking filter output.

4. The apparatus of claim 1 further comprising a means of establishing said blanking range, wherein said means comprises a quantile tracking filter operable to receive an input proportional to an absolute value of said blanker input and to produce a quantile tracking filter output.

5. The apparatus of claim 1 further comprising a means of establishing said blanking range, wherein said means comprises a plurality of quantile tracking filters operable to receive said blanker input and to produce a plurality of quantile tracking filter outputs, and wherein said blanking range is a linear combination of said plurality of quantile tracking filter outputs.

6. An apparatus for signal filtering converting an input signal into an output signal, wherein said input signal is a physical signal and wherein said output signal is a physical signal, the apparatus comprising:

a) a blanker characterized by a blanking range and operable to receive a blanker input and to produce a blanker output, wherein said blanker output is proportional to said blanker input when said blanker input is within said blanking range, and wherein said blanker output is effectively zero when said blanker input is outside of said blanking range;

b) an integrator characterized b an integration time constant and operable to receive an integrator input and to produce an integrator output, wherein said integrator output is proportional to an antiderivative of said integrator input;

wherein said blanker input is proportional to a difference signal, wherein said difference signal is the difference between said input signal and said output signal, wherein said integrator input is proportional to said blanker output, and wherein said output signal is proportional to a sum of said integrator input and said integrator output.

7. The apparatus of claim 6 wherein said blanking range is a range that effectively excludes outliers of said blanker input.

8. The apparatus of claim 6 further comprising a means of establishing said blanking range, wherein said means comprises a quantile tracking filter operable to receive said blanker input and to produce a quantile tracking filter output.

9. The apparatus of claim 6 further comprising a means of establishing said blanking range, wherein said means comprises a quantile tracking filter operable to receive an input proportional to an absolute value of said blanker input and to produce a quantile tracking filter output.

10. The apparatus of claim 6 further comprising a means of establishing said blanking range, wherein said means comprises a plurality of quantile tracking filters operable to receive said blanker input and to produce a plurality of quantile tracking filter outputs, and wherein said blanking range is a linear combination of said plurality of quantile tracking filter outputs.

11. An apparatus for analog-to-digital conversion converting an input signal into an output signal, wherein said input signal is a physical signal characterized by a nominal bandwidth and wherein said output signal is a quantized representation of said input signal, the apparatus comprising:
  a) a quantizer operable to receive a quantizer input and to produce a quantizer output;
  b) a nonlinear loop filter operable to receive said input signal and a feedback of said quantizer output and to produce said quantizer input, said nonlinear loop filter further comprising:
  c) a blanker characterized by a blanking range and operable to receive a blanker input and to produce a blanker output, wherein said blanker output is proportional to said blanker input when said blanker input is within said blanking range, and wherein said blanker output is effectively zero when said blanker input is outside of said blanking range;
  d) a first integrator characterized by a first integration time constant and operable to receive a first integrator input and to produce a first integrator output, wherein said first integrator output is proportional to an antiderivative of said first integrator input;
  e) a second integrator characterized by a second integration time constant and operable to receive a second integrator input and to produce a second integrator output, wherein said second integrator output is proportional to an antiderivative of said second integrator input;
  f) a first 1st order lowpass filter characterized by a lowpass filter bandwidth and a second 1st order lowpass filter characterized by said lowpass filter bandwidth, wherein said lowpass filter bandwidth is much larger than said nominal bandwidth, wherein said first 1st order lowpass filter is operable to receive a first 1st order lowpass filter input and to produce a first 1st order lowpass filter output, and wherein said second 1st order lowpass filter is operable to receive a second 1st order lowpass filter input and to produce a second 1st order lowpass filter output;

wherein said first 1st order lowpass filter input is proportional to a difference between said input signal and said feedback of said quantizer output, wherein said second 1st order lowpass filter input is proportional to said feedback of said quantizer output, wherein said blanker input is proportional to said first 1st order lowpass filter output, wherein said first integrator input is proportional to said blanker output, wherein said second integrator input is proportional to a difference between said second integrator output and said second 1st order lowpass filter output, and wherein said quantizer input is proportional to said second integrator output.

12. The apparatus of claim 11 wherein said blanking range is a range that effectively excludes outliers of said blanker input.

13. The apparatus of claim 11 further comprising a means of establishing said blanking range, wherein said means comprises a quantile tracking filter operable to receive said blanker input and to produce a quantile tracking filter output.

14. The apparatus of claim 11 further comprising a means of establishing said blanking range, wherein said means comprises a quantile tracking filter operable to receive an input proportional to an absolute value of said blanker input and to produce a quantile tracking filter output.

15. The apparatus of claim 11 further comprising a means of establishing said blanking range, wherein said means comprises a plurality of quantile tracking filters operable to receive said blanker input and to produce a plurality of quantile tracking filter outputs, and wherein said blanking range is a linear combination of said plurality of quantile tracking filter outputs.

16. The apparatus of claim 11 wherein said first 1st order lowpass filter is further characterized by a gain value and wherein said second 1st order lowpass filter is further characterized by said gain value.

17. The apparatus of claim 16 further comprising a means of establishing gain value, wherein said means comprises a quantile tracking filter operable to receive an input proportional to an absolute value of said blanker input and to produce a quantile tracking filter output.

18. A digital signal processing apparatus comprising a digital signal processing unit configurable to perform one or more functions including a filtering function transforming an input signal into an output filtered signal, wherein said filtering function comprises:
  a) a blanker function characterized by a blanking range and operable to receive a blanker input and to produce a blanker output, wherein said blanker output is proportional to said blanker input when said blanker input is within said blanking range, and wherein said blanker output is effectively zero when said blanker input is outside of said blanking range;
  b) an integrator function characterized by an integration time constant and operable to receive an integrator input and to produce an integrator output, wherein said integrator output is proportional to a numerical antiderivative of said integrator input;
  wherein said blanker input is proportional to a difference signal, wherein said difference signal is the difference between said input signal and said output signal, wherein said integrator input is proportional to said blanker output, and wherein said output filtered signal is proportional to said integrator output.

19. The apparatus of claim 18 wherein said blanking range is a range that effectively excludes outliers of said blanker input.

20. The apparatus of claim 18 further comprising a means of estimating said blanking range, wherein said means comprises a quantile tracking function estimating a quantile of said blanker input.

21. The apparatus of claim 18 further comprising a means of estimating said blanking range, wherein said means comprises a quantile tracking function estimating a quantile of an absolute value of said blanker input.

22. The apparatus of claim 18 further comprising a means of estimating said blanking range, wherein said means comprises a plurality of quantile tracking functions, wherein said plurality of quantile tracking functions estimates a plurality of quantiles of said blanker input, and wherein said blanking range is a linear combination of said plurality of quantiles.

* * * * *